United States Patent
Yoshimura et al.

(10) Patent No.: US 7,858,997 B2
(45) Date of Patent: Dec. 28, 2010

(54) LIGHT EMITTING APPARATUS AND LIGHT EMITTING METHOD

(75) Inventors: Naoki Yoshimura, Aichi-ken (JP); Yoshinobu Suehiro, Aichi-ken (JP); Yuji Takahashi, Aichi-ken (JP); Koichi Ota, Aichi-ken (JP); Mamoru Mitomo, Ibaraki-ken (JP); Tadashi Endo, Fukuoka-ken (JP); Masakazu Komatsu, Miyagi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 566 days.

(21) Appl. No.: 11/717,050

(22) Filed: Mar. 13, 2007

(65) Prior Publication Data

US 2007/0164308 A1 Jul. 19, 2007

Related U.S. Application Data

(62) Division of application No. 10/722,563, filed on Nov. 28, 2003, now abandoned.

(30) Foreign Application Priority Data

Nov. 29, 2002 (JP) .............................. 2002-349286

(51) Int. Cl.
*H01L 29/22* (2006.01)

(52) U.S. Cl. ..................... 257/98; 257/89; 257/103; 257/E25.028; 257/E33.061; 313/502; 313/503

(58) Field of Classification Search ............. 257/89, 257/98, 103, E25.028, E33.061; 313/502, 313/503
See application file for complete search history.

(56) References Cited

U.S. PATENT DOCUMENTS

| | | | |
|---|---|---|---|
| 5,998,925 A | 12/1999 | Shimizu et al. | |
| 6,095,661 A | 8/2000 | Lebens et al. | |
| 6,632,379 B2 * | 10/2003 | Mitomo et al. | 252/301.4 R |
| 6,670,748 B2 | 12/2003 | Ellens et al. | |
| 6,717,353 B1 | 4/2004 | Mueller et al. | |
| 2002/0043926 A1 | 4/2002 | Takahashi et al. | |

(Continued)

FOREIGN PATENT DOCUMENTS

JP 60-206889 10/1985

(Continued)

OTHER PUBLICATIONS

Japanese Office Action dated Sep. 11, 2007, with partial English translation.

(Continued)

*Primary Examiner*—Andy Huynh
(74) *Attorney, Agent, or Firm*—McGinn IP Law Group, PLLC

(57) ABSTRACT

A light emitting apparatus has a light emitting element with an emission wavelength in the range of 360 to 550 nm and a rare-earth element doped oxide nitride phosphor or cerium ion doped lanthanum silicon nitride phosphor. Part of light radiated from the light emitting element is wavelength-converted by the phosphor. The light emitting apparatus radiates white light generated by a mixture of the wavelength-converted light and the other part of light radiated from the light emitting element.

9 Claims, 49 Drawing Sheets

U.S. PATENT DOCUMENTS

| | | |
|---|---|---|
| 2003/0030038 A1 | 2/2003 | Mitomo et al. |
| 2003/0030368 A1 | 2/2003 | Ellens et al. |
| 2003/0052595 A1 | 3/2003 | Ellens et al. |
| 2003/0094893 A1 | 5/2003 | Ellens et al. |
| 2003/0168643 A1 | 9/2003 | Mitomo et al. |
| 2004/0109302 A1 | 6/2004 | Yoneda et al. |

FOREIGN PATENT DOCUMENTS

| | | |
|---|---|---|
| JP | 04021570 A | 1/1992 |
| JP | 2001-196645 | 7/2001 |
| JP | 2001-214162 | 8/2001 |
| JP | 2002-33521 | 1/2002 |
| JP | 2002-076434 | 3/2002 |
| JP | 2002-76434 | 3/2002 |
| JP | 2002-363554 | 12/2002 |
| JP | 2003-124527 | 4/2003 |
| JP | 2003-203504 | 7/2003 |
| JP | 2003-206481 | 7/2003 |
| JP | 2003-336059 | 11/2003 |

OTHER PUBLICATIONS

G. Ramirez-Flores et al. Phys. Rev. B50 (12), 8433-8438 (1994).

R_J. Xie et al., "Preparation and Luminescence Spectra of Calcium- and Rare- Earth (R=EU, Tb, and Pr)—Copdoped alpha-SiAlON Ceramics,", Journal of the American Ceramic Society (ISSN: 0002-7820), (2002).

J.W.H. van Krevel et al., "Luminescence Properties of Terbium-, Cerium-, or Europium- Doped a-Sialon Materials",Journal of Solid State Chemistry, vol. 165, issue 1, pp. 19-24 (2002).

H.T. Hintzen et al., "On the Existence of Europium Aluminum Oxynitrides with a Magnetoplumbite or B-Alumina Type Structure", Journal of Solid State Chemistry 142, pp. 48-50 (1999).

S.R. Jansen et al., "Eu-Doped Barium Aluminum Oxynitride with the B-Alumina-Type Structure as New Blue-Emitting Phosphor", Journal of The Electrochemical Society, 146(2) pp. 800-806 (1999).

S.S. Lee et al. "Photoluminescence and Electroluminescence Characteristics of CaSiN2:Eu Phosphor", Proc. SPIE-Int., Soc. Opt. Eng., vol. 3241, pp. 75-83 (1997).

J.W. H. van Krevel et al., "Long wavelength Ce3+ emission in Y-Si-O-N materials", Journal of Alloys and Compounds, 268, pp. 272-277 (1998).

Izvestiya Akademii Nauk SSR, Neorganicheskie Materialy, "Inorganic Materials", Russian Original vol. 17, No. 8, Aug. 1981, Jan. 1982, INOMAF 17(8) 975-1128 (1981).

T. Endo et al., "High pressure synthesis of 'periodic compound' and its optical and electrical properties", T. Tsuruta, M. Doyama and Seno (Editors), New Functionality Materials, vol. C. Synthetic Process and Control of Functionality Materials, Elsevier Science Publishers, Amsterdam, The Netherlands, pp. 107-112 (1993).

"Academic Press Dictionary of Science and Technology", Academic Press (1992), on blue (optics) and ultraviolet (optics), from website http:/www.xreferplus.com/entry/2800329 (and item 3079456) (2 pages).

M. Fukuda, "Optical Semiconductor Devices", Wiley Series in Microwave and Optical Engieering, John Wiley and Sons, New York (1999) (ISBN: 0-471-14959-$), p. 42.

* cited by examiner

FIG. 41

| | A | B | C | D | E | F | G | H | I | J |
|---|---|---|---|---|---|---|---|---|---|---|
| ✱ | 3015 | 2010 | 1005 | 3030 | 2015 | 2010 | 1005 | 05025 | 05025 | 0505 |
| CaO | 11.6 | 8.3 | 3.1 | 9.7 | 7.9 | 11.3 | 6.1 | 2.2 | 3.26 | 3.2 |
| $Si_3N_4$ | 29.4 | 42.9 | 63.6 | 22.2 | 39.1 | 42.9 | 63.6 | 79.0 | 79.0 | 75.9 |
| AlN | 52.9 | 42.9 | 27.3 | 55.6 | 44.6 | 42.9 | 27.3 | 15.8 | 15.8 | 17.2 |
| $Al_2O_3$ | 0 | 0 | 0 | 5.6 | 2.4 | 0 | 0 | 0 | 0 | 0 |
| $Eu_2O_3$ | 3.0 | 3.0 | 3.0 | 3.0 | 3.0 | 1.5 | 1.5 | 1.5 | 1.0 | 1.0 |
| Eu/Ca | 0.51 | 0.72 | 1.9 | 0.62 | 0.76 | 0.27 | 0.49 | 1.4 | 0.61 | 0.63 |
| Eu % | 34 | 42 | 66 | 38 | 43 | 21 | 33 | 57 | 38 | 39 |

| | K | L | M | N |
|---|---|---|---|---|
| ✱ | 3015 | 2613 | 2010 | 2010 |
| CaO | 15.7 | 14.5 | 12.3 | 11.9 |
| $Si_3N_4$ | 29.4 | 34.2 | 42.9 | 42.9 |
| AlN | 52.9 | 49.4 | 42.9 | 42.9 |
| $Al_2O_3$ | 0 | 0 | 0 | 0 |
| $Eu_2O_3$ | 1.0 | 1.0 | 1.0 | 1.2 |
| Eu/Ca | 0.13 | 0.14 | 0.16 | 0.20 |
| Eu % | 11 | 12 | 14 | 17 |

FIG. 42

| | A | B | C | D | E | F | G | H | I | J |
|---|---|---|---|---|---|---|---|---|---|---|
| ✽ | 3015 | 2010 | 1005 | 3030 | 2015 | 2010 | 1005 | 05025 | 05025 | 0505 |
| Ca | 3.3 | 2.0 | 0.6 | 2.9 | 1.9 | 2.7 | 1.2 | 0.4 | 0.5 | 0.5 |
| Al | 15.1 | 10.3 | 5.2 | 20.3 | 12.2 | 10.3 | 5.3 | 2.6 | 2.7 | 3.5 |
| Si | 25.2 | 30.8 | 36.6 | 20.2 | 28.9 | 30.9 | 36.7 | 39.7 | 39.8 | 38.9 |
| Eu | 1.7 | 1.4 | 1.2 | 1.8 | 1.5 | 0.7 | 0.6 | 0.5 | 0.3 | 0.3 |
| O | 5.9 | 4.1 | 2.3 | 10.8 | 5.9 | 3.8 | 2.0 | 1.1 | 1.1 | 1.9 |
| N | 48.7 | 51.4 | 54.1 | 43.9 | 49.5 | 51.5 | 54.2 | 55.6 | 55.7 | 54.8 |

| | K | L | M | N |
|---|---|---|---|---|
| ✽ | 3015 | 2613 | 2010 | 2010 |
| Ca | 4.5 | 3.9 | 3.0 | 2.9 |
| Al | 15.2 | 13.3 | 10.3 | 10.3 |
| Si | 25.3 | 27.6 | 31.0 | 30.9 |
| Eu | 0.6 | 0.5 | 0.5 | 0.6 |
| O | 5.4 | 4.7 | 3.7 | 3.7 |
| N | 49.0 | 50.0 | 51.6 | 51.6 |

LIGHT EMITTING APPARATUS AND LIGHT EMITTING METHOD

The present application is based on Japanese patent application No. 2002-349286, the entire contents of which are incorporated herein by reference.

The present application is a divisional of U.S. patent Ser. No. 10/722,563 now abandoned.

BACKGROUND OF THE INVENTION

1. Field of the Invention

This invention relates to light emitting apparatus and light emitting method that can be applied to a field requiring reliability such as disaster prevention light and traffic light, a field requiring light weight and small size such as in-vehicle light and LCD backlight and a field requiring visibility such as station guide plate, and more particularly to light emitting apparatus and light emitting method that has a structure with light emitting element and phosphor combined.

2. Description of the Related Art

Conventionally, a light emitting apparatus is developed that part of light from light emitting element is wavelength-converted, then mixed with light not wavelength-converted to offer light with emission color different from that of the light emitting element.

For example, a light emitting apparatus is commercially available that employs a III group nitride system compound semiconductor light emitting element to emit blue light, and a cerium (Ce) doped yttrium-aluminum-garnet system phosphor (YAG). In this light emitting apparatus, the light emitting element is mounted on the cup portion of lead frame and light transmitting material with phosphor (YAG) dispersed is filled in the cup portion, thereby phosphor layer is formed in the emission direction of the light emitting element. In operation, part of light from the light emitting element is absorbed and wavelength-converted by the phosphor (YAG) when it passes through the phosphor layer, the other part of light is transmitted through the transmitting material without being absorbed. Accordingly, these two lights are mixed and, therefore, white light can be radiated from the light emitting apparatus.

Well known phosphors are composed of matrix material, such as silicates, phosphates (e.g., apatite) and aluminates, and transition metals or rare-earth metals to be doped into the matrix material.

On the other, few phosphors are known that use matrix material of nitride or oxide nitride with transition metals or rare-earth metals doped thereto.

Known nitride phosphor are manganese activated aluminum nitride (prior art 1, described later), and rare-earth element activated magnesium silicon nitride ($MgSiN_2$) (prior art 5, described later). Recently reported are red phosphor of Mg doped $ZnSiN_2$ with strained wurtzite type structure (prior art 6, described later), red phosphor of Eu doped $CaSiN_2$ (prior art 7, described later) and phosphor of Eu doped $Ba_2Si_5Na$.

Known oxide nitride phosphor are phosphor with β-sialon, matrix material (prior art 2, described later), Ce doped oxide nitride (Y—Al—O—N) with silicate mineral or apatite structure (prior art 8, described later), $Ba_{1-x}Eu_xAl_{11}O_{16}N$ with β-alumina structure (prior arts 9 and 10, described later). Also, recently reported is phosphor with oxynitride glass, matrix material (prior arts 3 and 4, described later).

By the way, white LED (light emitting diode) is used in a field requiring reliability such as disaster prevention light and traffic light, a field requiring light weight and small size such as in-vehicle light and LCD backlight and a field requiring visibility such as station guide plate. The emission color of white LED, i.e., white, is obtained by mixing lights with different emission colors. Namely, blue light generated from InGaN system blue LED with emission wavelength of 450 to 550 nm is mixed with yellow light generated from phosphor.

Such a white LED frequently uses, as phosphor, Ce doped YAG system oxide represented by: $(Y, Gd)_3(Al, Ga)_5O_{12}$. This phosphor is coated on the surface of blue LED and radiates white light based on the principle described above.

Prior art 1: German patent No. 789,890

Prior art 2: Japanese patent application laid-open No. 60-206889

Prior art 3: Japanese patent application laid-open No. 2001-214162

Prior art 4: Japanese patent application laid-open No. 2002-76434

Prior art 5: "Izv. Akad. Nauk SSSR, Neorg. Master" 17(8), 1431-5

Prior art 6: T. Endo et al., "High pressure synthesis of periodic compound and its optical and electrical properties", In T. T suruta, M. Doyama and Seno (Editors), New Functionality Materials, Volume C, Elsevier, Amsterdam, The Netherlands, pp. 107-112 (1993)

Prior art 7: S. S. Lee et al., "Photoluminescence and Electroluminescence Characteristic of $CaSiN_2$:Eu", Proc. SPIE-Int, Soc. Opt. Eng., 3241, 75-83 (1997)

Prior art 8: J. W. H. van Krevel et al., "Long wavelength $Ce^{3+}$ emission in Y—Si—O—N materials", J. Alloys and Compounds, 268, 272-277 (1998)

Prior art 9: H. Hintzen et al., "On the Existence of Europium Aluminum Oxynitrides with a Magnetopolumlite or β-Alumina-Type Structure", J. Solid State Chem., 142, 48-50 (1999)

Prior art 10: S. R. Jansen et al., "Eu-Doped Barium Aluminum Oxynitride with β-Alumina-Type Structure as New Blue-Emitting Phosphor", J. Electrocher. Soc., 146, 800-806 (1999)

However, in the conventional light emitting apparatus, which is composed of blue LED and YAG:Ce, its emission light have weak red component. Therefore, it lacks in color rendering property as to red color.

Also, oxide system phosphors generally have a problem that the spectrum intensity lowers significantly when the excitation wavelength exceeds 400 nm. Therefore, in white LED that YAG system oxide phosphor is coated on the surface of InGaN system blue LED, the excitation energy of YAG system oxide phosphor does not coincide with the excitation energy of blue LED light source, and therefore the excitation energy cannot be efficiently converted. Thus, it is difficult to enhance the brightness of white LED.

SUMMARY OF THE INVENTION

It is an object of the invention to provide light emitting apparatus and light emitting method that can improve the color rendering property as to red color.

It is another object of the invention to provide light emitting apparatus and light emitting method that can enhance the brightness of white LED.

According to the invention, a light emitting apparatus comprises:

a light emitting element with an emission wavelength in the range of 360 to 550 nm; and a rare-earth element doped oxide nitride phosphor;

wherein part of light radiated from the light emitting element is wavelength-converted by the phosphor.

According to another aspect of the invention, a light emitting apparatus comprises:

a light emitting element with an emission wavelength in the range of 360 to 550 nm; and a cerium ion doped lanthanum silicon nitride phosphor;

wherein part of light radiated from the light emitting element is wavelength-converted by the phosphor.

According to another aspect of the invention, a light emitting method for a light emitting apparatus that comprises a light emitting element with an emission wavelength in the range of 360 to 550 nm and a rare-earth element doped oxide nitride phosphor, wherein part of light radiated from the light emitting element is wavelength-converted by the phosphor, and the light emitting apparatus radiates light generated by a mixture of wavelength-converted light and the other part of light radiated from the light emitting element, comprises the step of:

turning on intermittently the light emitting element.

According to another aspect of the invention, a light emitting method for a light emitting apparatus that comprises a light emitting element with an emission wavelength in the range of 360 to 550 nm and a cerium ion doped lanthanum silicon nitride phosphor, wherein part of light radiated from the light emitting element is wavelength-converted by the phosphor, and the light emitting apparatus radiates light generated by a mixture of wavelength-converted light and the other part of light radiated from the light emitting element, comprises the step of:

turning on intermittently the light emitting element.

BRIEF DESCRIPTION OF THE DRAWINGS

The preferred embodiments according to the invention will be explained below referring to the drawings, wherein:

FIG. 41 is a table showing the composition (molar ratio) of Samples A to N, Ca-α-sialon:$Eu^{2+}$ phosphors;

FIG. 42 is a table showing atom % of Samples A to N, Ca-α-sialon:$Eu^{2+}$ phosphors;

DETAILED DESCRIPTION OF THE PREFERRED EMBODIMENTS

First Embodiment

Figure 1:
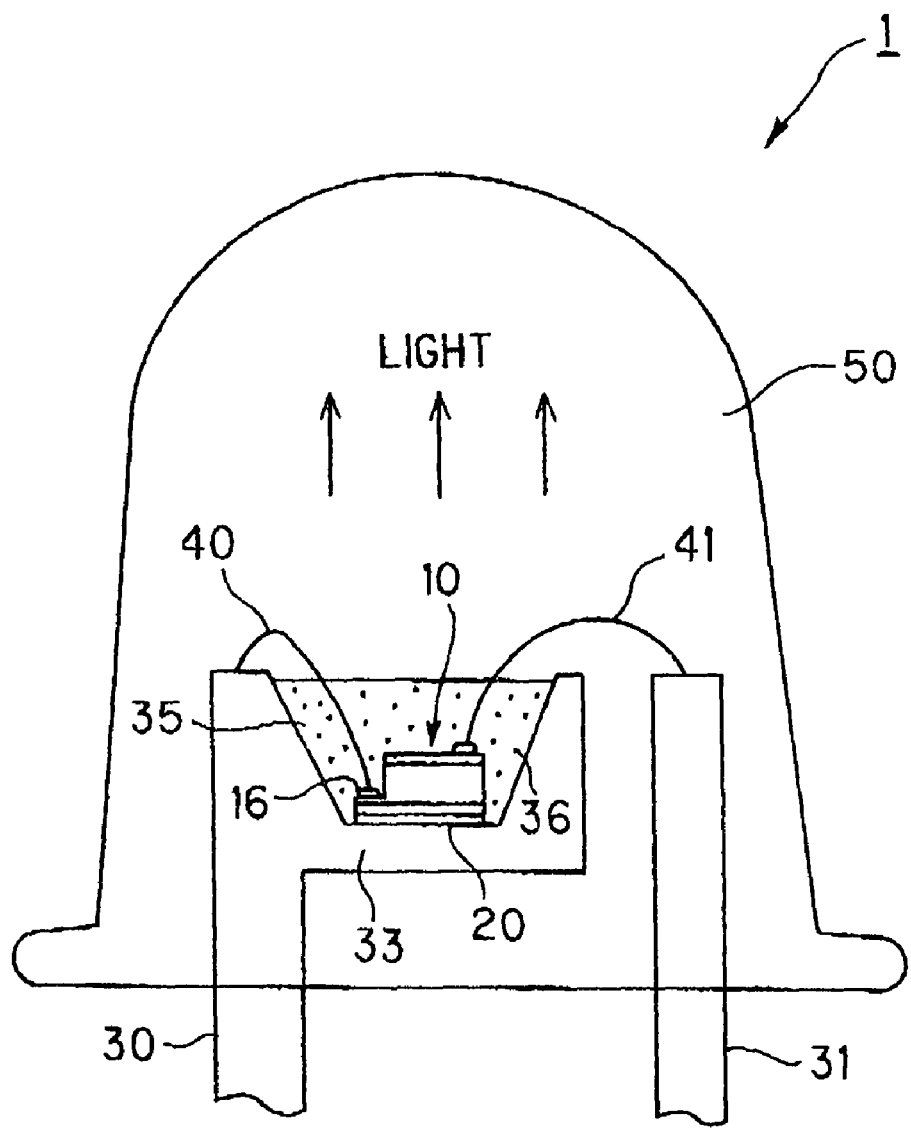
FIG. 1 is an illustration showing a lamp type (or shell type) LED as a light emitting apparatus in a first preferred embodiment according to the invention.

FIG. 1 is an illustration showing a lamp type (or shell type) LED as a light emitting apparatus in the first preferred embodiment according to the invention.

As shown in FIG. 1, the lamp type LED 1 is composed of: lead frames 30, 31; a light emitting element 10 that is mounted through adhesive 20 on a cup portion 33 of the lead frame 30; boding wires 40, 41 that connect between the lead frames 30, 31 and n-electrode, p-electrode of light emitting element 10; epoxy resin 35 (hereinafter referred to as phosphor resin), which contains phosphor 36 dispersed uniformly, filled in the cup portion 33; and sealing resin 50 of epoxy resin that seals the light emitting element 10, part of lead frames 30, 31 and bonding wires 40, 41. The LED 1 emits white series light and can be applied to, for example, a planar light source and a linear light source in combination with a light guiding member and further applied to various display devices.

The light emitting element 10 and phosphor 36, which are feature factors of the invention, are detailed below.

The light emitting element 10 used has an emission wavelength of 360 nm to 550 nm. Such emission light can be obtained by exciting the phosphor 36 in high efficiency. In selecting emission wavelength of light emitting element 10, the excitation peak and emitted light color of phosphor 36 and the color of light emitted from the entire light emitting apparatus are considered. For example, in order to obtain white series emitted light, it is preferable that a light emitting element with an emission wavelength of 450 nm to 550 nm is used, and it is further preferable that a light emitting element with an emission wavelength of 450 nm to 550 nm is used. By using a light emitting element with different emission wavelength (emitted light color), the color of light radiated from the light emitting apparatus 1 can be varied.

The material of light emitting element 10 is not limited. It is preferable that the light emitting element is of III group nitride system compound semiconductor. The III group nitride system compound semiconductor is represented by a general formula: $Al_xGa_yIn_{1-x-y}N$ ($0 \leq X \leq 1$, $0 \leq Y \leq 1$, $0 \leq X+Y \leq 1$), and it includes a two-element system such as AlN, GaN and InN and a three-element system such as $Al_xGa_{1-x}N$, $Al_xIn_{1-x}N$ and $Ga_xIn_{1-x}N$ (thus far, all 0<X<1). Part of III system element can be replaced by boron (B), tellurium (Te) and part of nitrogen (N) can be replaced by phosphorus (P), arsenic (As), antimony (Sb), bismuth (Bi) etc. It is preferable that the element function portion of light emitting element 10 is composed of two-element system or three-element system III group nitride system compound semiconductor.

The III group nitride system compound semiconductor may include arbitrary dopant. For example, n-type impurity may be Si, Ge, Se, Te, C etc, and p-type impurity may be Mg, Zn, Be, Ca, Sr, Ba etc. After doping p-type impurity, III group nitride system compound semiconductor may be subjected to electron beam radiation, plasma radiation or furnace annealing.

The III group nitride system compound semiconductor may be grown by using MOCVD, MBE, HVPE, sputtering, ion plating, electron shower etc.

The material of a substrate on which the III group nitride system compound semiconductor is grown is not specifically limited if the substrate can be suitable to grow the III group nitride system compound semiconductor. For example, the substrate material may be sapphire, spinel, silicon, silicon carbide, zinc oxide, gallium phosphate, gallium arsenate, magnesium oxide, manganese oxide, III group nitride system compound semiconductor single crystal etc. Especially, sapphire substrate is preferable. Furthermore, a-face of sapphire substrate is more preferable. Meanwhile, in addition to the light emitting element, a light emitting element not to excite phosphor 36, described later, may be used. Thereby, the emission color of light emitting apparatus 1 can be changed or adjusted.

Figure 2:
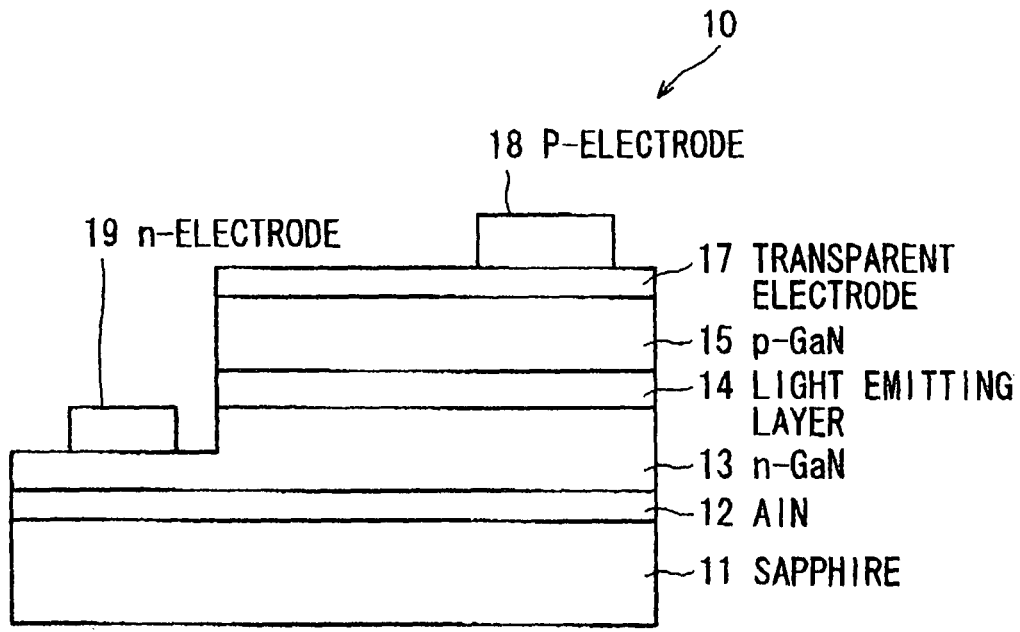
FIG. 2 is a cross sectional view showing LED 10 used in the light emitting apparatus 1.

FIG. 2 is a cross sectional view showing LED 10 used in the light emitting apparatus 1.

The emission wavelength of light emitting element 10 is about 480 nm, and the details of layers are as follows.

| Layers | Composition | Dopant |
|---|---|---|
| p-type layer 15 | p-GaN(0.3 μm) | Mg |
| light emitting layer 14 | supper-lattice structure | |
| quantum well layer | $In_{0.15}Ga_{0.85}N$(3.5 nm) | |
| barrier layer repetition number of quantum well and barrier layers 1 to 10 | GaN(3.5 nm) | |
| n-type layer 13 | n-GaN(4 μm) | Si |
| buffer layer 12 | AlN(10 nm) | |
| substrate 11 | sapphire (300 μm) | |

The buffer layer 12 is used to grow a high-quality semiconductor layer and is formed on the substrate 11 by MOCVD. In this embodiment AlN buffer layer is used, but not limited to that. Instead, GaN, InN (two-element system), III group nitride system compound semiconductor represented by: $Al_xGa_yN$ (0<x<1, 0<y<1, x+y=1) (three-element system), and III group nitride system compound semiconductor represented by: $Al_aGa_bIn_{1-a-b}N$ (0<a<1, 0<b<1, a+b□1) (four-element system) may be used.

The semiconductor layers are grown by using the known method, MOCVD. In this method, ammonia gas and III group element-alkyl compound gas, e.g., trimethylgallium (TMG), trimethylaluminum (TMA) and/or trimethylindium (TMI) are supplied on the substrate being heated at a given temperature, conducting a thermal decomposition reaction, thereby growing desired crystal on the buffer layer 12. Of course, the method of semiconductor layers is not limited that, and the other known method, MBE may be used.

The n-cladding layer 13 may be a two-layer structure of a lower electron density n-layer on the light emitting layer 14 side and a higher electron density n+ layer on the buffer layer 12 side. The latter is called n-type contact layer. The light emitting layer 14 is not limited to supper-lattice structure, and may be structured as single hetero type, double hetero type or homo junction type. Alternatively, it may be structured as MIS junction or PIN junction.

Between the light emitting layer 14 and the p-type layer 15, there may exit wide bandgap $Al_xGa_yIn_{1-x-y}N$ (0≦X≦1, 0≦Y≦1, X+Y≦1) with an acceptor such as Mg doped thereto. This is used for preventing electron injected in the light emitting layer 14 from diffusing into the p-type layer 15.

The p-type layer 15 may be a two-layer structure of a lower hole density p− layer on the light emitting layer 14 side and a higher hole density p+ layer on p electrode 18 layer 12 side. The latter is called p-type contact layer.

An n-electrode 19 is composed of two layers of Al and V, and it is formed such that, after forming the p-type layer 15, part of the p-type layer 15, light emitting layer 14 and n-type layer 13 is removed by etching, and then the two layers are deposited on the n-type layer 13.

A transparent electrode 17 is thin film including Au, and it covers substantially the entire surface of p-type layer 15. Also, a p-electrode 18 is also of a material including Au and is formed on the transparent electrode 17. After forming the semiconductor layers and electrodes, each chip is separated.

Furthermore, a reflection layer may be provided between the light emitting layer 14 and the substrate 11 or on the surface of substrate with no semiconductor layer formed thereon. With such a reflection layer, emitted light advancing from the light emitting layer 14 toward the substrate 11 side can be effectively reflected in the direction of light extraction surface. As a result, the emission efficiency can be enhanced.

Figure 3:
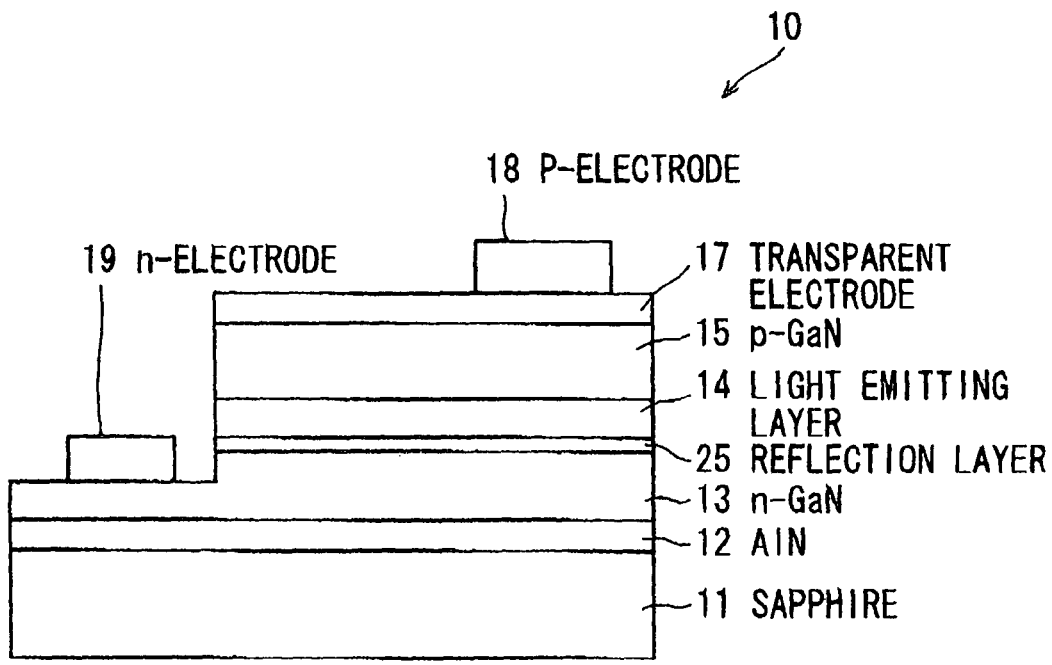
FIG. 3 is a cross sectional view showing a light emitting element 100 with a reflection layer formed just under a light emitting layer.
Figure 4:
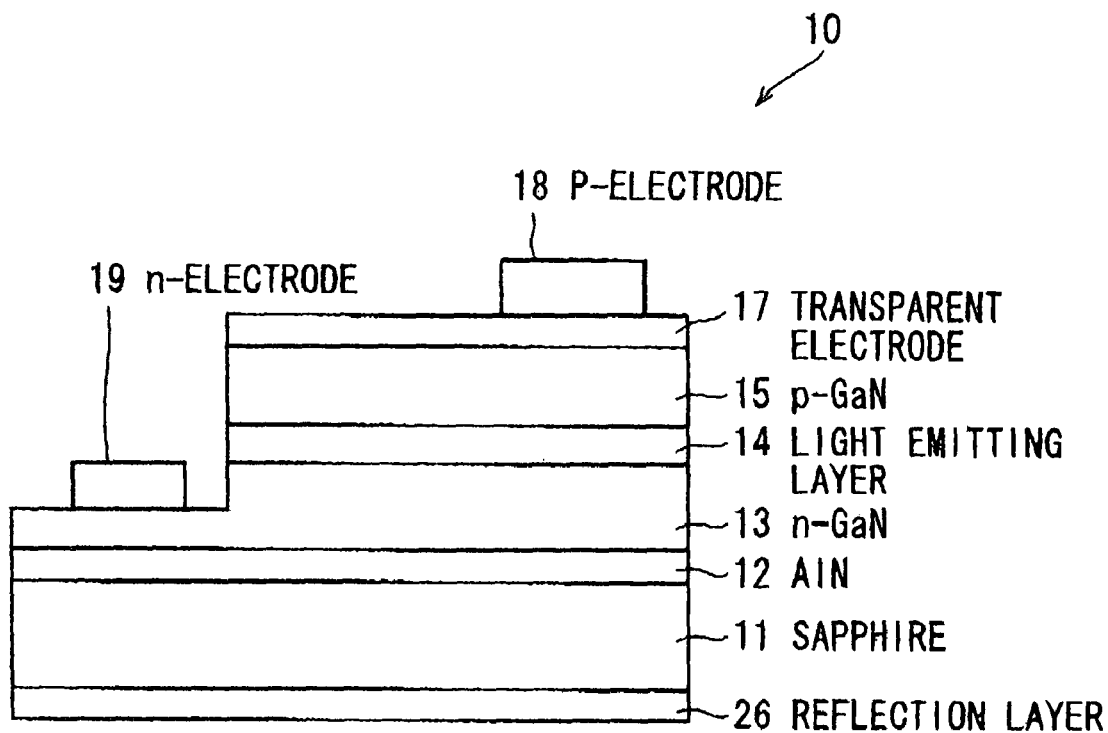
FIG. 4 is a cross sectional view showing a light emitting element 101 with a reflection layer formed on the surface of substrate with no semiconductor layer formed thereon.

FIG. 3 is a cross sectional view showing a light emitting element 100 with a reflection layer formed just under the light emitting layer. FIG. 4 is a cross sectional view showing a light emitting element 101 with a reflection layer formed on the surface of substrate with no semiconductor layer formed thereon. Like components are indicated by same numerals used in FIG. 2.

As shown in FIG. 3, the light emitting element 100 is provided with the reflection layer 25 formed just under the light emitting layer 14. As shown in FIG. 4, the light emitting element 101 is provided with the reflection layer 26 formed on the surface of substrate with no semiconductor layer formed thereon. The reflection layer 25 is of metal nitride. It is preferably of one or more arbitrarily selected from titanium nitride, zirconium nitride and tantalum nitride. The reflection layer 26 is also of metal nitride. It may be of metal of Al, In, Cu, Ag, Pt, Ir, Pd, Rh, W, Mo, Ti, Ni etc. or an alloy of two or more arbitrarily selected from these metals.

The light emitting element 10 is mounted through the adhesive 20 on the cup portion 33 of lead frame 30. The adhesive 20 is Ag paste that Ag is mixed as filler into epoxy resin. With this Ag paste, the radiation of heat generated from the light emitting element 10 can be enhanced. Instead of Ag paste, the other known adhesives may be used.

The cup portion 33 is filled with the epoxy resin 35 in which phosphor 36 is dispersed uniformly. After wire-bonding, the cup portion 33 may be filled with the epoxy resin 35 including phosphor 36. Alternatively, before mounting the light emitting element 10 on the cup portion 33, a layer including phosphor 36 may be formed on the surface of light emitting element 10. For example, the light emitting element 10 is dipped into epoxy resin including phosphor 36 to form a phosphor resin layer on the light emitting element 10, and then the light emitting element 10 is mounted on the cup portion 33 using Ag paste. The phosphor resin layer may be formed by sputtering, coating, or painting, other than the dipping.

The phosphor 36 is explained below. The phosphor 36 of the invention is of rare-earth element doped oxide nitride phosphor or cerium ion doped lanthanum silicon nitride phosphor.

Herein rare-earth element doped oxide nitride means a crystalline material, not including a glass material such as oxynitride glass. However, it may include a small amount of glass phase.

Also, cerium ion doped lanthanum silicon nitride means a crystalline material, not including a glass material.

First and second phosphors as a preferred example of rare-earth element doped oxide nitride phosphor, and a third phosphor as a preferred example of cerium ion doped lanthanum silicon nitride phosphor are explained below.

At first, the first and second phosphors as a preferred example of rare-earth element doped oxide nitride phosphor are described below.

The first phosphor is single-phase α-sialon phosphor that is represented by: $Me_xSi_{12-(m+n)}Al_{(m+n)}O_nN_{16-n}:Re1_yRe2_z$. Part or all of metal (Me) (Me is one or more of Li, Ca, Mg, Y and lanthanide metals except for La and Ce) dissolved into the α-sialon is replaced by lanthanide metal (Re1) (Re1 is one or more of Ce, Pr, Eu, Tb, Yb and Er) as luminescence center or lanthanide metal (Re1) and lanthanide metal (Re2) (Re2 is Dy) co-activator.

In this case, Me is preferably one or more of Ca, Y and lanthanide metals except for La and Ce, and it is further preferably Ca or Nd. The lanthanide metal (Re1) used for replacing is preferably Ce, Eu or Yb, and it is further preferably Ce or Eu.

In case of using two kinds of metals for replacing, for example, a combination of Eu and Er is preferable. In case of using three kinds of metals for replacing, for example, a combination of Eu, Er and Yb is preferable.

Also, the metal (Me) may be replaced by lanthanide metal Re1 and lanthanide metal Re2 as co-activator. The lanthanide metal Re2 is dysprosium (Dy). In this case, the lanthanide metal Re1 is preferably Eu.

Meanwhile, if part or all of metal (Me) replaced by one or more of Ce, Pr, Eu, Tb, Yb and Er (lanthanide metal (Re1)), or one or more of Ce, Pr, Eu, Tb, Yb and Er (lanthanide metal (Me) (Re1)) and Dy (lanthanide metal (Re2)), then the metal is not necessarily added and may be replaced by further preferable one.

A-sialon ($\alpha$-sialon) has a higher nitrogen content than oxynitride glass and is represented by: $M_xSi_{12-(m+n)}Al_{(m+n)}O_nN_{16-n}$ where x is a value obtained dividing (m) by a valence of metal (M). Meanwhile, oxynitride glass is, as described in prior art 3, such a phosphor that serves to shift the position of excitation/emission peak of conventional oxide system phosphors to the longer wavelength side by replacing oxygen atom surrounding the rare-metal element as luminescence center by nitrogen atom to relax the influence of surrounding atoms to electron of rare-metal element, and that has an excitation spectrum extending until visible region ($\Box 500$ μm).

Also, in the single-phase $\alpha$-sialon phosphor, the metal (Me) is dissolved in the range of, at the minimum, one per three unit cells of $\alpha$-sialon including four mass weights of (Si, Al)$_3$(N, O)$_4$ to, at the maximum, one per one unit cell thereof. The solid solubility limit is generally, in case of bivalent metal (Me), $0.6<m<3.0$ and $0\Box n<1.5$ in the above formula and, in case of trivalent metal (Me), $0.9<m<4.5$ and $0\Box n<1.5$. It is estimated that, in a region except for those regions, single-phase $\alpha$-sialon phosphor is not obtained. Therefore, the regions defined above are preferable.

The interionic distance of lanthanide metal Re1 as luminescence center to replace part or all of metal (Me) and to serve as activator is about 5 angstroms at the minimum. It is significantly greater than 3 to 4 angstroms in phosphor known thus far. Therefore, it can prevent a significant reduction in emission intensity due to concentration quenching generated when a high concentration of lanthanide metal as luminescence center is included in matrix material.

Further, in the single-phase $\alpha$-sialon phosphor, the metal (Me) is replaced by lanthanide metal (Re2) as co-activator as well as lanthanide metal (Re1) as luminescence center. It is assumed that lanthanide metal (Re2) has two co-activation effects. One is sensitizer function and the other is to newly generate a carrier trap level to develop or improve the long persistence or to improve the thermal luminescence. Since the lanthanide metal Re2 is co-activator, it is suitable that the replacement amount thereof is generally $0.0\Box z<0.1$ in the earlier formula.

As described earlier, the single-phase $\alpha$-sialon phosphor has $\alpha$-sialon as a matrix material, and is essentially different in composition and crystal structure from a phosphor having $\beta$-sialon as matrix material.

Namely, $\beta$-sialon is represented by: $Si_{6-z}Al_zO_zN_{8-z}$ ($0<z<4.2$), and it is solid solution of $\beta$-type silicon nitride where part of Si sites is replaced by Al and part of N sites is replaced by O.

In contrast, $\alpha$-sialon is represented by: $Me_xSi_{12-(m+n)}Al_{(m+n)}O_nN_{16-n}$, and it is solid solution of $\alpha$-type silicon nitride, where part of Si—N bonds is replaced by Al—N bond and a specific metal (Me) (Me is one or more of Li, Ca, Mg, Y and lanthanide metals except for La and Ce) invades between lattices and is dissolved therein.

Thus, both are different in state of solid solution and, therefore, the $\beta$-sialon has a high oxygen content and the $\alpha$-sialon has a high nitrogen content. So, if a phosphor is synthesized using $\beta$-sialon as matrix material and adding one or more of rare-earth oxides of Ce, Pr, Eu, Tb, Yb and Er as luminescence center, it becomes a mixed material that has a compound including a rare-earth metal between $\beta$-sialon particles since the $\beta$-sialon does not dissolve metal.

In contrast, if $\alpha$-sialon is used as matrix material, the metal (Me) (Me is one or more of Li, Ca, Mg, Y and lanthanide metals except for La and Ce) is taken and dissolved in the crystal structure and the metal (Me) is replaced by rare-earth metal, Ce, Pr, Eu, Tb, Yb and Er as luminescence center. Therefore, the oxide nitride phosphor composed of single-phase $\alpha$-sialon structure can be obtained.

Accordingly, the composition and crystal structure of phosphor drastically changes by whether to use $\beta$-sialon or $\alpha$-sialon as matrix material. This is reflected in emission characteristics of phosphor.

In case of using $\beta$-sialon as matrix material, for example, a phosphor that is synthesized adding Er oxide to $\beta$-sialon as described in embodiments 33 to 35 of Japanese patent application laid-open No. 60-206889 radiates a blue luminescent light (410-440 nm). In $\alpha$-sialon, as described later, rare-earth element doped oxide nitride phosphor radiates orange to red light (570-590 nm) due to the activation of Er. Viewing from this phenomenon, it is assumed that Er is taken in the crystal structure of $\alpha$-sialon and, thereby, Er is influenced by nitrogen atom composing the crystal and, therefore, the elongation of light source wavelength, which is very difficult to realize in phosphor with oxide as matrix material, can be easily generated.

In case of using $\alpha$-sialon as matrix material, the rare-earth element doped oxide nitride phosphor also has the advantages of matrix material, $\alpha$-sialon. Namely, $\alpha$-sialon has excellent thermal and mechanical properties and can prevent the thermal relaxation phenomenon that causes a loss in excitation energy. Therefore, in the rare-earth element doped oxide nitride phosphor, a ratio of reduction in emission intensity according to rise of temperature becomes small. Thus, the temperature range available can be broadened as compared to the conventional phosphor.

Furthermore, $\alpha$-sialon has an excellent chemical stability. Therefore, the phosphor has an excellent heat resistance. The rare-earth element doped oxide nitride phosphor can be excited by ultraviolet rays to X-rays further electron beam, according to O/N ratio in its composition, selection of lanthanide metal Re1 to replace metal (Me), and existence of lanthanide metal Re2 as co-activator.

Especially, of rare-earth element doped oxide nitride phosphor, in $Me_xSi_{9.75}Al_{2.25}O_{0.75}N_{15.25}:Re1_yRe2_z$ (m=1.5, n=0.75), one that satisfies $0.3<x+y<0.75$ and $0.01<y+z<0.7$ (where $y>0.01$, $0.0\Box z<0.1$) or $0.3<x+y+z<1.5$, $0.01<y<0.7$ and $0.0\Box z<0.1$, and metal (Me) is Ca offers an excellent emission characteristic and can have great potential in applications not only as ultraviolet-visible light excitation phosphor but also as electron beam excitation phosphor.

Thus, the rare-earth element doped oxide nitride phosphor is especially effective in making white LED and is a suitable phosphor for InGaN system blue LED as light source.

Next, the second phosphor to be used as phosphor 36 will be explained that is a rare-earth element doped oxide nitride phosphor that contains $\alpha$-sialon as main component (hereinafter referred to as mixture $\alpha$-sialon phosphor). It is composed of $\alpha$-sialon, which dissolves a rare-earth element allowing an increase in brightness of a white LED using blue LED chip as light source, $\beta$-sialon, and unreacted silicon nitride.

As the result of researching a composition with high emission efficiency, a mixture material with a property equal to single-phase α-sialon phosphor is found that is composed of α-sialon that part of Ca site in α-sialon stabilized by Ca is replaced by one or more of rare-earth metal (M) (where M is Ce, Pr, Eu, Tb, Yb or Er), β-sialon and unreacted silicon nitride. It can offer high brightness white LED.

M is preferably Ce, Eu or Yb and further preferably Ce or Eu.

The mixture α-sialon phosphor can be produced adding less rare-earth element than the single-phase α-sialon phosphor. Thus, the material cost can be reduced.

Further, since the mixture α-sialon phosphor also has α-sialon as matrix material like the single-phase α-sialon phosphor, it can have the advantages of matrix material α-sialon, i.e., good chemical, mechanical and thermal properties. Thus, it offers a stable and long-lifetime phosphor material. Due to these properties, it can suppress thermal relaxation phenomenon causing a loss in excitation energy. Therefore, in α-sialon with dissolved rare-earth element as well as Ca in this embodiment, a ratio of reduction in emission intensity according to rise of temperature becomes small. Thus, the temperature range available can be broadened as compared to the conventional phosphor.

Furthermore, the mixture α-sialon phosphor can be excited by ultraviolet rays to X-rays further electron beam, according to O/N ratio in its composition and selection of metal (M).

The mixture α-sialon phosphor, as a solution to the problem described earlier, offers a material that has an emission property equal to the single-phase α-sialon phosphor even when reducing the amount of rare-earth metal added. In order to stabilize the α-sialon structure, it is necessary to dissolve more than a certain amount of element. When amounts of Ca and trivalent metal dissolved are given x and y, respectively, a value of (x+y) is needed to be greater than 0.3 in thermodynamic equilibrium.

The mixture α-sialon phosphor includes an organ with β-sialon and unreacted silicon nitride remained other than single-phase α-sialon phosphor because of less addition amount and not reaching the thermodynamic equilibrium.

The amount of added metal in the mixture α-sialon phosphor is in the range of 0.05<(x+y)<0.3, 0.02<x<0.27 and 0.03<y<0.3 in chemical composition of powder. If the amount of added metal is less than the lower limit, the amount of α-sialon lowers and the emission intensity lowers. If the amount of added metal is greater than the upper limit, only α-sialon remains. Therefore, the object of high brightness can be completed. In the range defined above, the mixture α-sialon phosphor can be obtained that is composed of: α-sialon of 40 weight % or more and 90 weight % or less; β-sialon of 5 weight % or more and 40 weight % or less; and unreacted silicon nitride of 5 weight % or more and 30 weight % or less. The reason why the emission intensity is high even with the unreacted silicon nitride included is that α-sialon epitaxially grows on unreacted silicon nitride and its surface portion mainly responds to excitation light to offer an emission property substantially equal to only α-sialon.

The range is preferably 0.15<(x+y)<0.3, 0.10<x<0.25 and 0.05<y<0.15. In this range, the mixture α-sialon phosphor can be obtained that is composed of: α-sialon of 50 weight % or more and 90 weight % or less; β-sialon of 5 weight % or more and 30 weight % or less; and unreacted silicon nitride of 5 weight % or more and 20 weight % or less.

The mixture α-sialon phosphor is obtained by heating $Si_3N_4-M_2O_3-CaO-AlN-Al_2O_3$ system mixed powder at 1650 to 1900° C. in inert gas atmosphere to get a sintered body, then powdering it. Since CaO is so instable that it easily reacts with moisture vapor in the air, it is generally obtained by adding in the form of calcium carbonate or calcium hydroxide, then making it CaO in the process of heating at high temperature.

The chemical composition of mixture α-sialon phosphor can be defined using the composition range of M-α-sialon, Ca-α-sialon and β-sialon. Namely, in the range of three composition lines of $Si_3N_4$-a($M_2O_3$.9AlN), $Si_3N_4$-b(CaO.3AlN) and $Si_3N_4$-c (AlN.Al$_2O_3$), it is defined $4\times10^{-3}<a<4\times10^{-2}$, $8\times10^{-3}<b<8\times10^{-2}$ and $10^{-2}<c<8\times10^{-1}$.

Figure 5:
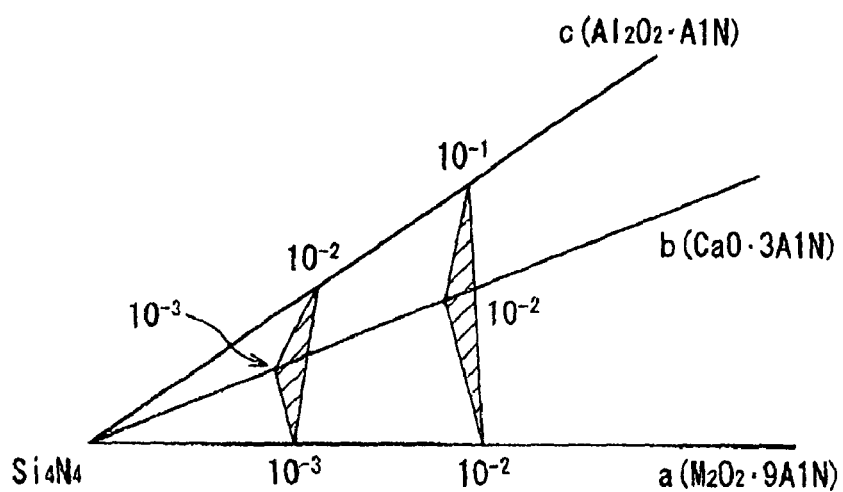
FIG. 5 is a diagram showing the chemical composition range of mixture α-sialon phosphor (range sandwiched by two triangles indicated by oblique lines) and the chemical composition range of entire power.

FIG. 5 is a diagram showing the chemical composition range of mixture α-sialon phosphor (range sandwiched by two triangles indicated by oblique lines) and the chemical composition range of entire power.

As shown in FIG. 5, the chemical composition range of mixture α-sialon phosphor is that sandwiched by two triangles indicated by oblique lines in a triangular pyramid composition range with a peak of silicon nitride. The amount of metal dissolved in α-sialon exactly produced is (x+y)>0.3, which is an amount needed to stabilize the structure of α-sialon as described earlier. In a composition range with less addition amount than this, the mixture α-sialon phosphor is composed of α-sialon with composition of (x+y)>0.3, β-sialon with rare-earth metal not dissolved and unreacted silicon nitride. In general, a small amount of glass phase (less than 5%) is further included.

In the mixture α-sialon phosphor, α-sialon is generated on the surface of particle even when having less amount of rare-earth metal added and therefore being not composed only of α-sialon. Therefore, it offers an excellent emission characteristic and can have great potential in applications not only as ultraviolet-visible light excitation phosphor but also as electron beam excitation phosphor. Thus, the mixture α-sialon phosphor that is a composite sintered body including Ca-α-sialon with rare-earth metal dissolved simultaneously is effective in developing white LED.

Next, the third phosphor to be used as phosphor 36 will be explained that is a cerium ion doped lanthanum silicon nitride phosphor.

The third phosphor is represented by: $La_{1-x}Si_3N_5$:xCe (doping amount x is 0<x<1), where lanthanum site is replaced in solid dissolution by cerium ion activator. If the doping amount is 0.1<x<0.5, it is ultraviolet light excitation phosphor and, if the doping amount is 0.0<x<0.2, it is electron beam excitation phosphor.

Lanthanum silicon nitride ($LaSi_3N_5$) has an excellent thermal stability and serves to suppress the thermal relaxation phenomenon in the process of phosphor emission. Therefore, a loss in excitation energy can be reduced and a ratio of reduction in emission intensity according to rise of temperature becomes small. Thus, in the cerium ion doped lanthanum silicon nitride phosphor, the temperature range available can be broadened as compared to the conventional phosphor. Also, the lanthanum silicon nitride ($LaSi_3N_5$) has excellent chemical stability and light resistance.

The cerium ion doped lanthanum silicon nitride phosphor satisfies a blue chromaticity value and has excellent thermal stability, mechanical property and chemical stability. Therefore, it can have great potential in applications for fluorescent character display tube (VFD), field emission display (FED) etc. that may be used in severe environment.

The cerium ion doped lanthanum silicon nitride phosphor is, as described later, synthesized using e.g. reaction sintering furnace on the conditions of 1800 to 2200° C., under nitrogen pressure at 5 to 20 and 1 to 10 hours, preferably of 1850 to 1950° C., under nitrogen pressure at 5 to 10 atm and 1 to 2 hours.

The phosphor 36 is prepared as powder or sintered body, where the sintered body is to be crushed to powder. This is mixed with plastics or glass etc. and thereby, various complicated shapes can be formed. So, it has a high degree of freedom in shape. For example, it may be formed into a plate, which includes a flat plate, combined flat plates, plate with at least one curved face, plate with at least one uneven and/or curved face, cap-shaped, box-shaped etc.

When it is made to be powder or particles, the average particle diameter is preferably 20 µm or less, further preferably 10 µm or less and most preferably 5 µm or less. By reducing the particle diameter of phosphor, light generated from light emitting element can be efficiently absorbed and wavelength converted.

It is preferred that the powder or particles of phosphor is dispersed in a light transmitting material. Namely, it is preferably used as phosphor layer. The light transmitting material is epoxy resin, silicon resin, urea resin, glass etc. These materials may be used individually or as a mixture of arbitrarily selected two or more thereof.

According to use object, use conditions etc., the concentration of phosphor in light transmitting material can be changed. For example, the amount of phosphor may be changed continuously or stepwise according to nearing to the light emitting element. In this case, the phosphor concentration may be increased at part close to the light emitting element. Thereby, light generated from the light emitting element can be efficiently radiated toward the phosphor. On the contrary, the phosphor is likely subjected to heat generated from the light emitting element and the degradation of phosphor may occur. On the other hand, when the phosphor concentration is reduced according to nearing to the light emitting element, the degradation of phosphor due to heat generated from the light emitting element can be prevented.

The light transmitting material layer including phosphor is disposed in the light extraction direction of light emitting element. It is preferably formed so as to cover the light extraction direction of light emitting element. Between this layer and the light emitting element, a layer of another light transmitting material or a space may be provided.

The composite material of phosphor dispersed in plastics or glass can, by itself, compose a phosphor layer by forming into a desired shape. When it is formed into a plate, the amount of emission light wavelength-converted by phosphor can be controlled by the thickness of plate. Thus, by using the composite material of phosphor dispersed in plastics or glass, the mixed light of light emitted from light emitting element and light radiated from phosphor can be easily adjusted with high precision.

Further, since the phosphor has a persistence characteristic, light color of the light emitting apparatus can be controlled thereby. Namely, by turning on intermittently the light emitting element, light emitted from light emitting element and light radiated from phosphor can taken out in time division. Thereby, the light color of light emitting apparatus obtained by mixing light emitted from light emitting element and light radiated from phosphor can be adjusted. Especially when a blue light emitting element is used, the color tone of white light radiated from the light emitting apparatus can be delicately adjusted by controlling the turn-on time. In turning on intermittently the light emitting element, for example, the light emitting element can be driven with pulsed current. For example, with full-wave rectifier or half-wave rectifier, the light emitting element can be driven by using directly AC current.

Phosphor 36 of the embodiment is positioned to be radiated from light emitting element and radiates light. Namely, part of light emitted from the light emitting element is wavelength-converted by the phosphor. Thereby, light with a different wavelength (emission color) from that of the light emitting element is generated. The wavelength-converted light is mixed with light not wavelength-converted by phosphor. Therefore, the entire light emitting apparatus offers light with different color from that of the light emitting element. Meanwhile, the emission color can be changed by controlling the composition of phosphor. Thereby, the emission color of the entire light emitting apparatus can be adjusted.

In this embodiment, phosphor 36 is, as shown in FIG. 1, dispersed in epoxy resin. However, the base material to be dispersed of phosphor 36 is not limited to epoxy resin and may be the other transparent material such as silicon resin, urea resin and glass. Although in this embodiment phosphor 36 is uniformly dispersed in the phosphor resin 35, the concentration distribution of phosphor 36 in the phosphor resin 35 may be in a gradient. For example, a plurality of phosphor resin layers with different concentrations of phosphor 36 may be formed in the cup portion 33 by using epoxy resin with different concentrations of phosphor 36. Further, the concentration of phosphor 36 can be changed continuously.

Phosphor resin 35 may include a dispersion agent such as titanium oxide, titanium nitride, tantalum nitride, aluminum oxide, silicon oxide and barium titanate. When sealing resin 50 includes phosphor 36, the phosphor resin 35 can be omitted. Namely, the cup portion 33 is also filled with sealing resin 50 including phosphor 36. Also in this case, the concentration distribution of phosphor 36 in the sealing resin 50 may be in a gradient.

The p-electrode 18 and n-electrode 19 of light emitting element 10 are wire-bonded through the wires 40 and 41 to the lead frames 30 and 31, respectively. Thereafter, the light emitting element 10, part of lead frames 30, 31, and wires 40, 41 are sealed by sealing resin 50 composed of epoxy resin. The material of sealing resin 50 is not limited to epoxy resin, if it is transparent, and may be preferably silicon resin, urea resin or glass. Considering adhesion, refractive index etc. in case that the sealing resin 50 contacts the phosphor resin 35, it is preferably of the same material as the phosphor resin 35.

Although the sealing resin 50 is provided to protect the device structure, the shape of sealing resin 50 may be changed to allow the sealing resin 50 to have lens effect according to use object. For example, it is formed into concave lens type, convex lens type etc. other than the lamp type shown in FIG. 1. Further, the shape of sealing resin 50 viewed from the direction of light extraction (from above in FIG. 1) may be formed circular, elliptic or rectangular. Phosphor 36 may be also dispersed in the sealing resin 50 regardless of the previous case that the phosphor resin 35 is omitted.

The sealing resin 50 may include a dispersion agent. With the dispersion agent, the directional characteristics of light emitted from the light emitting element 10 can be weakened. The diffusion agent may be titanium oxide, titanium nitride, tantalum nitride, aluminum oxide, silicon oxide, barium titanate etc.

Furthermore, the sealing resin 50 may include a coloring agent. The coloring agent is used to prevent phosphor from showing a proper color in turning on or off the light emitting element 10. In addition, when light of light emitting element 10 includes many wavelengths in ultraviolet region, the lifetime of sealing resin 50 can be elongated by adding an ultraviolet ray absorption agent to the sealing resin 50. Meanwhile, the sealing resin 50 may arbitrary include one or more of phosphor 36, diffusion agent, coloring agent and ultraviolet ray absorption agent.

LED 1 thus composed allows part of blue light emitted from the light emitting element 10 to be wavelength-converted by phosphor 36. Light thus wavelength-converted is mixed with part of blue light from the light emitting element 10, then radiated to outside. As a result, LED 1 can offer white light.

Figure 6A:
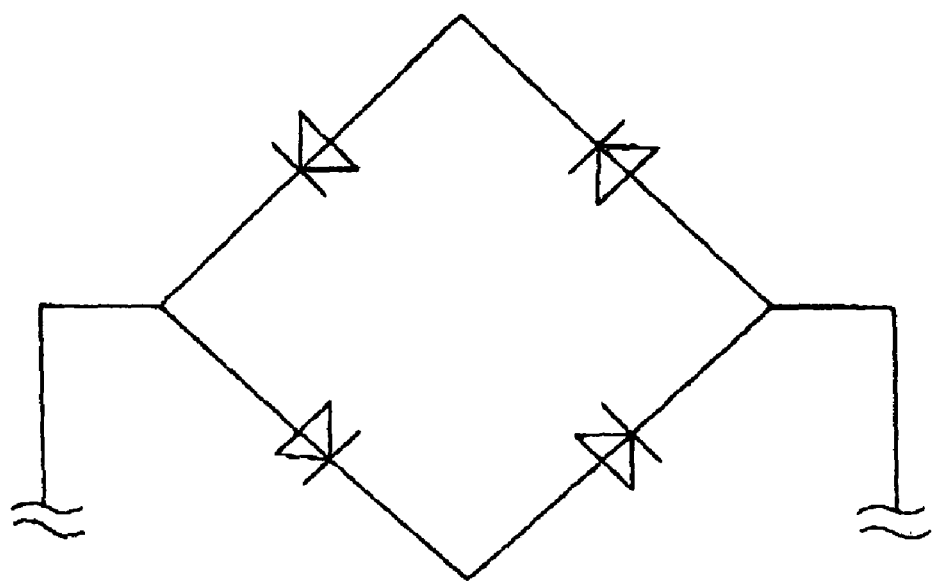
FIGS. 6A and 6B are circuit diagrams showing rectifier circuits used in the first embodiment.
Figure 6B:
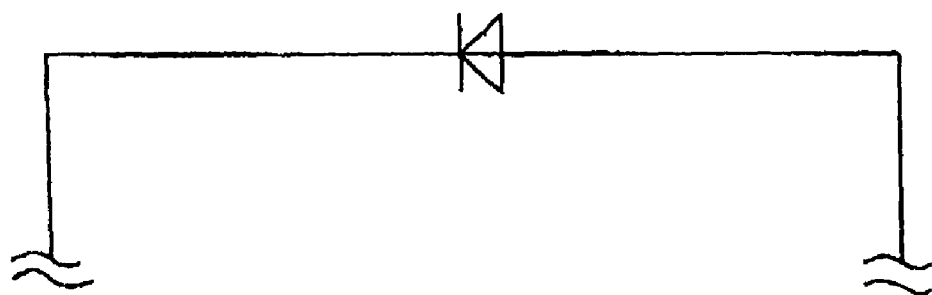

FIGS. 6A and 6B are circuit diagrams showing rectifier circuits used in the first embodiment. LED 1 can be driven with pulsed current. Thereby, light from light emitting element 10 and light from phosphor 36 are taken out in time division and therefore the emission color of LED 1 can be adjusted. AC current can be supplied to LED 1 by using the full-wave rectifier circuit in FIG. 6A or the half-wave rectifier circuit in FIG. 6B.

In addition to the light emitting element 10, the other light emitting element may be used. The other light emitting element may be a light emitting element with different emission wavelength from that of light emitting element 10. A light emitting element is preferred that has an emission wavelength allowing phosphor 36 not to be excited or not to radiate light. With such light emitting element provided, the emission color of LED 1 can be changed or adjusted. Further, with a plurality of light emitting elements 10, the brightness can be enhanced.

Figure 7A:
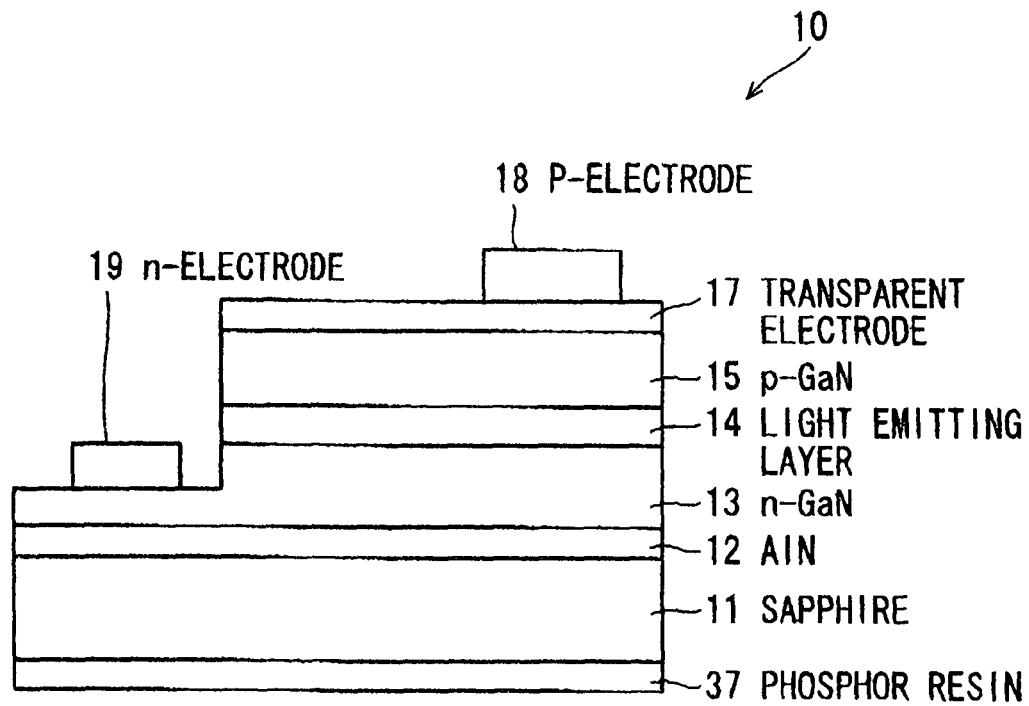
FIG. 7A is a cross sectional view showing the light emitting element 10 with phosphor layer formed on the bottom surface of light emitting element 10.
Figure 7B:
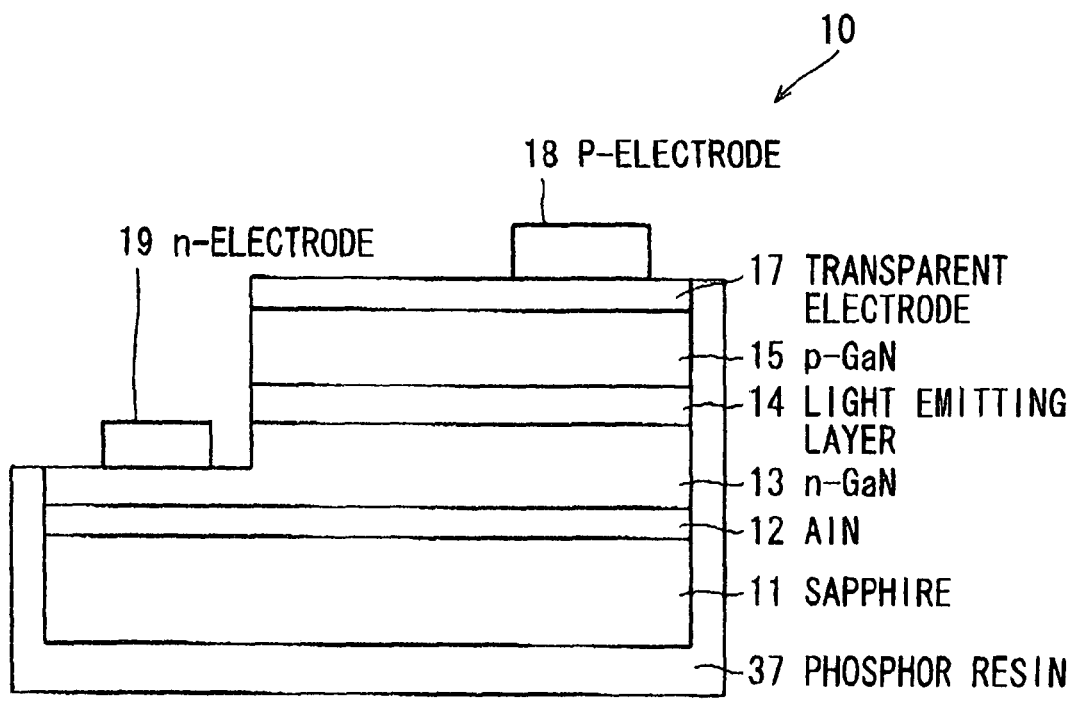
FIG. 7B is a cross sectional view showing the light emitting element 10 with phosphor layer formed on the bottom surface and side wall of light emitting element 10.

FIG. 7A is a cross sectional view showing the light emitting element 10 with phosphor layer formed on the bottom surface of light emitting element 10. FIG. 7B is a cross sectional view showing the light emitting element 10 with phosphor layer formed on the bottom surface and side wall of light emitting element 10.

As shown in FIGS. 7A and 7B, the light emitting element 10 may be provided with the phosphor layer 37 to cover the bottom surface of and/or sidewall of light emitting element 10. In this case, the phosphor resin 35 can be omitted. In FIG. 7B, light radiated from the side wall of light emitting element 10 is wavelength-converted by phosphor 36.

The phosphor layer 37 may be a light transmitting material (e.g., epoxy resin, silicon resin, urea resin, glass) with phosphor 36 dispersed therein. In this case, the phosphor layer 37 can be formed by e.g., dipping the substrate side of light emitting element 10 into the light transmitting material. Also, it may be formed by sputtering, coating or painting of light transmitting material with phosphor 36 dispersed therein.

The phosphor layer 37 may be formed into a plate using a composite material of glass and rare-earth element doped oxide nitride phosphor or cerium ion doped lanthanum silicon nitride phosphor (hereinafter referred to as phosphor glass).

The structure in FIG. 7A is produced as follows. In the process of making the light emitting element 10, semiconductor layers are formed on the substrate, the phosphor glass plate is bonded to the back surface of substrate, and then each chip is separated. Alternatively, a substrate may be used that has the phosphor glass previously bonded to its opposite surface to that on which semiconductor layers are grown. Furthermore, after making the light emitting element 10, the phosphor glass plate with a given size may be bonded to the bottom surface of light emitting element 10.

The structure in FIG. 7B is produced as follows. For example, a phosphor glass with a given shape is prepared. Then, the light emitting element 10 is fitted in the phosphor glass to provide the phosphor layer 37. In this case, the phosphor glass can be bonded to the light emitting element 10 by using adhesive.

Figure 8:
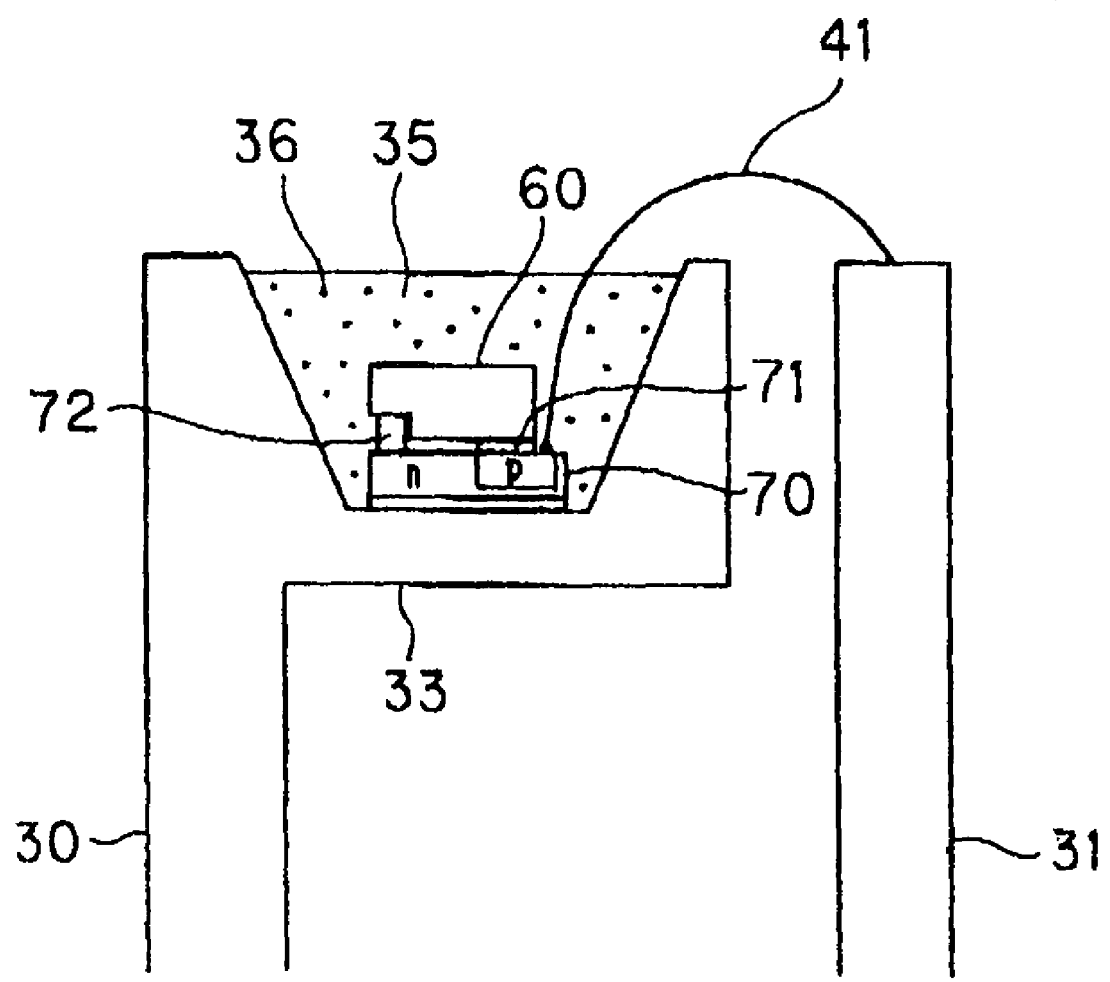
FIG. 8 is an illustration showing LED 1 with planar type Zener light emitting element.
Figure 9A:
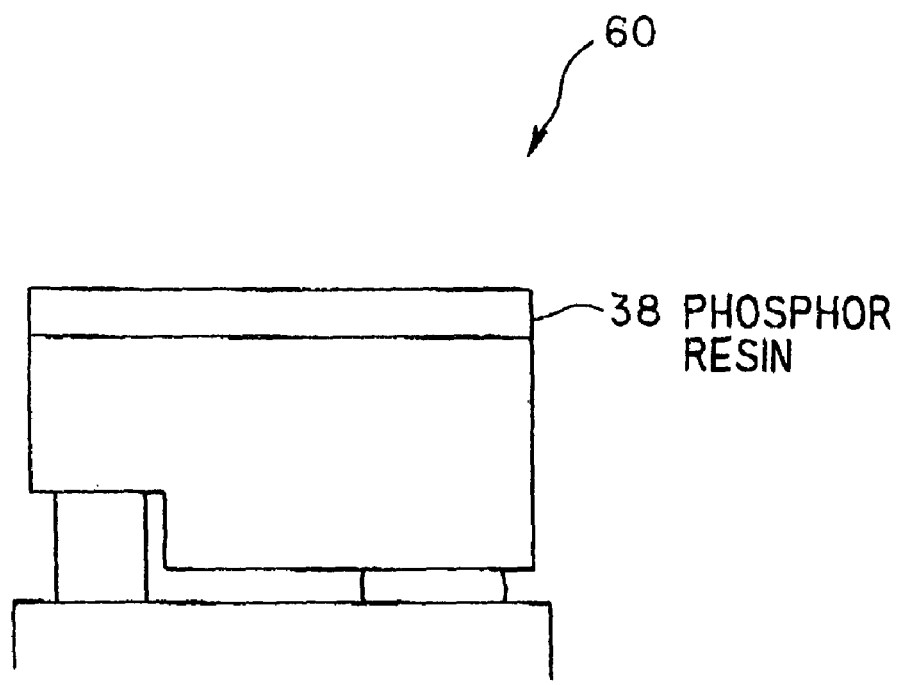
FIG. 9A is an enlarged cross sectional view showing the light emitting element 60 with phosphor layer formed on the top surface of light emitting element 60.
Figure 9B:
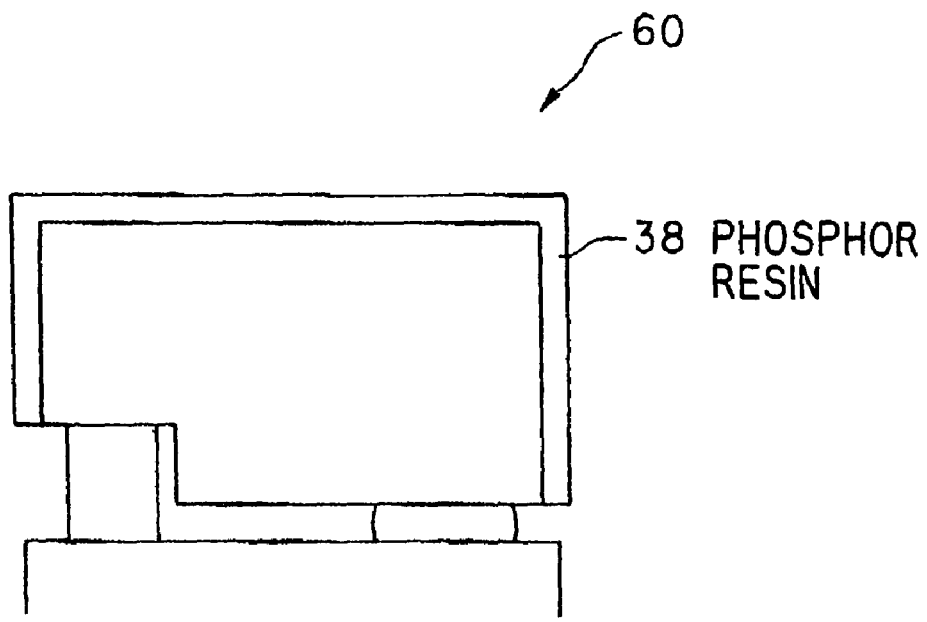
FIG. 9B is an enlarged cross sectional view showing the light emitting element 60 with phosphor layer formed on the to surface and side wall of light emitting element 60.

FIG. 8 is an illustration showing LED 1 with planar type Zener light emitting element. FIG. 9A is an enlarged cross sectional view showing the light emitting element 60 with phosphor layer formed on the top surface of light emitting element 60. FIG. 9B is an enlarged cross sectional view showing the light emitting element 60 with phosphor layer formed on the surface and side wall of light emitting element 60.

As shown in FIG. 8, LED 1 may use the planar type Zener light emitting element. The light emitting element 60 is structured such that, removing the electrodes 17, 18 and 19 from the light emitting element 10 in FIG. 2, the light emitting element is flip-chip mounted on a silicon substrate 70. The p-type GaN contact layer 15 of light emitting element 60 is connected through a metal electrode layer 71 to p-type region of silicon substrate 70.

The material of metal electrode layer 71 is e.g., Au alloy but not limited to that if it offers ohmic contact between the silicon substrate 70 and p-GaN contact layer 15. The n-type GaN contact layer 13 of light emitting element 60 is connected through a metal electrode layer 72 to n-type region of silicon substrate 70. The material of metal electrode layer 72 is e.g., Al alloy but not limited to that if it offers ohmic contact between the silicon substrate 70 and n-GaN contact layer 13. The p-type region of silicon substrate 70 is connected through the wire 41 to the lead frame 31.

In the case of using the planar type Zener light emitting element, the cup portion 33 may be filled with phosphor resin 35 with phosphor 36 dispersed therein. Like the case of light emitting element 10, the sealing resin 50 may include phosphor 36 while omitting the phosphor resin 35 in the cup portion 33.

Further, as shown in FIGS. 9A and 9B, the light emitting element 60 may be provided with the phosphor layer 38 to cover the top surface of and/or sidewall of light emitting element 60. In FIG. 9B, light radiated from the side wall of light emitting element 60 is wavelength-converted by phosphor 36. The phosphor layer 38 in FIGS. 9A and 9B can be formed by using the same material as the phosphor layer 37 in like manner.

As described above, when the phosphor is dispersed in the light transmitting material layer such that light from the light emitting element passes through that layer, light from the light emitting element and light from the phosphor are automatically mixed in that layer. However, the form of mixing both lights is not limited to this. For example, phosphor may be islands-shaped disposed around the light emitting element. Part of light from the light emitting element passes through between the phosphor islands and can be mixed with light from phosphor in the sealing resin. Alternatively, the phosphor may be disposed out of the optical axis of light emitting element while converging light from the phosphor in the direction of optical axis by using a reflector etc. Thereby, light from the light emitting element and light from the phosphor can be mixed.

Second Embodiment

Figure 10:
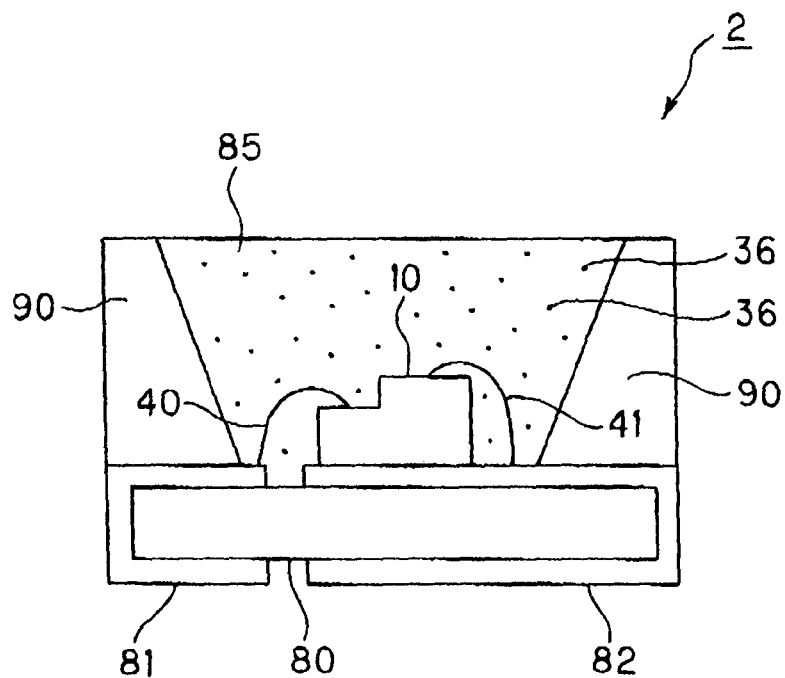
FIG. 10 is a cross sectional view showing a chip-type LED as a light emitting apparatus in a second preferred embodiment according to the invention.

FIG. 10 is a cross sectional view showing a chip-type LED as a light emitting apparatus in the second preferred embodiment according to the invention. Like components are indicated by same numerals used in lamp-type LED 1 of the first embodiment.

LED 2 shown in FIG. 10 also emits white light like the lamp-type LED 1 and can be applied to, for example, a planar light source and a linear light source in combination with a light guiding member, and further applied to various display devices.

The light emitting element 10 is mounted on a substrate 80 through Ag paste etc. Electrodes (not shown) of light emitting element 10 are connected through wires 40, 41 to electrodes 80, 81 provided on the substrate 80. 90 is a reflection plate disposed around the light emitting element and the surface thereof is mirrored.

The cup portion formed by the substrate 80 and reflection plate 90 is filled with sealing resin 85. The light emitting element 10 and wires 40, 41 are sealed with the sealing resin 85. The sealing resin 85 is of phosphor resin that phosphor 36 is uniformly dispersed in transparent material such as epoxy resin, silicon resin and urea resin. The sealing resin 85 is formed by e.g., potting, printing etc. In LED 2 thus structured, part of light from the light emitting element 10 is absorbed and wavelength-converted by phosphor 36 when it passes through the sealing resin 85. Light thus wavelength-converted is mixed with light transmitted through the sealing resin 85 without being absorbed by phosphor 36, and white light is thereby obtained from the entire LED 2.

Figure 11:
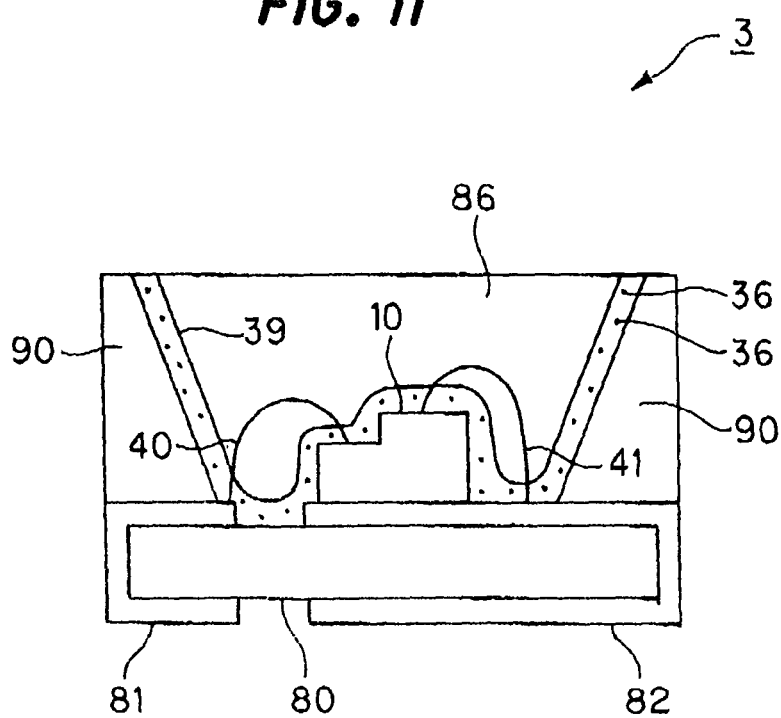
FIG. 11 is a cross sectional view showing another chip-type LED 3 as a light emitting apparatus in the second preferred embodiment according to the invention.

FIG. 11 is a cross sectional view showing another chip-type LED 3 as a light emitting apparatus in the second preferred embodiment according to the invention.

Although in FIG. 10 the sealing resin 85 of phosphor resin is embedded in the cup portion formed the substrate 80 and reflection plate 90, another structure shown in FIG. 11 may be employed that a layer 39 (phosphor layer) of phosphor resin is formed on the surface of light emitting element 10 and cup portion and light transmitting resin 86 is embedded thereon.

For example, after mounting the light emitting element 10 on the substrate 80, the phosphor layer 39 is formed by vapor deposition, sputtering, coating, painting etc. The light transmitting resin layer 86 is formed by the same method as sealing resin 85. With such a structure, the amount of light wavelength-converted by the phosphor 36 of light emitted from the light emitting element 10 can be controlled by changing the thickness of phosphor layer 39 and the emission color of LED 3 can be thereby adjusted. Also, the phosphor layer 39 can be covered with light transmitting resin layer 86 to protect it.

Like LED 1 in the first embodiment, the sealing resin 65 of LED 2 in FIG. 10 and the phosphor layer 39 and light transmitting resin layer 86 in FIG. 11 may include one or more of diffusion agent, coloring agent and ultraviolet ray absorption agent.

Figure 12:
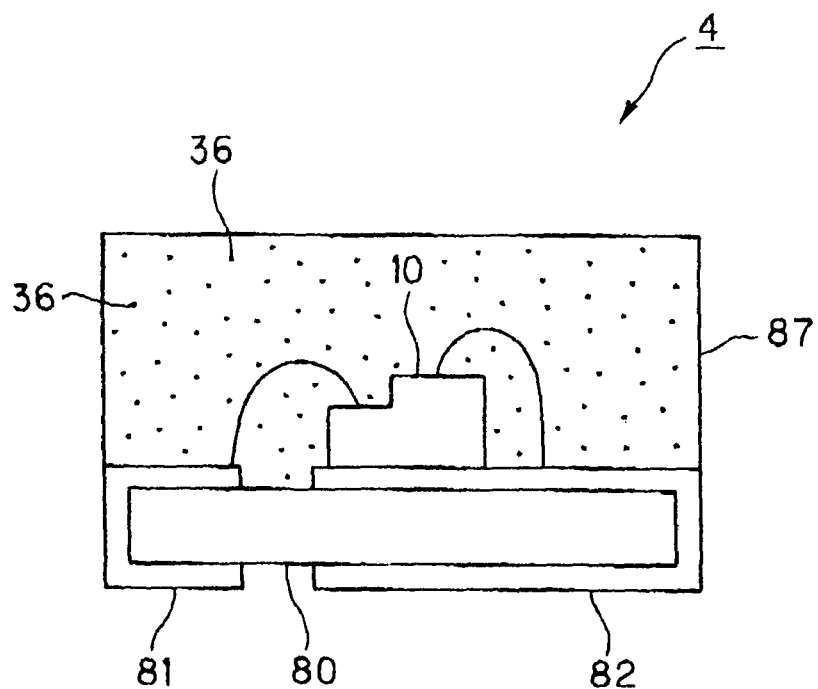
FIG. 12 is a cross sectional view showing another chip-type LED 4 as a light emitting apparatus in the second preferred embodiment according to the invention.

FIG. 12 is a cross sectional view showing another chip-type LED 4 as a light emitting apparatus in the second preferred embodiment according to the invention. Like components are indicated by same numerals used in LED 2 in FIG. 10.

As shown in FIG. 12, the reflection plate 90 may be removed from LED 2 in FIG. 10. Sealing resin 87 of LED 4 is of epoxy resin with phosphor 36 dispersed therein, and it may be formed by molding after mounting the light emitting element 10 on the substrate 80.

Figure 13:
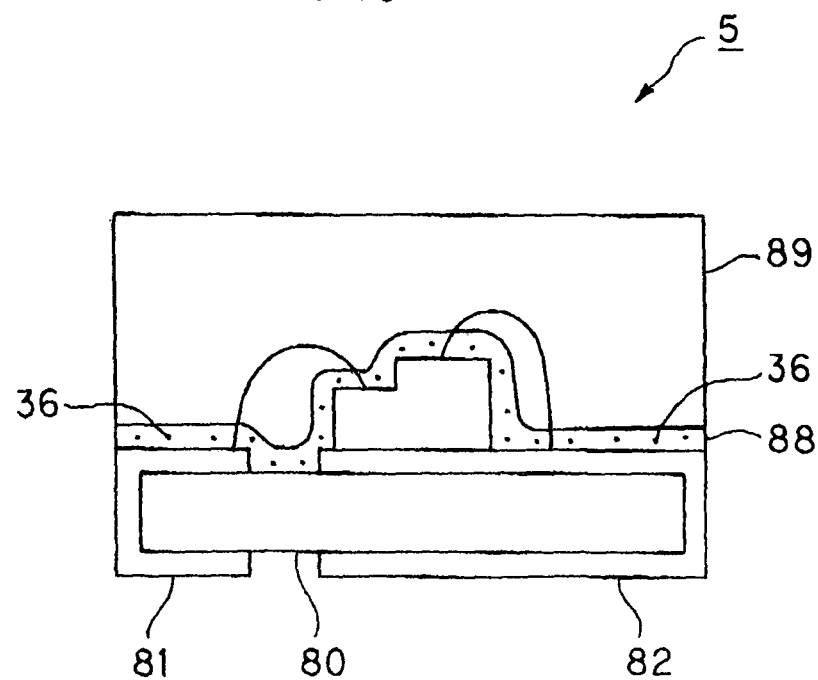
FIG. 13 is a cross sectional view showing another chip-type LED 5 as a light emitting apparatus in the second preferred embodiment according to the invention.

FIG. 13 is a cross sectional view showing another chip-type LED 5 as a light emitting apparatus in the second preferred embodiment according to the invention.

As shown in FIG. 13, the reflection plate 90 may be removed from LED 3 in FIG. 11. Phosphor layer 88 may be formed like the phosphor layer 39 of LED 3, and light transmitting resin layer 89 may be formed like the light transmitting resin layer 86 of LED 3.

In the chip-type LED's 2 to 5, the planar type Zener light emitting element 60 may be employed that has the phosphor layer 38 formed on the surface of substrate as shown in FIGS. 9A and 9B. In this case, for LED's 2 and 4, the phosphor 36 in sealing resin 85, 87 may be omitted and, for LED's 3 and 5, the phosphor layer 39, 88 may be omitted.

Third Embodiment

Figure 14:
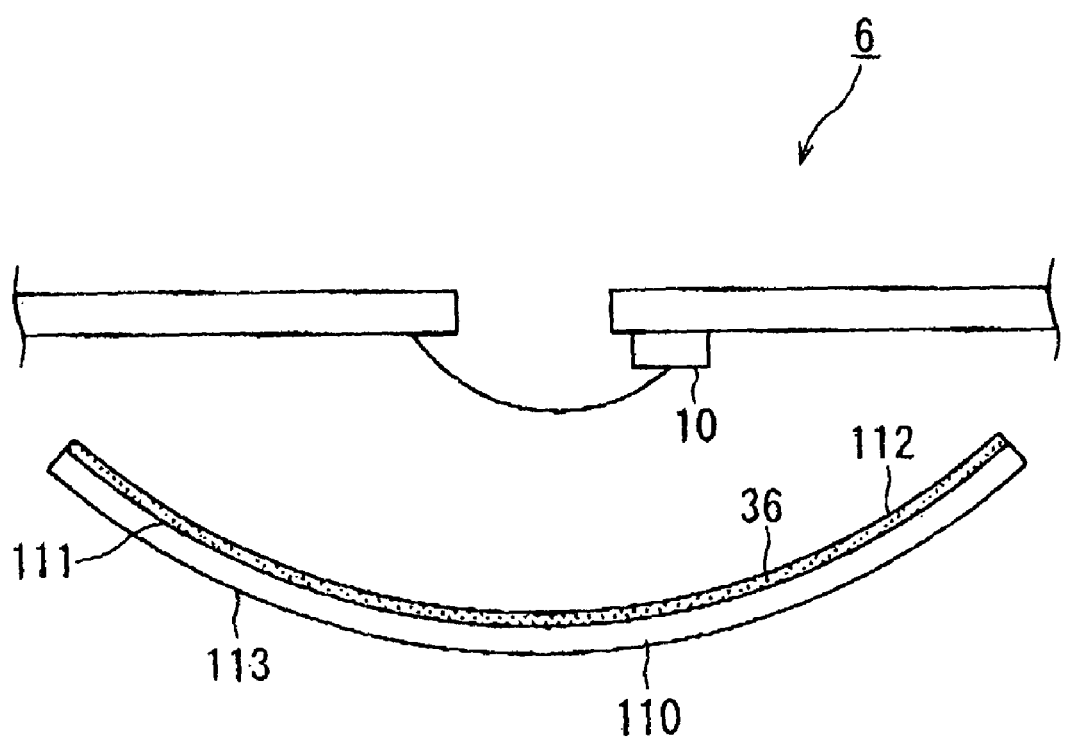
FIG. 14 is a cross sectional view showing a reflection-type LED 6 as a light emitting apparatus in a third preferred embodiment according to the invention.

FIG. 14 is a cross sectional view showing a reflection-type LED 6 as a light emitting apparatus in the third preferred embodiment according to the invention. Like components are indicated by same numerals used in the lamp-type LED 1 of the first embodiment.

As shown in FIG. 14, the reflection-type LED 6 has a reflection mirror 110 on concave surface 111 of which phosphor layer 112 is formed. The phosphor layer 112 is of epoxy resin including phosphor 36 and is formed by coating. It may be of light transmitting material such as silicon resin and urea resin, other than epoxy resin and may be formed by vapor deposition, printing etc., other than coating. The phosphor layer may be formed on convex surface 113 of the reflection mirror 110. In this case, the reflection mirror 110 is formed using a light transmitting material and the surface of phosphor layer is mirrored. The mirroring is conducted forming a layer of metal with high reflection efficiency by vapor deposition, plating etc.

In LED 6 thus structured, part of light from the light emitting element 10 is absorbed and wavelength-converted by phosphor 36 in phosphor layer 112 when it is reflected on the reflection mirror 110. Light thus wavelength-converted is mixed with light reflected without being wavelength-converted, and white light is thereby obtained from the entire LED 6. In LED 6, instead of forming the phosphor layer 112, the light emitting element 10 and reflection mirror 110 may be sealed with a light transmitting material including phosphor. Alternatively, LED 6 may use a phosphor glass with a shape of reflection mirror. In this case, convex surface of the reflection mirror is mirrored. The method of mirroring is the same as described above. Furthermore, a light emitting element may be employed that has a phosphor layer as shown in FIG. 7A, 7B, 9A or 9B. In this case, the phosphor layer 112 on the surface of reflection mirror can be omitted.

Fourth Embodiment

Figure 15A:
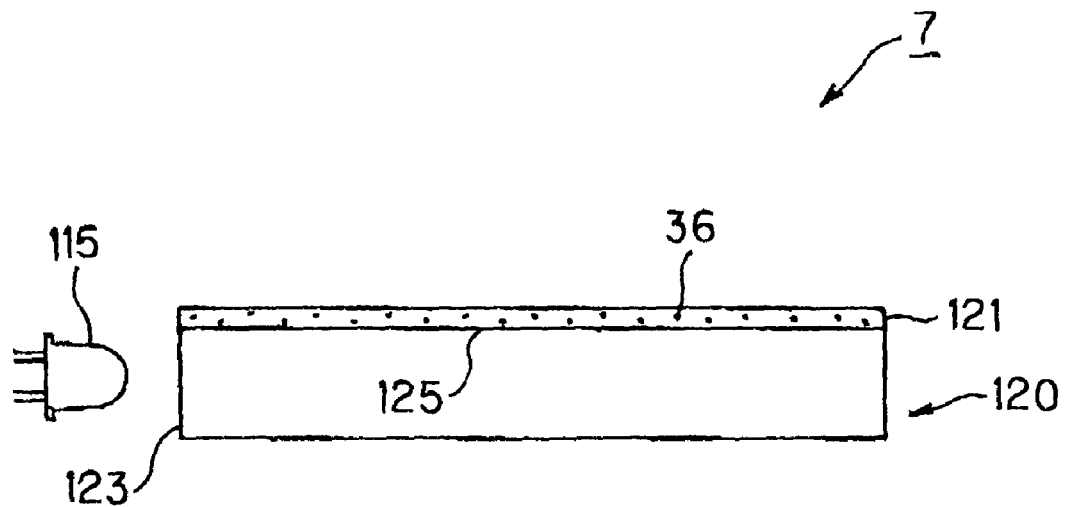
FIG. 15A is a side view showing a planar light source 7 as a light emitting apparatus in a fourth preferred embodiment according to the invention.
Figure 15B:
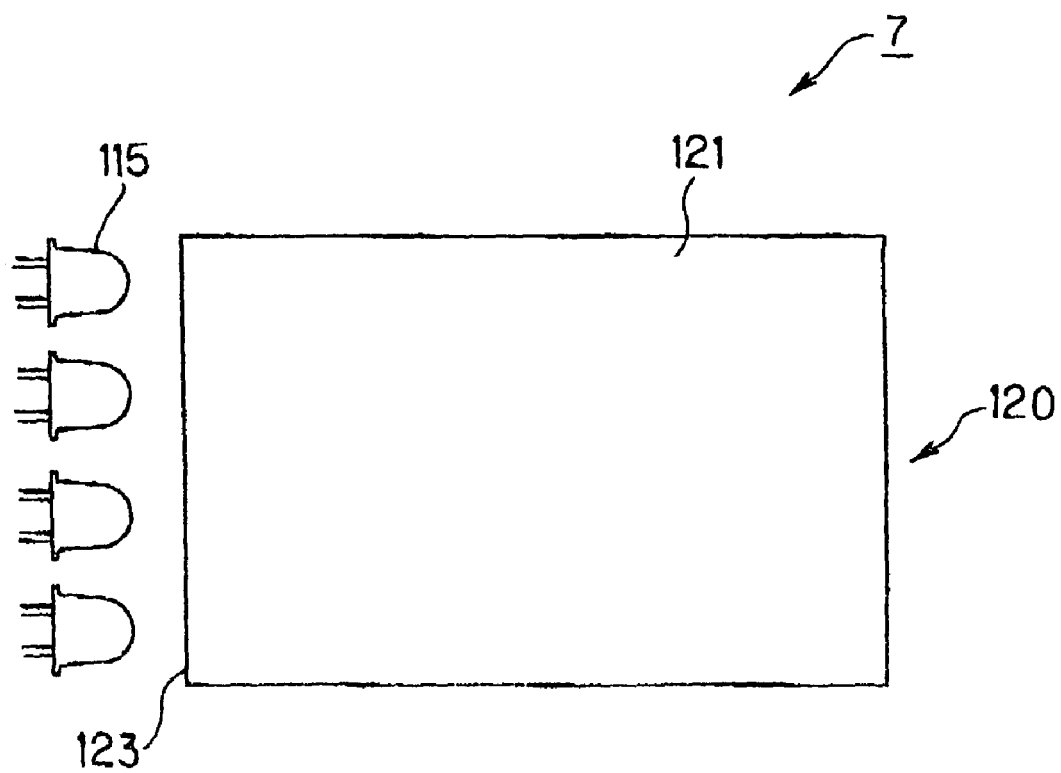
FIG. 15B is a top view (from phosphor layer side) showing the planar light source 7 in FIG. 15A.

FIG. 15A is a side view showing a planar light source 7 as a light emitting apparatus in the fourth preferred embodiment according to the invention. FIG. 15B is a top view (from phosphor layer side) showing the planar light source 7 in FIG. 15A.

The planar light source 7 can be used as a LCD backlight for personal computer, cellular phone, PDA etc. The planar light source 7 is composed of a plurality of LED's 115, a light guiding plate 120 and phosphor layer 121.

Figure 16:
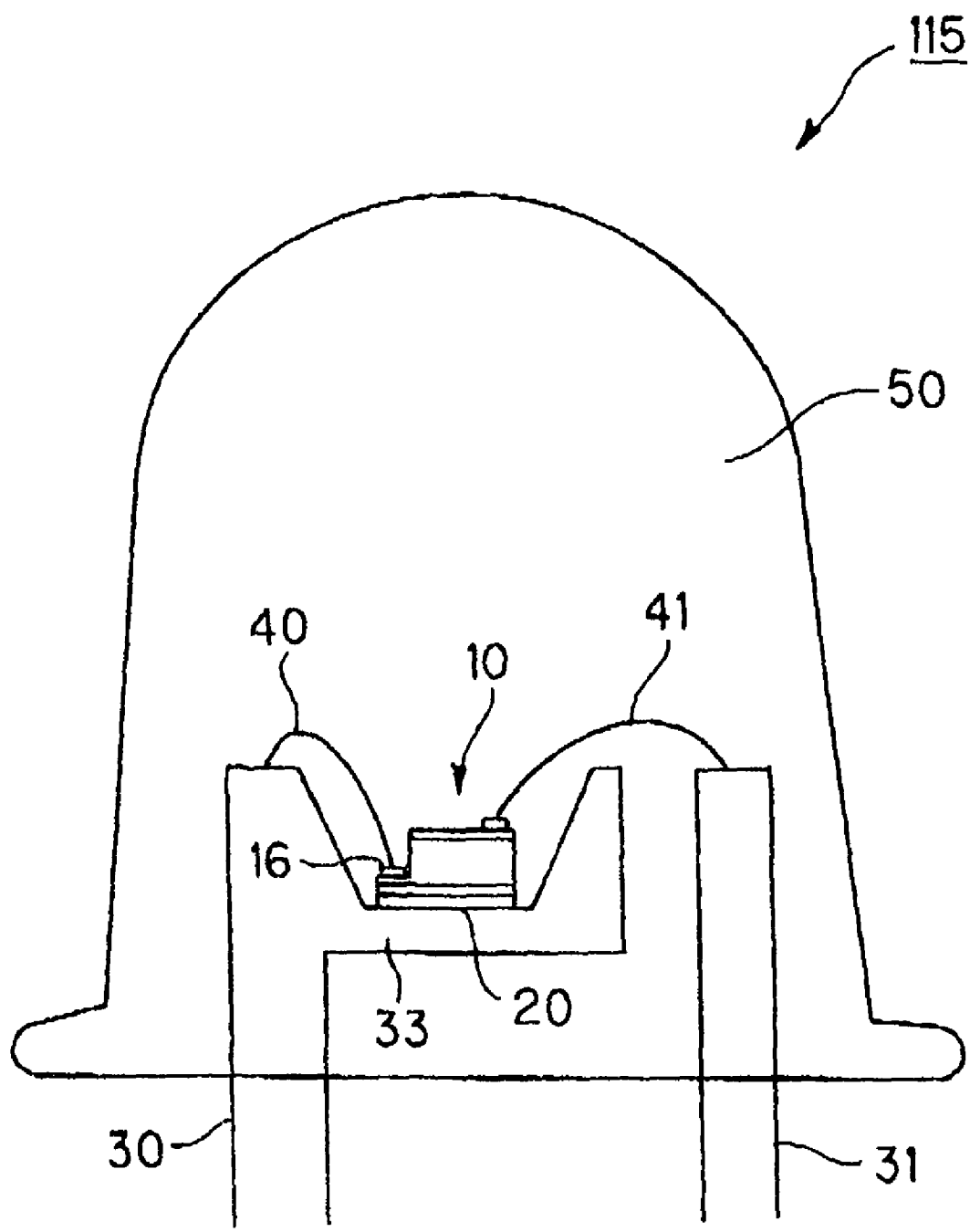
FIG. 16 is an illustration showing LED 115 used in the planar light source 7 shown in FIG. 15A.

FIG. 16 is an illustration showing LED 115 used in the planar light source 7 shown in FIG. 15A.

LED 115 emits blue system light and is structured such that the light emitting element 10 of the first embodiment is mounted on the lead frame and is sealed with epoxy resin of a given shape. The structure of light emitting element 10 is the same as described in the first embodiment.

As shown in FIG. 15A, LED 115 is disposed facing a light introducing surface 123 of the light guiding plate 120. The number of LED's 115 used is not limited to that shown in FIG. 15B. Although in this embodiment the lamp-type LED 115 is used, another type (e.g., chip type) of LED may be used. Further, the type of light emitting element is not limited to that shown in FIG. 16. For example, a planar type Zener light emitting element can be used.

The light guiding plate 120 of light transmitting material is provided with the light introducing surface 123 and light emitting surface 125. Although in this embodiment the light transmitting material is methacrylic resin, the other light transmitting material such as polycarbonate may be used. The light guiding plate 120 may include a light diffusion agent. It is preferred that surfaces except for the light introducing surface 123 and light emitting surface 125 are covered with reflection film or layer to prevent a light leakage from the light guiding plate 120. The surfaces except for the light introducing surface 123 and light emitting surface 125 may be roughened to have a reflective surface.

The roughening is conducted by etching, sandblast, electric discharge machining etc. In stead of roughening, the reflection layer may be formed by white printing or white tape bonding. It is preferred that the reflection layer has a low density region near LED 115 and its density increases continuously or stepwise according as departing from LED 115. Thereby, at a far region from LED 115, high efficiency reflection and diffusion of light can be offered. As a result, emission light is made to radiate uniformly from the entire light emitting surface 125, regardless of the distance from LED 115.

Although in this embodiment one side is used as the light introducing surface 123, a plurality of light introducing surfaces may be provided. Namely, LED's 115 are disposed facing the plurality of light introducing surfaces to introduce light from there. With such a structure, the amount of planar light radiated can be increased. Also, light can be radiated from the light emitting surface with a wider area. Further, the amount of light radiated can be uniformed over the entire light emitting surface.

The phosphor layer 121 is of epoxy resin with phosphor 36 and light diffusion agent dispersed therein. It is formed on the light emitting surface 125 of light guiding plate 120. It may be of methacrylic resin, polycarbonate resin etc. other than epoxy resin. The light diffusion agent may be titanium oxide, titanium nitride, tantalum nitride, aluminum oxide, silicon oxide, barium titanate etc.

Although in this embodiment the phosphor layer 121 is formed directly on the light emitting surface 125, a space or transparent material layer may be provided between the light emitting surface 125 and phosphor layer 121. The light guiding plate 120 and/or phosphor layer 121 may include a coloring agent for color correction. Further, like phosphor layer 121, the light guiding plate 120 may include a light diffusion agent such as titanium oxide, titanium nitride, tantalum nitride, aluminum oxide, silicon oxide, barium titanate etc.

In the planar light source 7 thus structured, blue light emitted from LED 115 is introduced from the light introducing surface 123 into the light guiding plate 120. Then, light advancing through the light guiding plate 120 and is radiated from the light emitting surface 125. Part of radiated light is absorbed and wavelength-converted by phosphor 36 in the phosphor layer 121. Light thus wavelength-converted is mixed with blue light not wavelength-converted by phosphor 36 and white system planar light is radiated from the phosphor layer 121. Since the phosphor layer 121 includes dispersed light diffusion agent, the mixing of light in phosphor layer 121 can be promoted to uniform the distribution of light.

Instead of phosphor layer 121, a phosphor plate may be used that includes rare-earth element doped oxide nitride phosphor or cerium ion doped lanthanum silicon nitride phosphor, described earlier. Namely, plate-shaped phosphor glass is disposed on the light guiding plate 120. The phosphor glass may be bonded through light transmitting adhesive to the light guiding plate 120. A light transmitting sheet (e.g., PET film) may be disposed between them.

Further, the phosphor layer 121 can be omitted when phosphor is dispersed in the light guiding plate 120. Also, the phosphor layer 121 can be omitted when plate-shaped phosphor glass is used instead of the light guiding plate 120.

By using another LED with a different wavelength from that of LED 115, white light with different color tone can be radiated. Together with LED 115, another LED with a different wavelength can be used. By controlling the turn-on and turn-off of these LED's, correction and adjustment of emission color can be performed. Thus, the planar light source can radiate light with various colors.

Fifth Embodiment

Figure 17A:
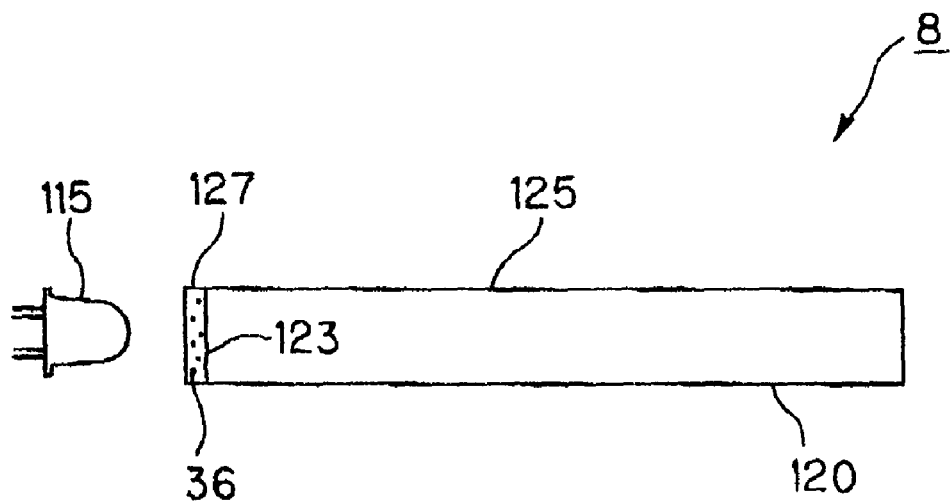
FIG. 17A is a side view showing a planar light source 8 as a light emitting apparatus in a fifth preferred embodiment according to the invention.
Figure 17B:
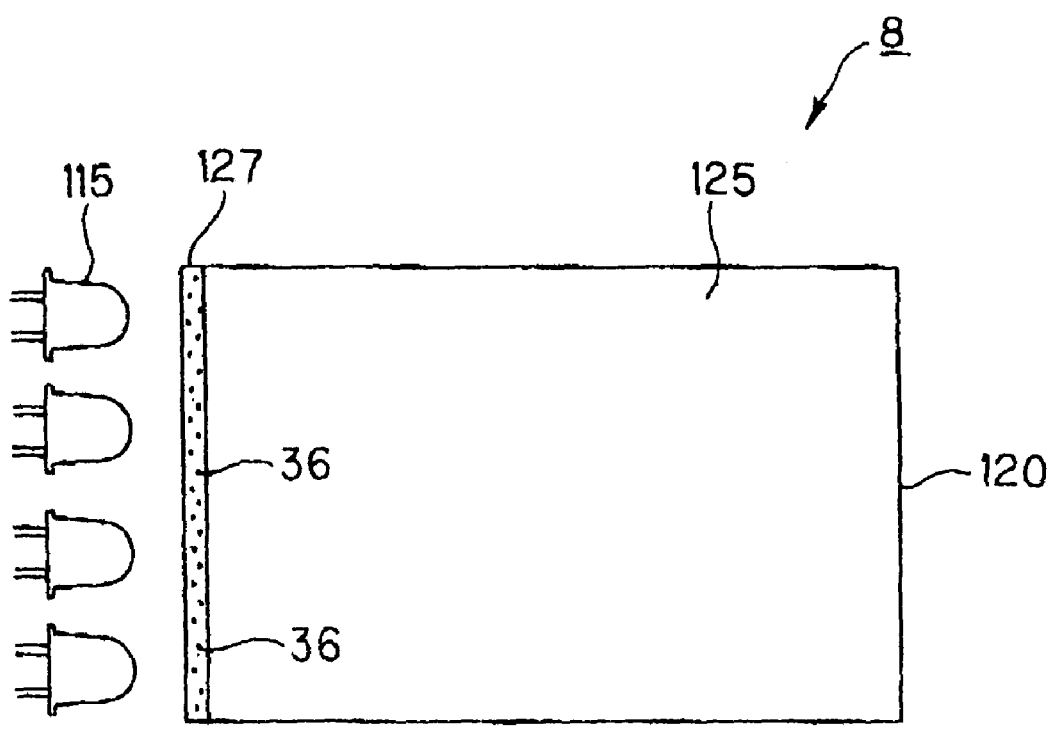
FIG. 17B is a top view (from phosphor layer side) showing the planar light source 8 in FIG. 17B.

FIG. 17A is a side view showing a planar light source 8 as a light emitting apparatus in the fifth preferred embodiment according to the invention. FIG. 17B is a top view (from phosphor layer side) showing the planar light source 8 in FIG. 17B. Like components are indicated by same numerals used in FIGS. 15A and 15B.

The planar light source 8 has phosphor layer 127 provided between LED 115 and the light introducing surface 123 of light guiding plate 120. The phosphor layer 127 has the same composition as the phosphor layer 121 of planar light source 7. Like the planar light source 7, a space or transparent material layer may be provided between the phosphor layer 127 and the light introducing surface 123 of light guiding plate 120.

In the planar light source 8, part of blue light radiated from LED 115 is absorbed and wavelength-converted by phosphor 36 in the phosphor layer 127. Light thus wavelength-converted is mixed with light not wavelength-converted by phosphor, and then it is introduced from light introducing surface 123 into the light guiding plate 120. Light advancing through the light guiding plate 120 is finally radiated from the light emitting surface 125 to the outside as white system planar light. Meanwhile, the mixing of light is also conducted in the light guiding plate 120.

Sixth Embodiment

Figure 18:
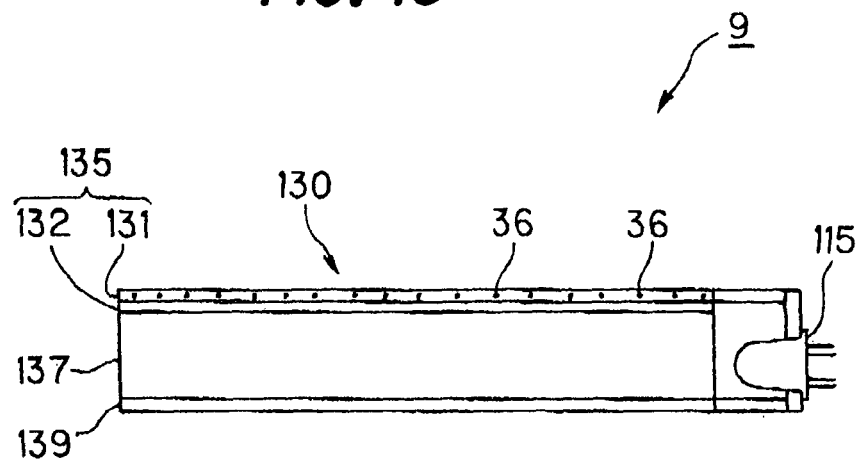
FIG. 18 is a side view showing a planar light source 9 using color conversion filter 130 as a light emitting apparatus in a sixth preferred embodiment according to the invention.

FIG. 18 is a side view showing a planar light source 9 using color conversion filter 130 as a light emitting apparatus in the sixth preferred embodiment according to the invention.

The planar light source 9 uses the color conversion filter 130, which is composed of a color conversion sheet 135 and a light guiding layer 137. The color conversion sheet 135 is composed of a transparent sheet 132 of light transmitting resin provided on the light guiding layer 137 and a phosphor layer 131 formed on the transparent sheet 132.

The phosphor layer 131 is of transparent base material, such as epoxy resin, silicon resin and urea resin, with phosphor 36 dispersed therein. The transparent sheet 132 is of PET. It is preferred that the phosphor layer 131 has fine uneven profiles on its surface. They serve to familiarize the surface of color conversion sheet 135 (surface of phosphor layer 131) with glass etc. provided on the color conversion 135. Thereby, the occurrence of blur at the interface can be prevented. Also, it is preferred that fine uneven profiles are provided at the bonding surface of transparent sheet 132 to the light guiding layer 137. Thus, by avoiding tight contact between the color conversion sheet 135 and light guiding layer 137, the occurrence of blur at the interface can be prevented.

The light guiding layer 137 is of epoxy resin. It may be of another transparent resin such as silicon resin. The light guiding layer 137 has a reflection film 139 on its lower surface.

Thereby, light leakage from the lower surface of light guiding layer 137 can be prevented. The material of reflection layer 139 is not limited to this. It is preferred that like reflection layers are provided at side faces except for a face facing LED 115. Thereby, light leakage from the side faces can be prevented. The reflection layer 139 may be omitted.

LED 115 is placed facing the side face of color conversion filter 130. LED 115 may be placed facing the lower surface of color conversion filter 130. In this case, the reflection layer 139 is not provided on the lower surface of light guiding layer 137.

The light radiation mode of planar light source 9 thus structured is as follows. Light from LED 115 is introduced through the side face of light guiding layer 137 and is taken out from the surface of color conversion sheet 135. Part of light thus transmitted is wavelength-converted by phosphor 36 when it passes through the phosphor layer 131. Light thus wavelength-converted is mixed with light not wavelength-converted by phosphor 36, white light is radiated from the entire surface of color conversion sheet 135.

By using another LED with a different wavelength from that of LED 115, white light with different color tone can be radiated. Together with LED 115, another LED with a different wavelength can be used. By controlling the turn-on and turn-off of these LED's, correction and adjustment of emission color can be performed. Thus, the planar light source can radiate light with various colors.

Seventh Embodiment

Figure 19:
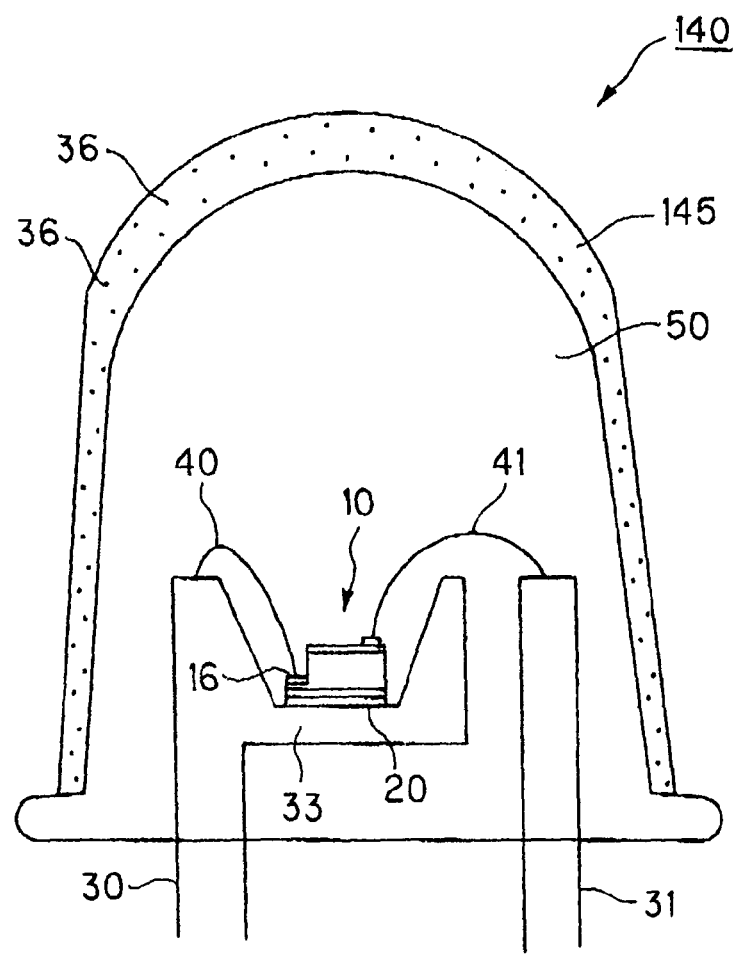
FIG. 19 is an illustration showing a cap-type LED 140 as a light emitting apparatus in a seventh preferred embodiment according to the invention.

FIG. 19 is an illustration showing a cap-type LED 140 as a light emitting apparatus in the seventh preferred embodiment according to the invention.

LED 140 has a cap 145 that is of light transmitting resin with phosphor 36 dispersed therein and is formed on the surface of sealing resin 50 in LED 115 of the fourth embodiment. The cap 145 is previously formed the light transmitting resin including phosphor 36 into a cap shape, and then it is mounted on the sealing resin 50. Alternatively, it may be formed on the sealing resin 50 by molding after forming the sealing resin 50. Although in this embodiment the cap 145 is of epoxy resin, it may be of thermosetting resin such as urea resin, thermoplastic resin such as polyethylene etc. The cap 145 may include a diffusion agent such as titanium oxide, titanium nitride, tantalum nitride, aluminum oxide, silicon oxide and barium titanate.

In LED 140 thus structured, part of light radiated from light emitting element 10 is absorbed and wavelength-converted by phosphor 36 in the cap 145. Light thus wavelength-converted is mixed with light not wavelength-converted by phosphor 36 and is finally radiated from the surface of cap 145 to the outside as white system planar light.

Eighth Embodiment

Figure 20:
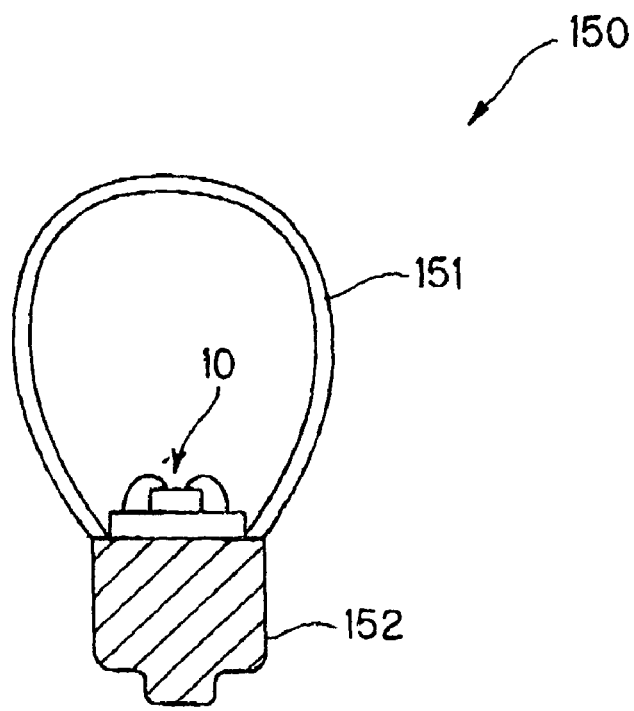
FIG. 20 is an illustration showing a bulb-type light source 150 as a light emitting apparatus in an eighth preferred embodiment according to the invention.

FIG. 20 is an illustration showing a bulb-type light source 150 as a light emitting apparatus in the eighth preferred embodiment according to the invention.

The light source 150 is composed of light emitting element 10, phosphor glass 151 and casing 152. The light emitting element 10 is supplied with current through the casing 152. The phosphor glass 151, which is of rare-earth element doped oxide nitride phosphor or cerium ion doped lanthanum silicon nitride phosphor, is shaped nearly a hollow globe.

In the light source 150 thus structured, part of light radiated from light emitting element 10 is absorbed and wavelength-converted by phosphor in the phosphor glass 151. Light thus wavelength-converted is mixed with light not wavelength-converted by phosphor and is finally radiated from the surface of phosphor glass 151 to the outside as white system planar light. The phosphor glass may include a coloring agent and/or light diffusion agent.

Figure 21:
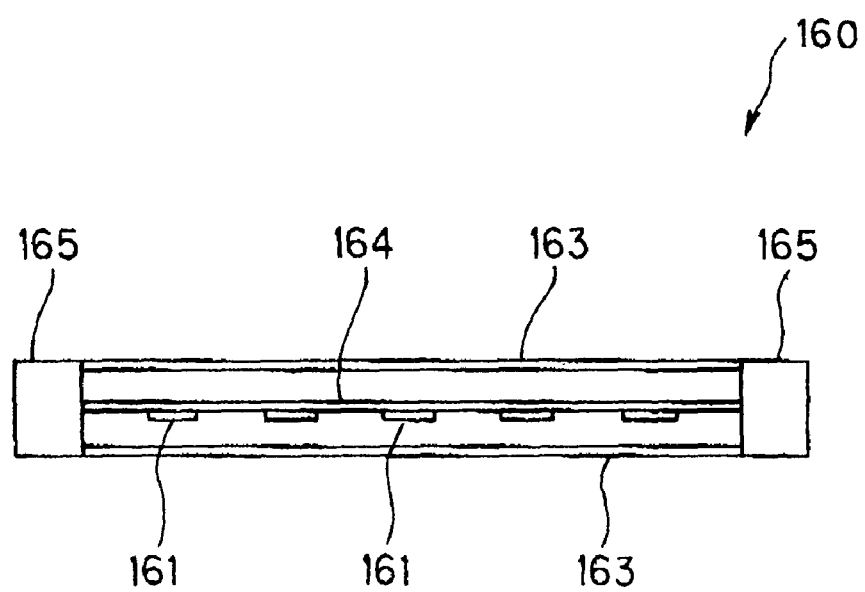
FIG. 21 is an illustration showing a fluorescent light type light source 160 as a light emitting apparatus in the eighth preferred embodiment according to the invention.

FIG. 21 is an illustration showing a fluorescent light type light source 160 as a light emitting apparatus in the eighth preferred embodiment according to the invention.

The light source 160 is composed of a plurality of chip-type LED's 161, tubular phosphor glass 163 and casings 165. Each LED 161 is mounted on a substrate 164 and is supplied with current through the casings 165. The phosphor glass 163 is the same as the phosphor glass 151 except for its shape.

In the light source 160 thus structured, part of light radiated from LED's 161 is absorbed and wavelength-converted by phosphor in the phosphor glass 163. Light thus wavelength-converted is mixed with light not wavelength-converted by phosphor and is finally radiated from the surface of phosphor glass 163 to the outside as white system planar light.

LED 161 can emit light with an emission wavelength in the range of 360 to 550 nm. For example, by using LED 161 with a emission wavelength of 480 nm, white light can be obtained. A lamp-type LED 1 may be used instead of LED 161. Furthermore, together with LED 161, another LED may be used that allows phosphor not to be excited.

Figure 22:
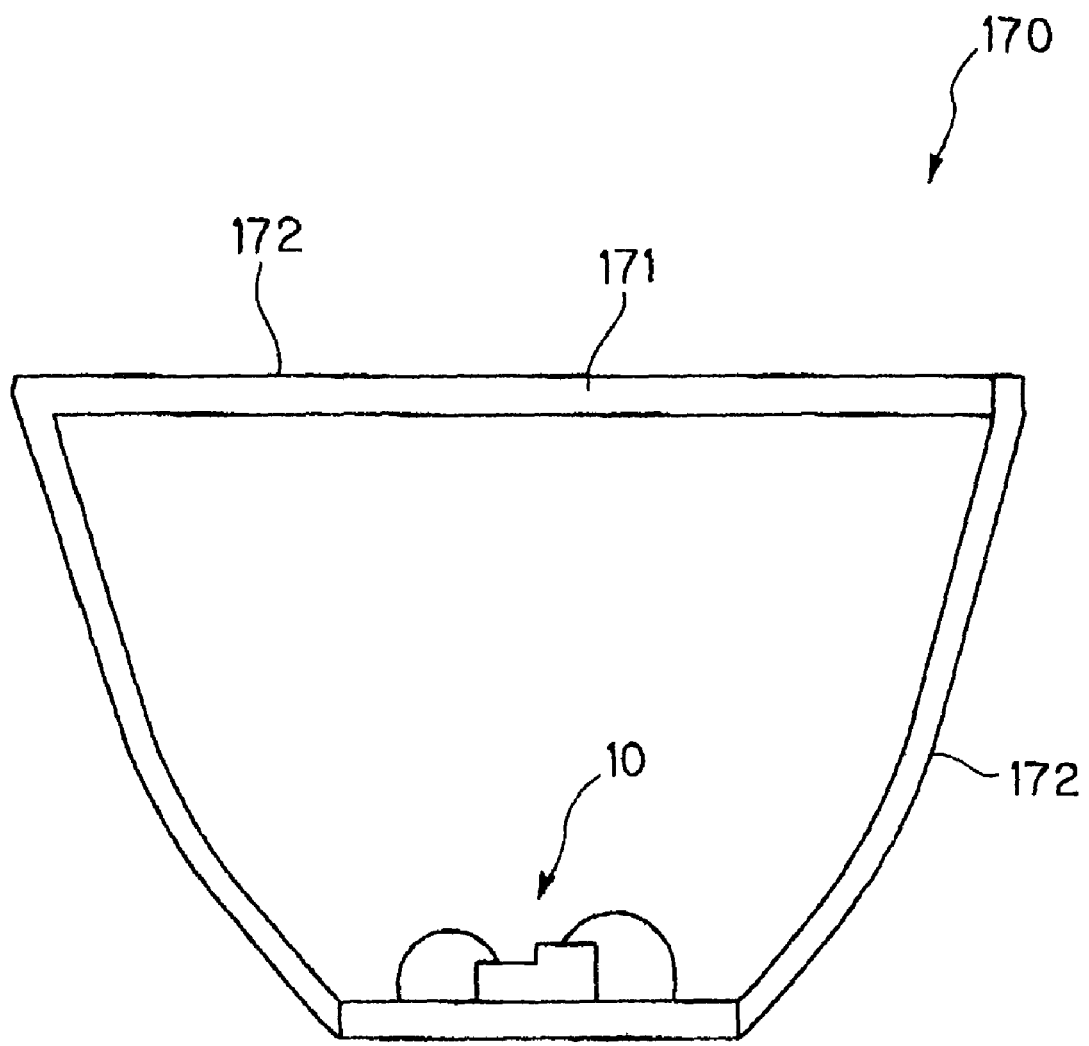
FIG. 22 is an illustration showing a cathode-ray tube type light source 170 as a light emitting apparatus in the eighth preferred embodiment according to the invention.

FIG. 22 is an illustration showing a cathode-ray tube type light source 170 as a light emitting apparatus in the eighth preferred embodiment according to the invention.

The light source 170 is composed of light emitting element 10, phosphor plate 171 and casing 172 which is of light non-transmitting material. The phosphor plate 171 is made by forming phosphor glass, which includes rare-earth element doped oxide nitride phosphor or cerium ion doped lanthanum silicon nitride phosphor, into plate shape.

In the light source 170 thus structured, part of light radiated from the light emitting element 10 is absorbed and wavelength-converted by phosphor in the phosphor plate 171. Light thus wavelength-converted is mixed with light not wavelength-converted by phosphor and is finally radiated from the surface of phosphor plate 171 to the outside as white system planar light.

Figure 23:
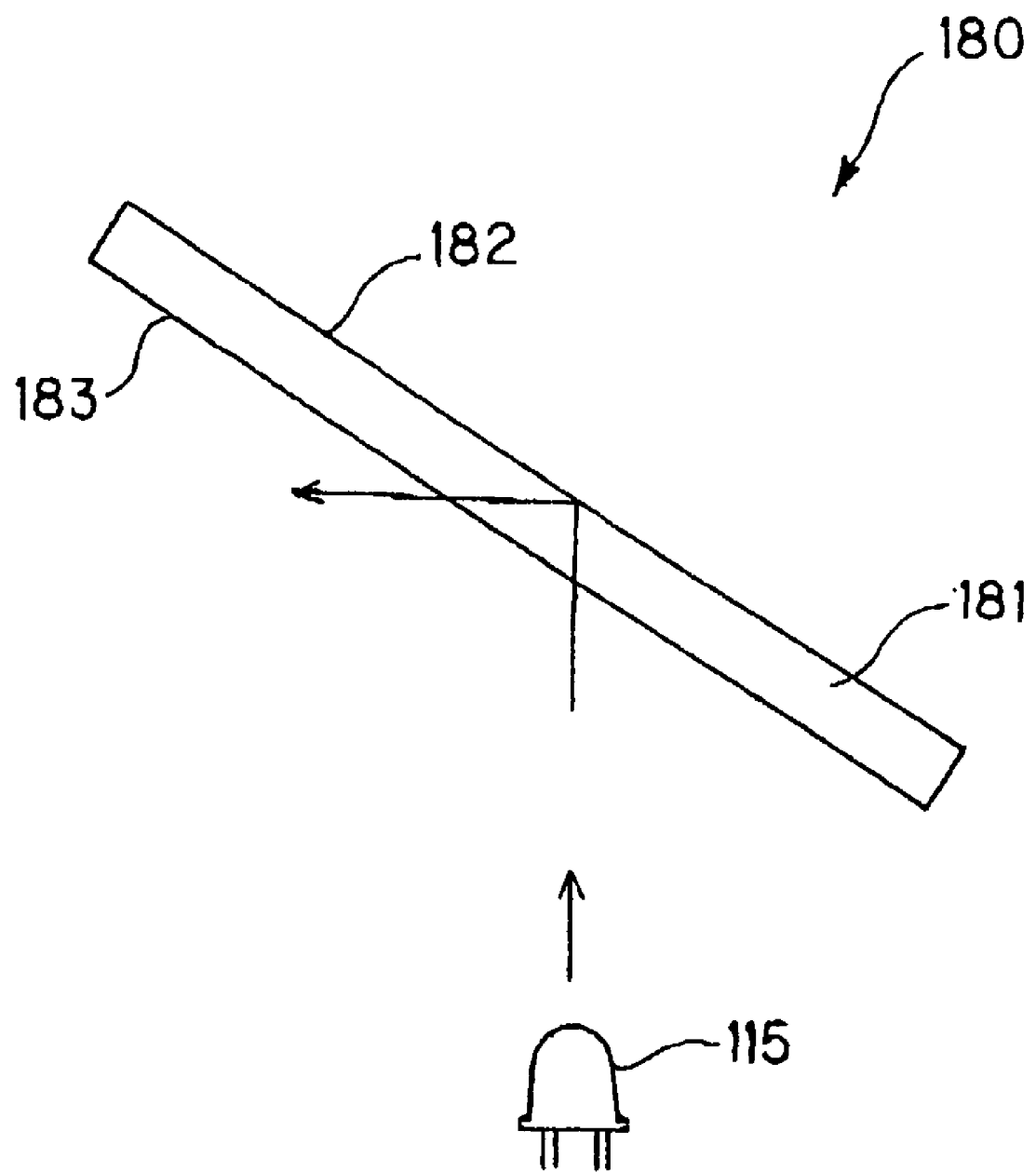
FIG. 23 is an illustration showing a projector type light source 180 as a light emitting apparatus in the eighth preferred embodiment according to the invention.

FIG. 23 is an illustration showing a projector type light source 180 as a light emitting apparatus in the eighth preferred embodiment according to the invention.

The light source 180 is composed of LED 115 and reflection plate 181. The reflection plate 181 is disposed at a given inclination angle to the optical axis of LED 115. In this embodiment, the reflection plate 181 is of phosphor glass which includes rare-earth element doped oxide nitride phosphor or cerium ion doped lanthanum silicon nitride phosphor. Alternatively, the reflection plate 181 may be of light transmitting material (e.g., acrylic resin) and a layer including rare-earth element doped oxide nitride phosphor or cerium ion doped lanthanum silicon nitride phosphor may be formed on the surface of reflection plate 181 to face LED 115. One surface 182 of reflection plate 181 is mirrored. The mirroring is conducted forming a layer of metal with high reflection efficiency by vapor deposition, plating etc.

In the light source 180 thus structured, part of light radiated from LED 115 is reflected on the reflection surface 182 of reflection plate 181 in a given direction. At that time, part of incident light to the reflection plate 181 is absorbed and wavelength-converted by phosphor in the reflection plate 181. Light thus wavelength-converted is mixed with light not wavelength-converted by phosphor and is finally radiated from light emitting surface 183 of reflection plate 181 to the outside as white system planar light.

Figure 24:
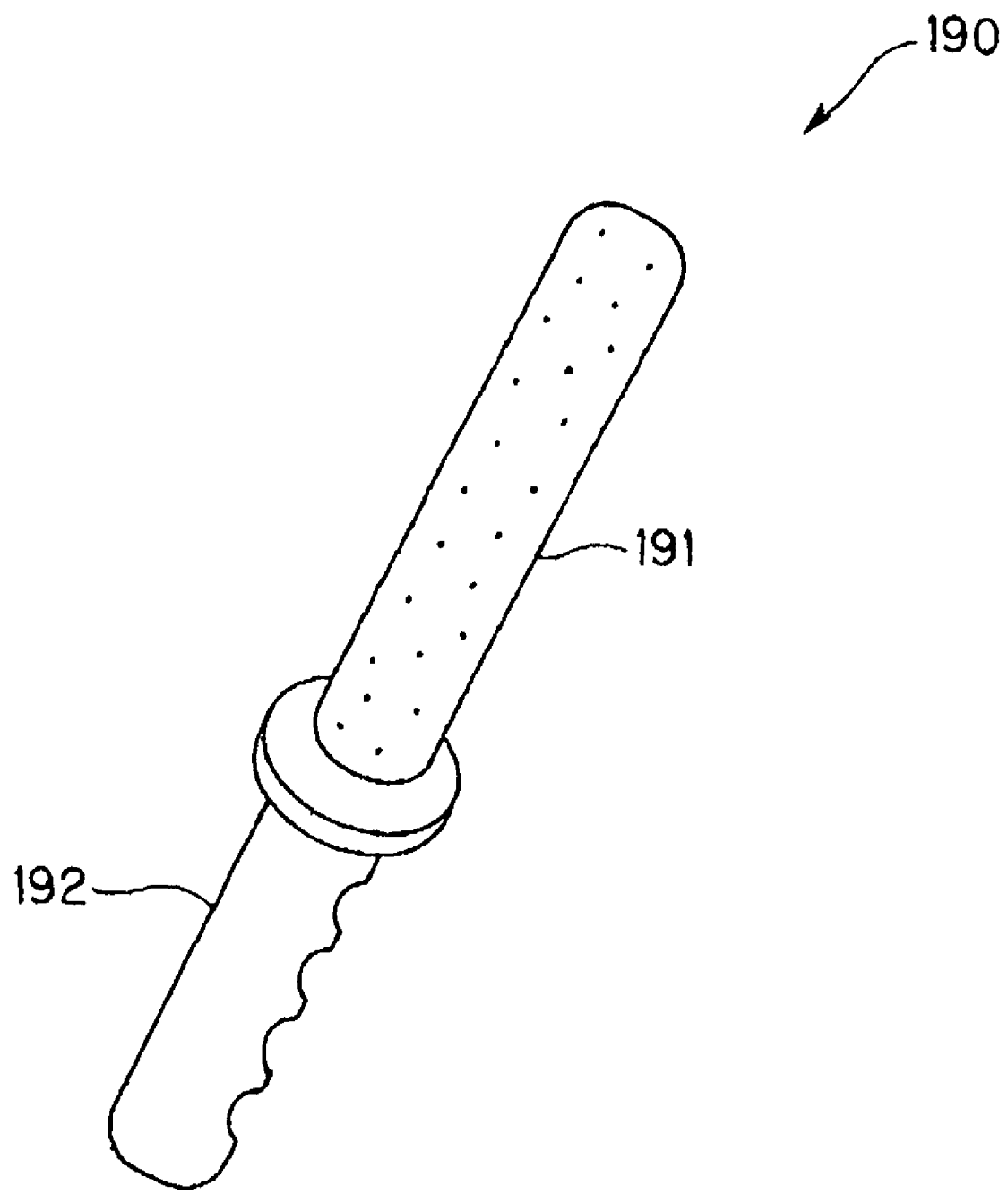
FIG. 24 is a perspective view showing a lighting apparatus 190 in the eighth preferred embodiment according to the invention.

FIG. 24 is a perspective view showing a lighting apparatus 190 in the eighth preferred embodiment according to the invention.

The lighting apparatus 190 is composed of light emitting portion 191, grip 192 and LED (not shown) built in the grip 192. The light emitting portion 191 is made forming acrylic resin with phosphor 36 dispersed therein into a tubular shape. The built-in LED is composed of red LED and blue LED, which are connected to control circuit and power source (not shown).

When the red LED turns on, its light is directly radiated from the surface of light emitting portion 191. Namely, the light emitting portion emits red light. On the other, when the blue LED turns on, part of light emitted is wavelength-converted by phosphor 36 in the light emitting portion 191. Light thus wavelength-converted is mixed with light not wavelength-converted by phosphor 36 and is finally radiated from the surface of light emitting portion 191. Namely, the light emitting portion emits white light. Accordingly, when each LED turns on alternately, it can emit red light and white light alternately.

Figure 25A:
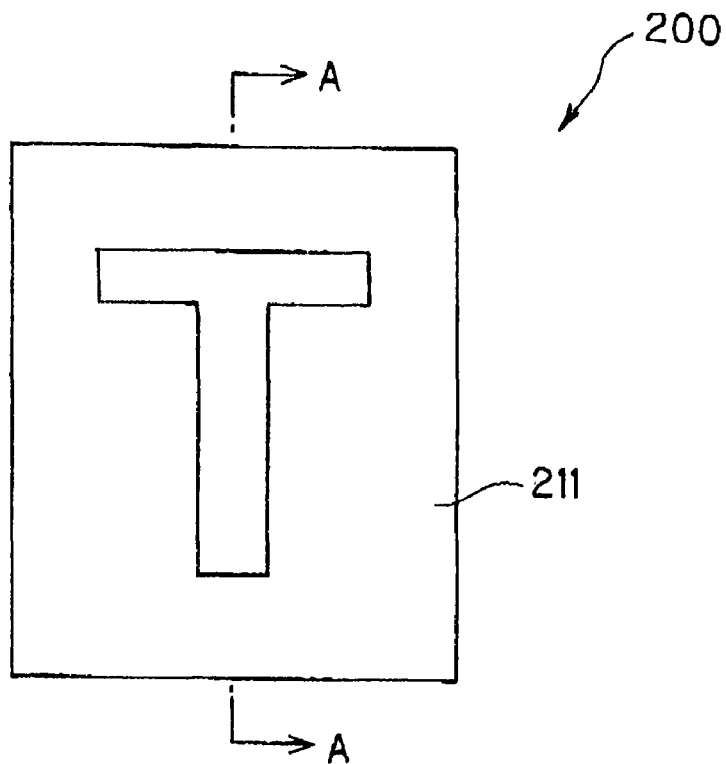
FIG. 25A is a front view showing a display 200 in the eighth preferred embodiment according to the invention.
Figure 25B:
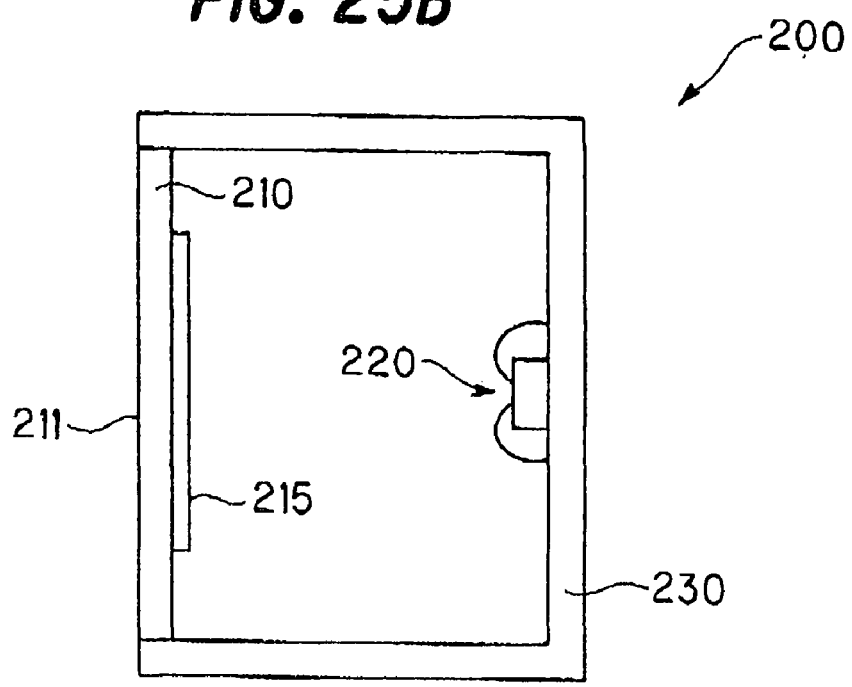
FIG. 25B is a cross sectional view cut along the line A-A in FIG. 25A.
Figure 26:
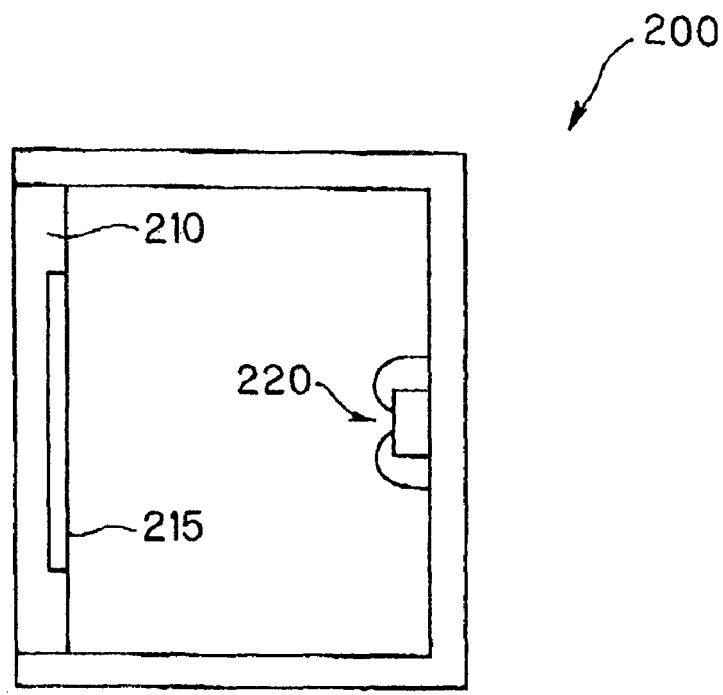
FIG. 26 is a cross sectional view showing a modification of the display 200 cut along the line A-A in FIG. 25A.

FIG. 25A is a front view showing a display 200 in the eighth preferred embodiment according to the invention. FIG. 25B is a cross-sectional view cut along the line A-A in FIG. 25A. FIG. 26 is a cross sectional view showing a modification of the display 200 cut along the line A-A in FIG. 25A.

The display 200 is composed of displaying portion 210, LED 220 and housing 230.

The displaying portion 210 is of light transmitting material (e.g., acrylic resin) and has phosphor layer 215 to form a given character, figure etc. on its back surface. The phosphor layer 215 is formed by coating light transmitting material with phosphor 36 dispersed therein. Alternatively, the phosphor layer 215 may be of phosphor glass including rare-earth element doped oxide nitride phosphor or cerium ion doped lanthanum silicon nitride phosphor. As shown in FIG. 26, the phosphor layer 215 may be embedded in the displaying portion 210. LED 220 emits blue system light.

In the display 200, part of light entering the phosphor layer 215 is wavelength-converted by phosphor 36 in the phosphor layer 215. Light thus wavelength-converted is mixed with light not wavelength-converted by phosphor 36 and is radiated from displaying surface 211 corresponding to the phosphor layer 215. Namely, the displaying surface 211 corresponding to the phosphor layer 215 emits white light. The other region of displaying surface 211 allows light from LED 220 (blue) to directly pass through without being wavelength-converted. Namely, blue light is radiated from there. Thus, a region of displaying surface 211 corresponding to a given character, figure etc. is displayed in white, and the other region is displayed in blue.

Ninth Embodiment

Figure 27:
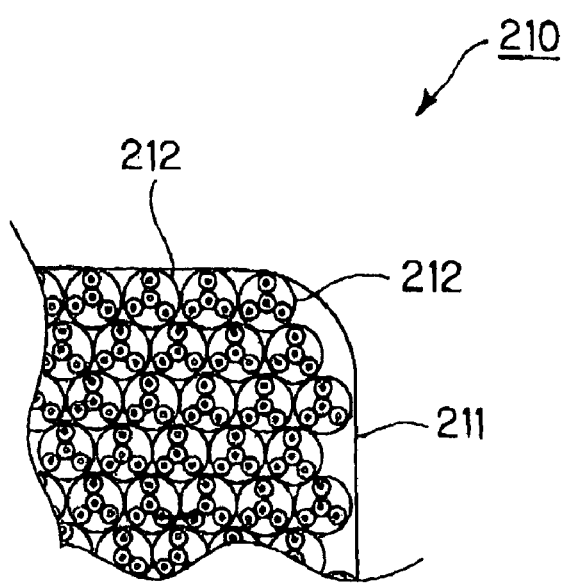
FIG. 27 is an enlarged partial front view showing a display 210 using LED 1 in a ninth preferred embodiment according to the invention.
Figure 28:
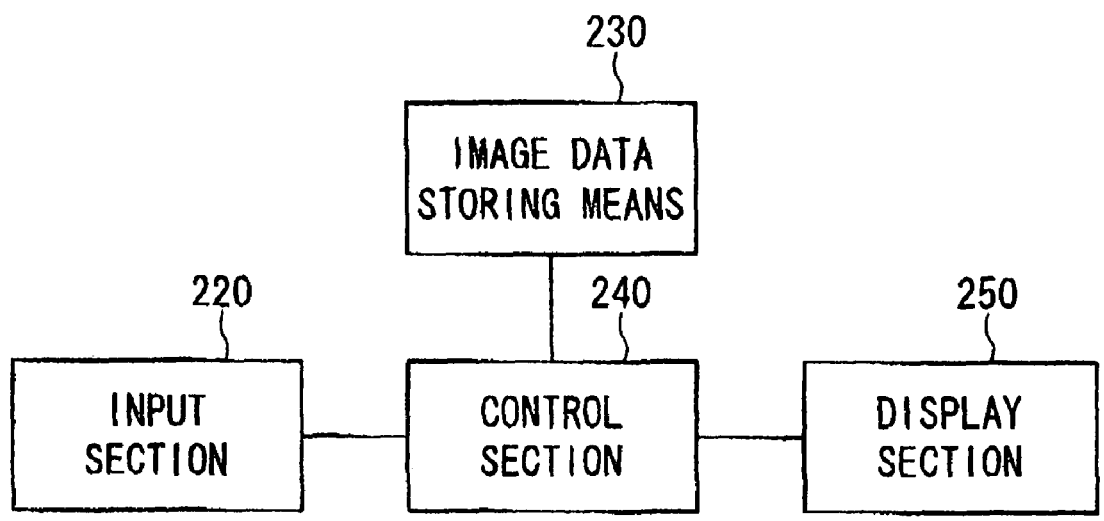
FIG. 28 is a block diagram showing a displaying circuit used in the display 210.

FIG. 27 is an enlarged partial front view showing a display 210 using LED 1 in the ninth preferred embodiment according to the invention. FIG. 28 is a block diagram showing a displaying circuit used in the display 210.

The display 210 is composed combining white LED 1 (hereinafter referred to as W-LED) of the first embodiment and LED's of RGB (red, green and blue). The display 210 can be applied to a full color LED display etc. The display 210 is provided with displaying portion 211 of nearly rectangular shape. The displaying portion 211 includes a plurality of LED units 212, arranged in matrix, each of which is composed of LED's of RGB and W-LED. The arrangement of LED in each LED unit 212 can be selected arbitrarily.

The displaying method of display 210 is explained below, referring to FIG. 28. Image data inputted to input section 220 is temporarily stored in image data storing means 230. Control section 240 includes pattern selection circuit, brightness modulation circuit and blinking circuit (not shown). It outputs control signal to control the turn-on of LED units 212 according to image data stored in the image data storing means 230. Each LED unit 212 radiates light with brightness and color according to that control signal. Thus, display section 250 can display a desired image with specific brightness and color.

Although in the display 210 each LED unit 212 is composed of RGB-LED's and W-LED, it may be composed of only W-LED. In this case, by arranging such LED's 212 in matrix, arbitrary image can be displayed using white (W-LED turned on) and black (W-LED turned off). Even in this case, the brightness of each LED unit can be controlled stepwise. Therefore, it can be applied to a monochrome LED display.

Tenth Embodiment

Figure 29:
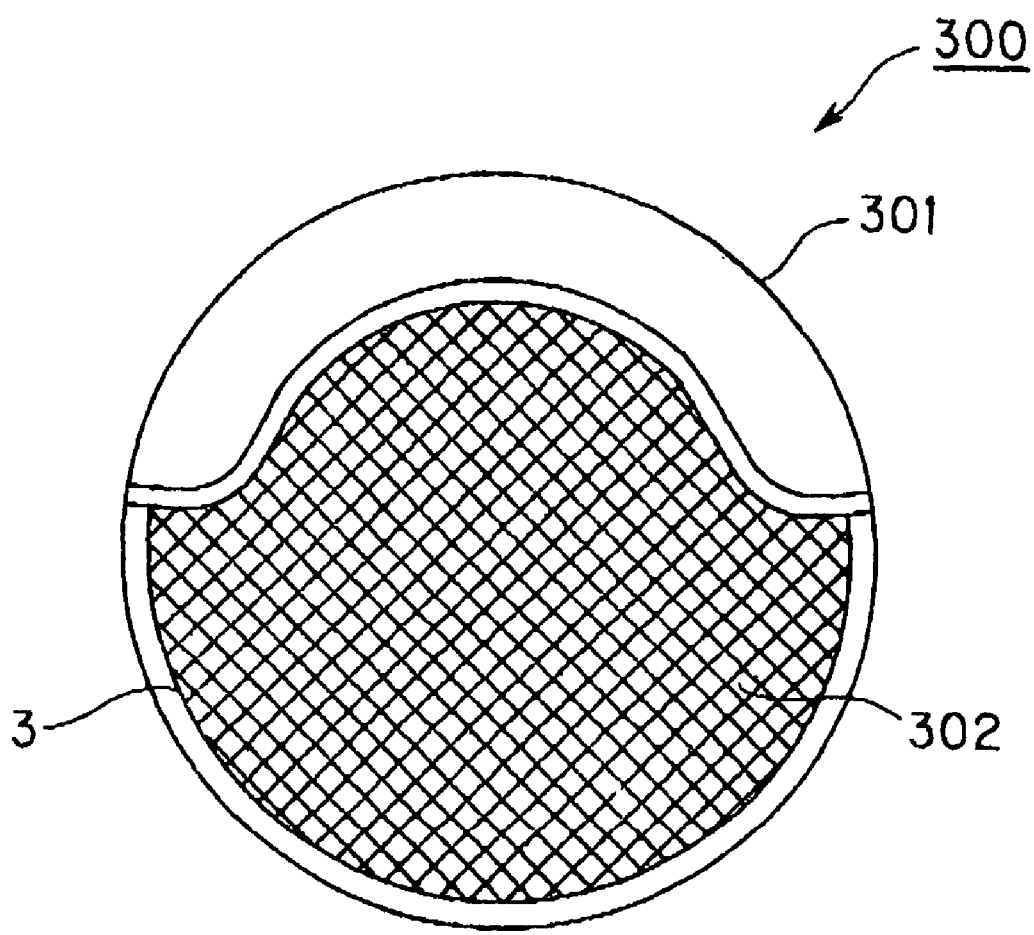
FIG. 29 is a front view showing a vehicle traffic light 300 using the chip-type LED 2 in a tenth preferred embodiment according to the invention.

FIG. 29 is a front view showing a vehicle traffic light 300 using the chip-type LED 2 in the tenth preferred embodiment according to the invention.

The traffic light 300 has displaying portion 302 in which a plurality of chip-type LED's 2 are arranged in matrix. 301 is housing. A colored transparent cover (not shown) is provided on the surface of displaying portion 302. Each LED 2 turns on by control of control means (not shown) to emit white light, which is recognized being colored when transmitting through the colored transparent cover.

Alternatively, a colorless and transparent cover may be used to offer a traffic light to emit white light. LED's 2 are supplied with current by connecting LED's 2 in parallel or in series. In case of connecting in series, LED's 2 may be divided into groups in order to supply current to each group. For example, each group of LED's is arranged in the form of concentric circle. Thereby, the entire displaying portion 302 can form a circular LED display. Each group can be separately controlled of its turn-on state.

By arranging the chip-type LED's 2 in matrix to form a light source, the entire displaying portion can have uniform brightness. Therefore, as compared to conventional electric bulbs, unevenness in brightness can be prevented. By separately controlling the turn-on of each group, different portions in brightness can be displayed. The pattern and density in arrangement of chip-type LED's 2 can be arbitrarily selected according to use.

EXAMPLES

Examples of phosphor 36 used in the invention are described below.

Example 1

Preparation of Single-phase α-sialon Phosphor

Examples (1-1) to (1-2) relate to preparation of single-phase α-sialon phosphor.

Example (1-1)

In preparing single-phase α-sialon phosphor, a ball mill apparatus (Fliche, planetary mill) is used to mix eight raw powers below. The mole ratio of chemical reagents in raw power is described below (1) to (8).

(1) Ca-α-sialon ($Ca_{0.75}Si_{9.75}Al_{2.25}N_{15.25}O_{0.75}$)
   silicon nitride ($Si_3N_4$): aluminum nitride (AlN): calcium oxide (CaO)=13:9:3
(2) Eu-α-sialon ($Eu_{0.5}Si_{9.75}Al_{2.25}N_{15.25}O_{0.75}$)
   silicon nitride ($Si_3N_4$): aluminum nitride (AlN):europium oxide ($Eu_2O_3$)=13:9:1
(3) Pr-α-sialon ($Pr_{0.6}Si_{9.75}Al_{2.25}N_{15.25}O_{0.75}$)
   silicon nitride ($Si_3N_4$): aluminum nitride (AlN): praseodymium oxide ($Pr_6O_{11}$)=30:27:1
(4) Tb-α-sialon ($Tb_{0.5}Si_{9.75}Al_{2.25}N_{15.25}O_{0.75}$)
   silicon nitride ($Si_3N_4$): aluminum nitride (AlN): terbium oxide ($Tb_4O_7$)=26:18:1
(5) Dy-α-sialon ($Dy_{0.5}Si_{9.75}Al_{2.25}N_{15.25}O_{0.75}$)
   silicon nitride ($Si_3N_4$): aluminum nitride (AlN): dysprosium oxide ($Dy_2O_3$)=13:9:1
(6) Y-α-sialon ($Y_{0.5}Si_{9.75}Al_{2.25}N_{15.25}O_{0.75}$)
   silicon nitride ($Si_3N_4$): aluminum nitride (AlN): yttrium oxide ($Y_2O_3$)=13:9:1
(7) Yb-α-sialon ($Yb_{0.5}Si_{9.75}Al_{2.25}N_{15.25}O_{0.75}$)
   silicon nitride ($Si_3N_4$): aluminum nitride (AlN): ytterbium oxide ($Yb_2O_3$)=13:9:1
(8) Er-α-sialon ($Er_{0.5}Si_{9.75}Al_{2.25}N_{15.25}O_{0.75}$)
   silicon nitride ($Si_3N_4$): aluminum nitride (AlN) erbium oxide ($Er_2O_3$)=13:9:1

Then, using the above raw powders (1) and (2), seven $Eu^{2+}$ doped Ca α-sialon phosphors with different doping ratios are prepared as below [1] to [7]. In preparation, the raw powders (1) and (2) are mixed at molar ratios below, then reacted using hot pressing apparatus (Nisshingiken-sha, NEV-HP3) at a pressure of 20 MPa in nitrogen atmosphere (1 atm) of 1700° C. for one hour.

[1] Ca(0% Eu)-α-sialon phosphor ($Ca_{0.75}Si_{9.75}Al_{2.25}N_{15.25}O_{0.75}$) only Ca-α-sialon(1) is used.
[2] Ca(5% Eu)-α-sialon phosphor ($Ca_{0.75}Eu_{0.05}Si_{9.75}Al_{2.25}N_{15.25}O_{0.75}$)
   Ca-α-sialon(1): Eu-α-sialon(2)=95:5
[3] Ca(10% Eu)-α-sialon phosphor ($Ca_{0.60}Eu_{0.10}Si_{9.75}Al_{2.25}N_{15.25}O_{0.75}$)
   Ca-α-sialon(1): Eu-α-sialon(2)=90:10
[4] Ca(20% Eu)-α-sialon phosphor ($Ca_{0.60}Eu_{0.10}Si_{9.75}Al_{2.25}N_{15.25}O_{0.75}$)
   Ca-α-sialon(1): Eu-α-sialon(2)=80:20
[5] Ca(30% Eu)-α-sialon phosphor ($Ca_{0.63}Eu_{0.15}Si_{9.75}Al_{2.25}N_{15.25}O_{0.75}$)
   Ca-α-sialon(1): Eu-α-sialon(2)=70:30
[6] Ca(50% Eu)-α-sialon phosphor ($Ca_{0.38}Eu_{0.25}Si_{9.75}Al_{2.25}N_{15.25}O_{0.75}$)
   Ca-α-sialon(1): Eu-α-sialon(2)=50:50
[7] Ca(70% Eu)-α-sialon phosphor ($Ca_{0.23}Eu_{0.35}Si_{9.75}Al_{2.25}N_{15.25}O_{0.75}$)
   Ca-α-sialon(1): Eu-α-sialon(2)=30:70

Figure 30:
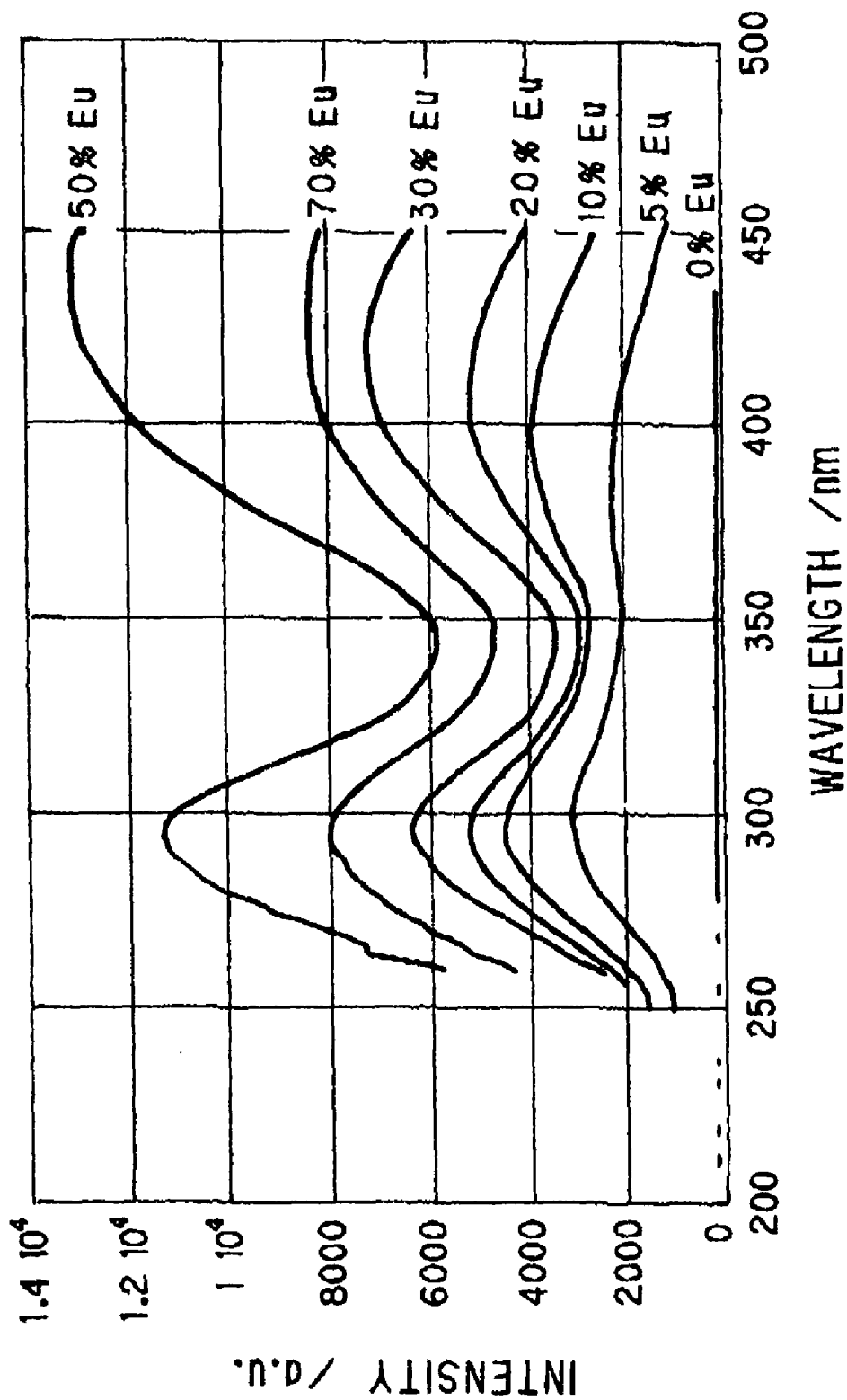
FIG. 30 is a spectrum diagram showing excitation spectra of $Eu^{2+}$ ion doped ca α-sialon phosphors [1] to [7] with different doping ratios.

FIG. 30 is a spectrum diagram showing excitation spectra of $Eu^{2+}$ ion doped Ca α-sialon phosphors [1] to [7] with different doping ratios.

As shown, it is found that any excitation spectra have broad peaks at 280 and 400-450. In the two peaks, the peak intensity increases according to increase in doping ratio until reaching $Eu^{2+}$ doping ratio of 50%. When doping ratio exceeds 50%, the peak intensity lowers due to concentration quenching. However, it is still higher than doping ratio of 30%.

Of the two peaks found in the spectra, peak of 280 nm belongs to excitation peak of Ca-α-sialon, matrix material, and peak of 400-450 nm belongs to charge transfer absorption band of Eu—(N or O). The latter Eu—(N or O) charge transfer absorption band peak shifts to longer wavelength side according to increase in $Eu^{2+}$ doping ratio. Therefore, it can be excited by, emission light (450 to 550 nm) of InGaN system blue LED.

Figure 31:
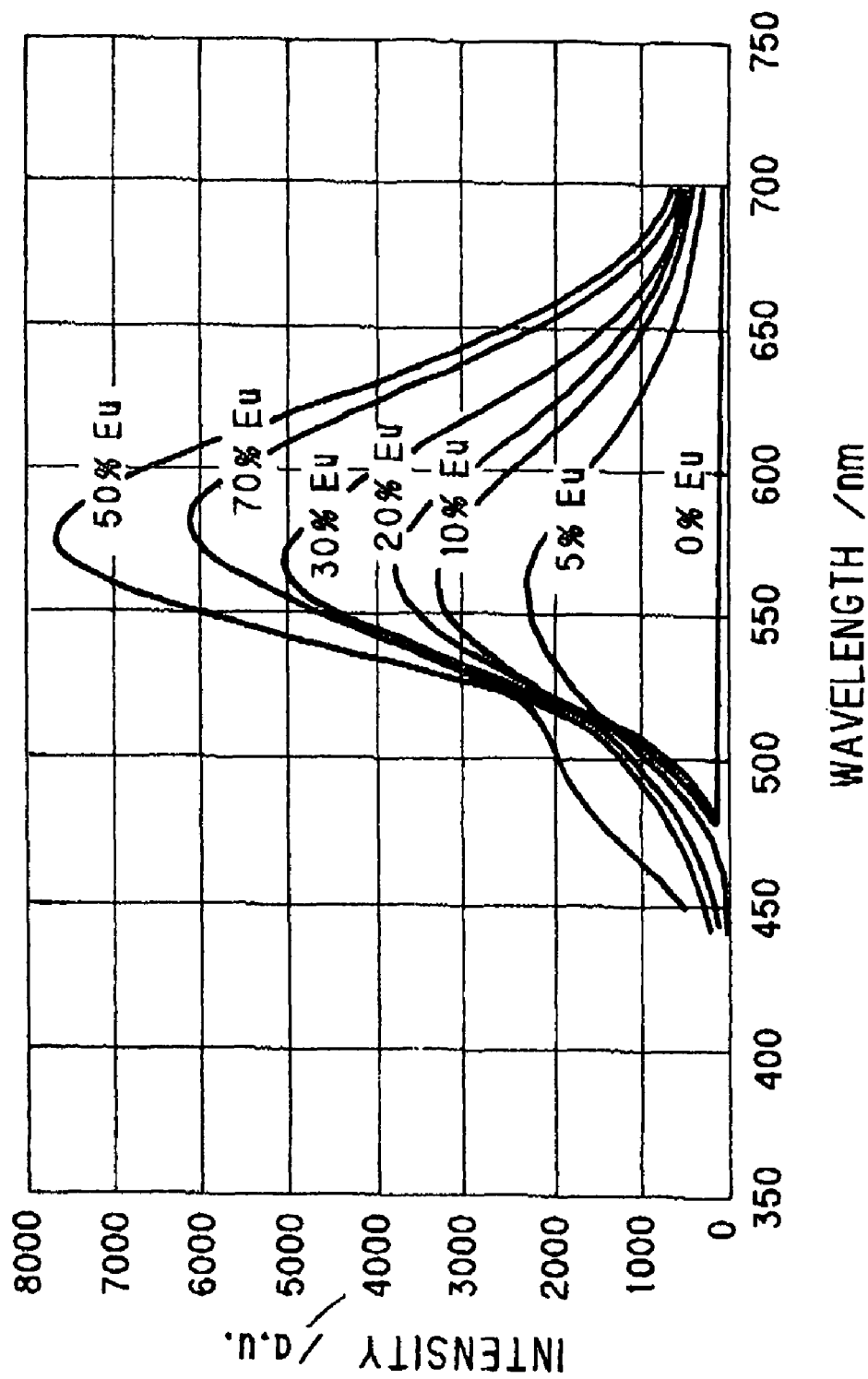
FIG. 31 is a spectrum diagram showing emission spectra of $Eu^{2+}$ ion doped Ca α-sialon phosphors with different doping ratios.

FIG. 31 is a spectrum diagram showing emission spectra of $Eu^{2+}$ ion doped Ca α-sialon phosphors with different doping ratios.

As shown, only one peak is observed that continuously shifts from 560 nm to 590 nm according to increase in doping ratio of $Eu^{2+}$ ion. Also in the emission spectra, like the excitation spectra in FIG. 30, the maximum peak intensity is observed at $Eu^{2+}$ ion doping ratio of 50%. When doping ratio exceeds 50%, the peak intensity lowers due to concentration quenching. However, it is still higher than doping ratio of 30%.

The reason why the $Eu^{2+}$ ion doped Ca-α-sialon phosphor has still higher emission intensity is, as described earlier, that distance between $Eu^{2+}$ ions doped is as far as about 5 angstroms. Namely, since the distance between $Eu^{2+}$ ions doped is relatively big, the emission intensity does not so rapidly lowers even when the amount of $Eu^{2+}$ ions doped increases. Thus, it is less subject to concentration quenching.

Next, raw powers of Ca-α-sialon (1) and Pr-α-sialon (3) are mixed at molar ratio of 50:50, then reacted using hot pressing apparatus (Nisshingiken-sha, NEV-HP3) at a pressure of 20 MPa in nitrogen atmosphere (1 atm) of 1700° C. for one hour. Thereby, $Pr^{3+}$ ion doped Ca-α-sialon phosphor ($Ca_{0.38}Eu_{0.25}Si_{9.75}Al_{2.25}N_{15.25}O_{0.75}$) is synthesized.

Figure 32A:
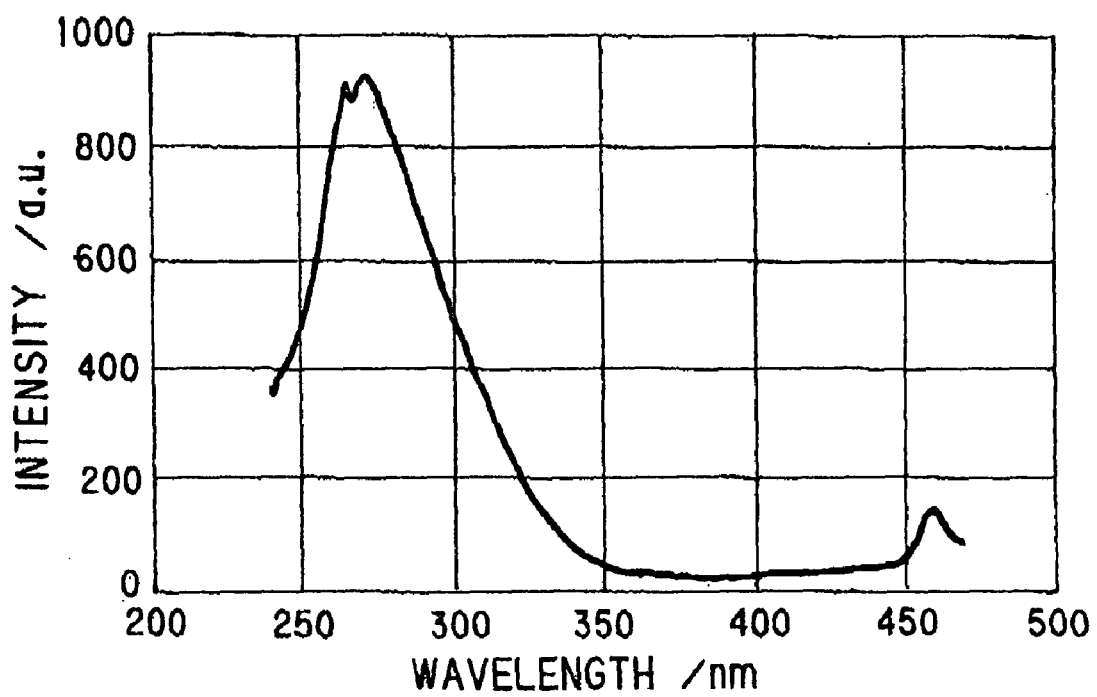
FIGS. 32A and 32B are spectrum diagrams showing excitation spectrum and emission spectrum, respectively, of $Pr^{3+}$ ion doped Ca-α-sialon phosphor.
Figure 32B:
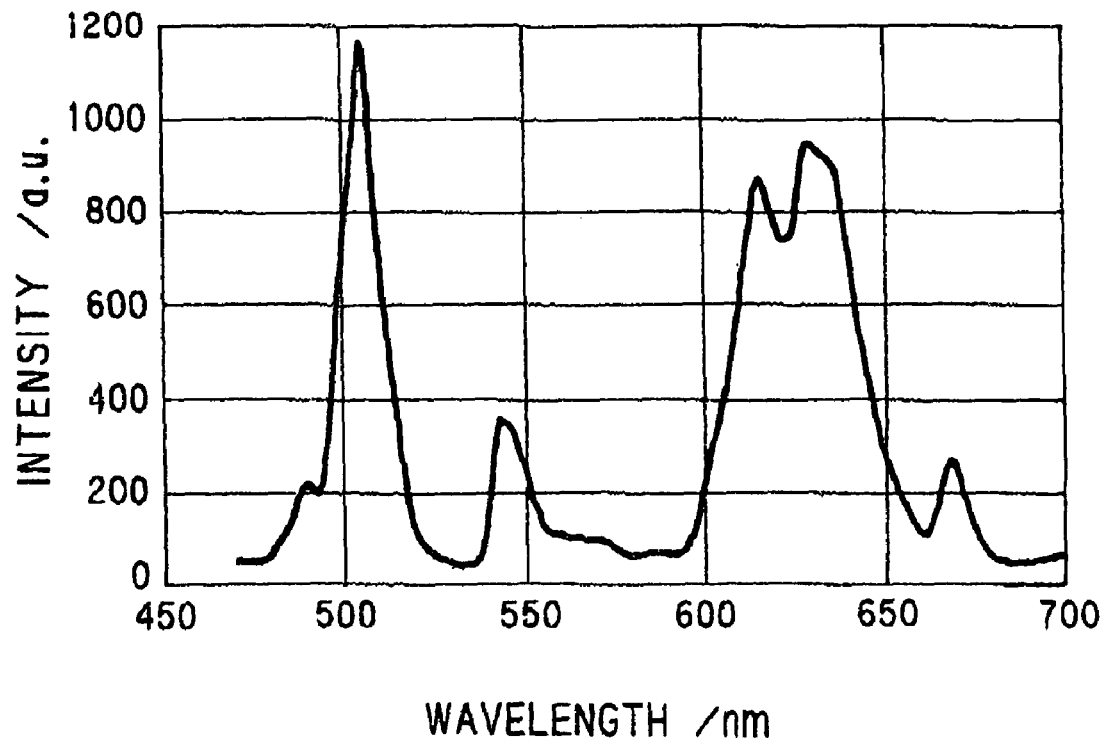

FIGS. 32A and 32B are spectrum diagrams showing excitation spectrum and emission spectrum, respectively, of $Pr^{3+}$ ion doped Ca-α-sialon phosphor.

As shown in FIG. 32A, in the excitation spectrum, a broad peak at 263 nm and an emission line peak based on f-f transition of $Pr^{3+}$ ion at around 460 nm are observed. As shown in FIG. 32B, in the emission spectrum, an emission line peak based on f-f transition of $Pr^{3+}$ ion at 450-750 nm are observed.

Next, raw powers of Ca-α-sialon (1) and Tb-α-sialon (4) are mixed at molar ratio of 50:50, then reacted using hot pressing apparatus (Nisshingiken-sha, NEV-HP3) at a pressure of 2 MPa in nitrogen atmosphere (1 atm) of 1700° C. for one hour. Thereby, $Tb^{3+}$ ion doped Ca-α-sialon phosphor ($Ca_{0.38}Tb_{0.25}Si_{9.75}Al_{2.25}N_{15.25}O_{0.75}$) is synthesized.

Figure 33A:
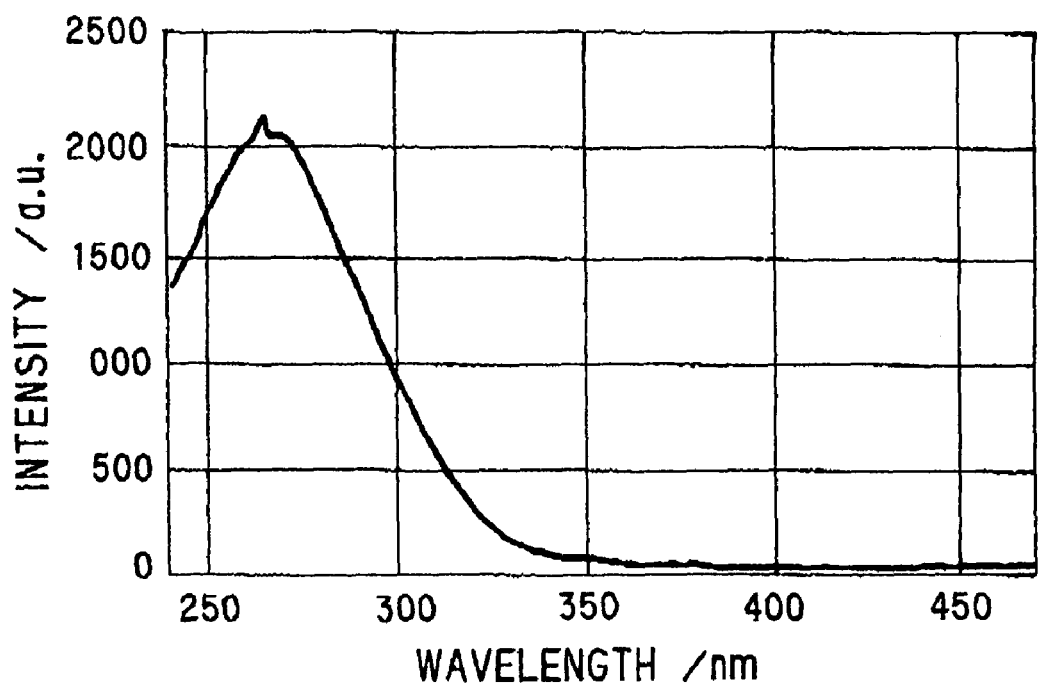
FIGS. 33A and 33B are spectrum diagrams showing excitation spectrum and emission spectrum, respectively, of $Tb^{3+}$ ion doped Ca-α-sialon phosphor.
Figure 33B:
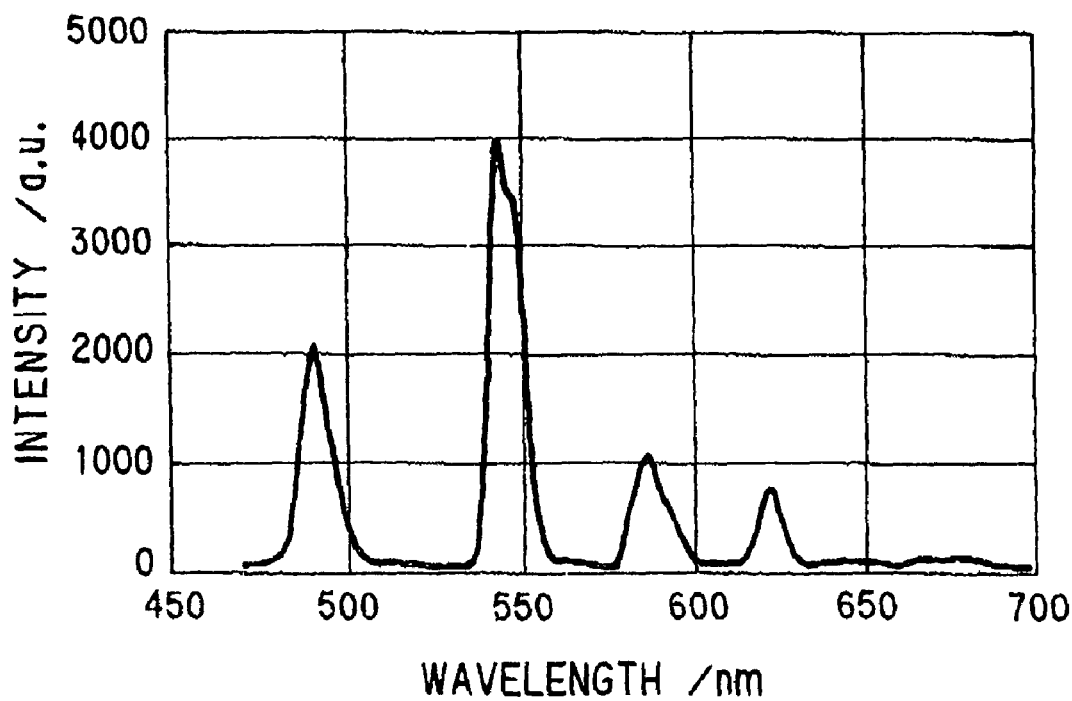

FIGS. 33A and 33B are spectrum diagrams showing excitation spectrum and emission spectrum, respectively, of $Tb^{3+}$ ion doped Ca-α-sialon phosphor.

As shown in FIG. 33A, in the excitation spectrum, a broad peak at 263 nm is observed. As shown in FIG. 33B, in the emission spectrum, an emission line peak based on f-f transition of $Tb^{3+}$ ion at 470-650 nm are observed. This emission line peak becomes maximum at 550 nm and is observed as green emission.

Next, raw powers of Ca-α-sialon (1), Eu-α-sialon (2) and Dy-α-sialon (5) are mixed at molar ratio of 50:40:10, then reacted using hot pressing apparatus (Nisshingiken-sha, NEV-HP3) at a pressure of 20 MPa in nitrogen atmosphere (1 atm) of 1700° C. for one hour. Thereby, $Eu^{2+}$ and $Dy^{3+}$ ion co-doped Ca-α-sialon phosphor ($Ca_{0.38}Eu_{0.20}Dy_{0.05}Si_{9.75}Al_{2.25}N_{15.25}O_{0.75}$) is synthesized.

Figure 34A:
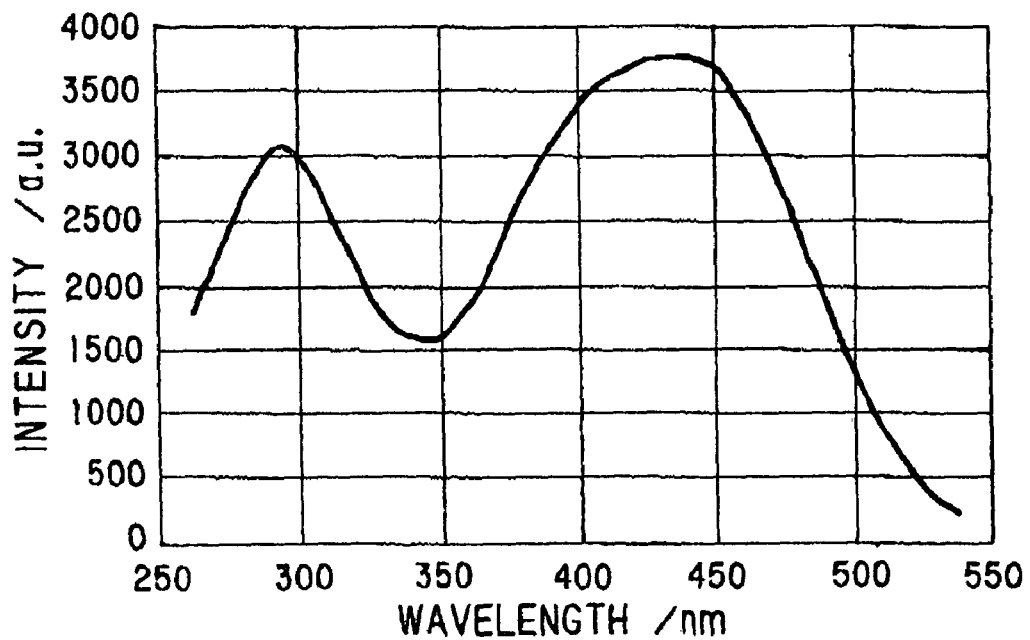
FIGS. 34A and 34B are spectrum diagrams showing excitation spectrum and emission spectrum, respectively, of $Eu^{2+}$ and $Dy^{3+}$ ion co-doped Ca-α-sialon phosphor.
Figure 34B:
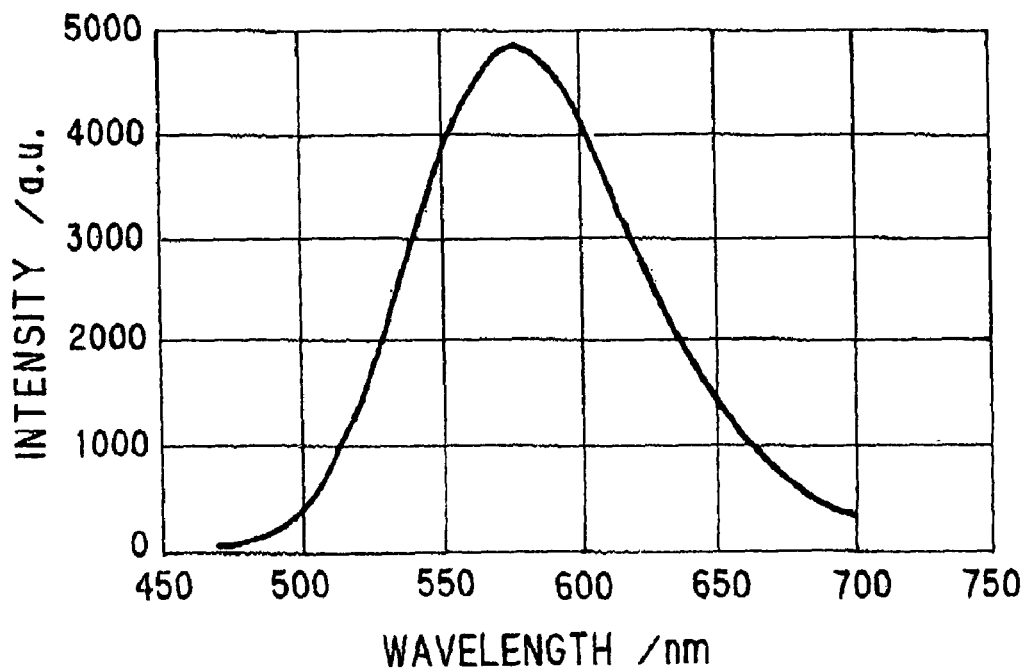

FIGS. 34A and 34B are spectrum diagrams showing excitation spectrum and emission spectrum, respectively, of $Eu^{2+}$ and $Dy^{3+}$ ion co-doped Ca-α-sialon phosphor.

As shown in FIG. 34A, in the excitation spectrum, two broad peaks at 290 nm, 450 nm are observed. Of the two peaks, peak of 290 nm belongs to excitation peak of Ca-α-sialon, matrix material, and peak of 450 nm belongs to charge transfer absorption band of Eu—(N or O). As shown in FIG. 34B, in the emission spectrum, only one peak based on d-f transition of $Eu^{2+}$ ion is observed.

Next, raw powers of Y-α-sialon (6) and Eu-α-sialon (2) are mixed at molar ratio of 95:5, then reacted using hot pressing apparatus (Nisshingiken-sha, NEV-HP3) at a pressure of 20 MPa in nitrogen atmosphere (1 atm) of 1700° C. for one hour. Thereby, $Eu^{2+}$ ion doped Y— α-sialon phosphor ($Y_{0.38}Eu_{0.02}Si_{9.75}Al_{2.25}N_{15.25}O_{0.75}$) is synthesized.

Figure 35A:
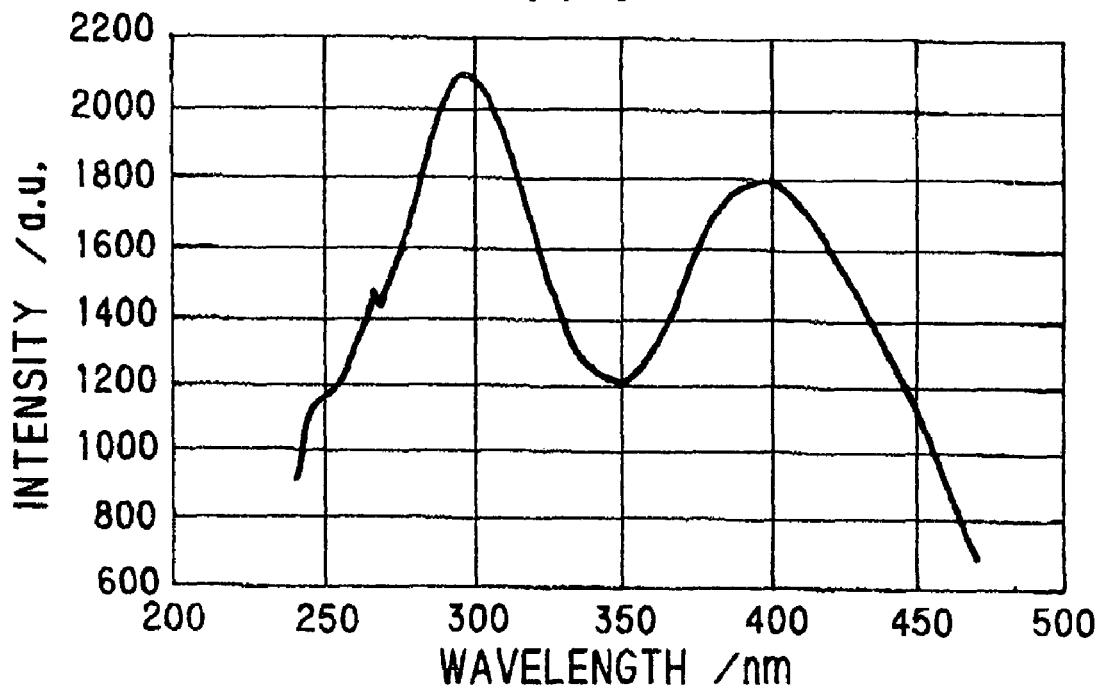
FIGS. 35A and 35B are spectrum diagrams showing excitation spectrum and emission spectrum, respectively, of $Eu^{2+}$ ion doped Y-α-sialon phosphor.
Figure 35B:
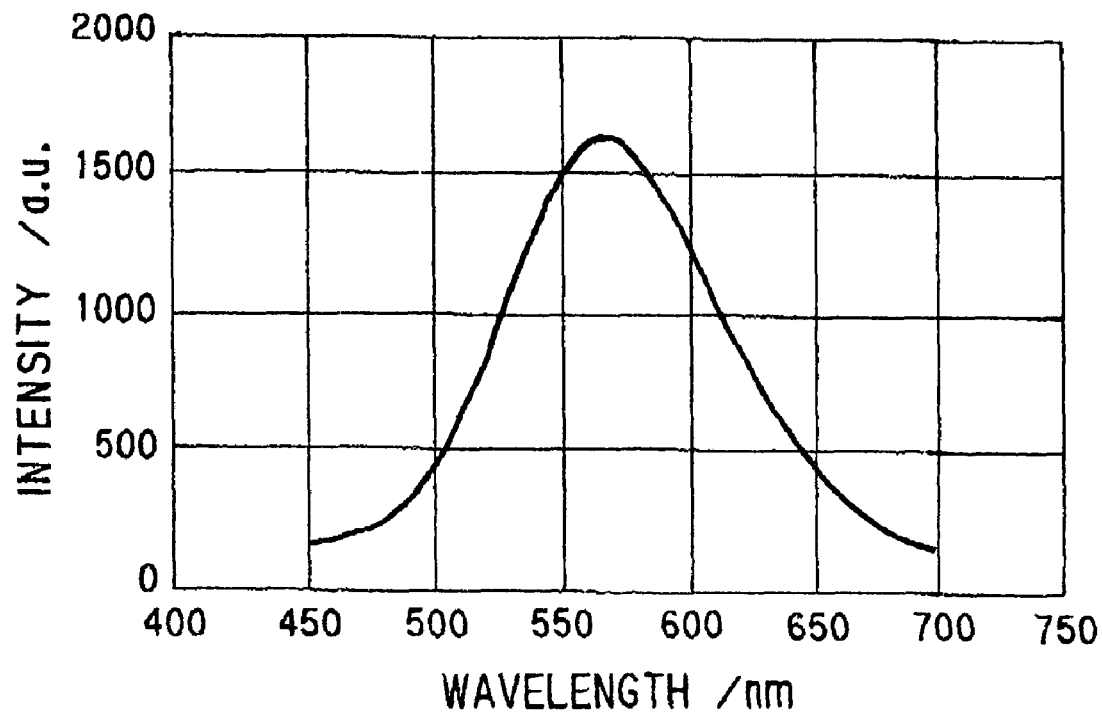

FIGS. 35A and 35B are spectrum diagrams showing excitation spectrum and emission spectrum, respectively, of $Eu^{2+}$ ion doped Y-α-sialon phosphor.

As shown in FIG. 35A, in the excitation spectrum, two broad peaks at 310 nm, 410 nm are observed. As shown in FIG. 35B, in the emission spectrum, only one peak at 570 nm based on d-f transition of $Eu^{2+}$ ion is observed.

Next, $Yb^{2+}$-α-sialon ($Yb_{0.5}Si_{9.75}Al_{2.25}N_{15.25}O_{0.75}$) (7) is in-situ prepared as phosphor.

Figure 36:
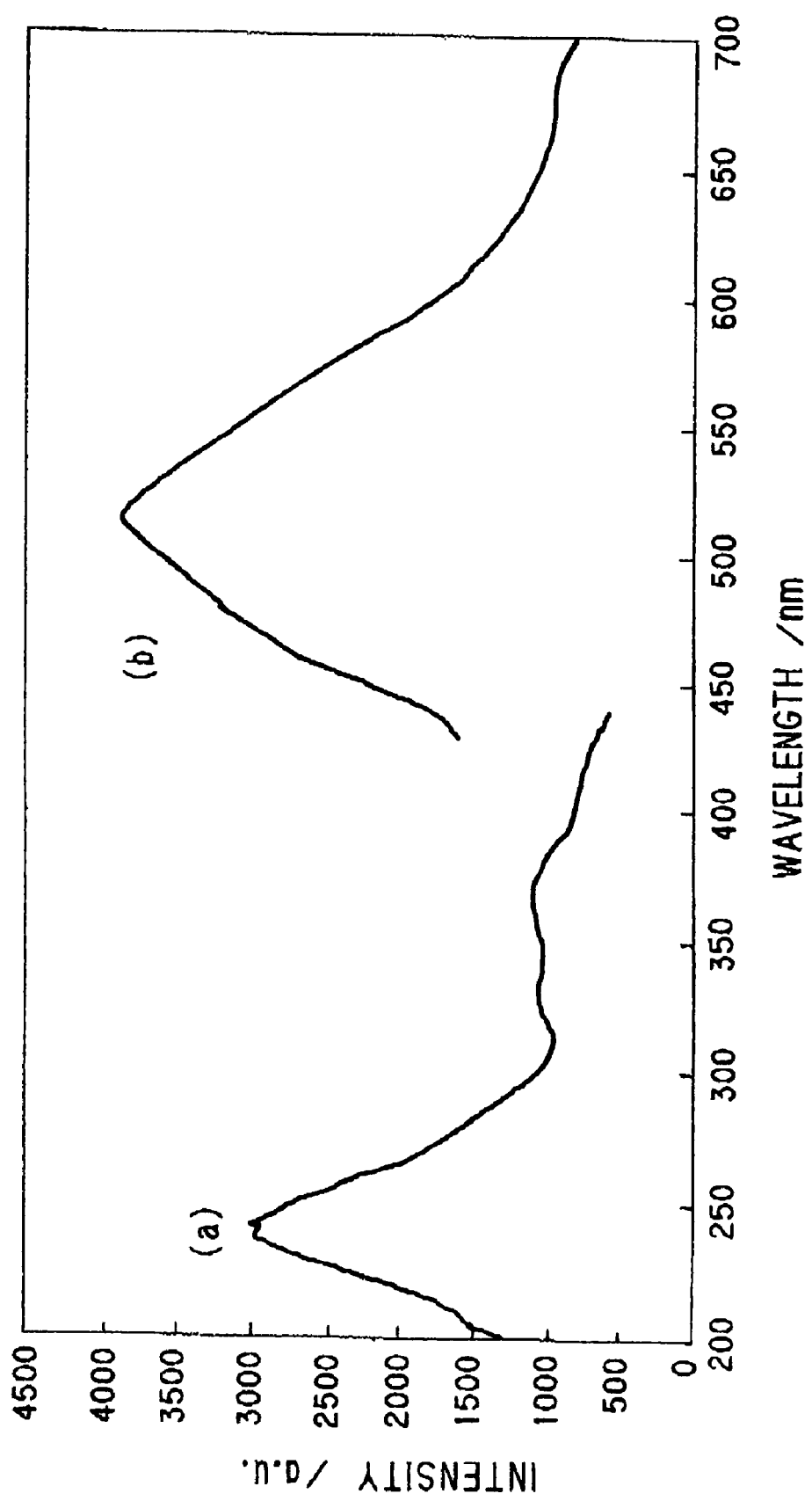
FIG. 36 is a spectrum diagram showing (a) excitation spectrum and (b) emission spectrum, respectively, of $Yb^{2+}$-α-sialon phosphor.

FIG. 36 is a spectrum diagram showing (a) excitation spectrum and (b) emission spectrum, respectively, of $Yb^{2+}$-α-sialon phosphor.

As shown in FIG. 36, in the excitation spectrum, a broad peak at 240 nm is observed and, in the emission spectrum, a peak at 510 nm based on d-f transition of $Yb^{2+}$ ion is observed.

Next, $Er^{3+}$-α-sialon ($Er_{0.5}Si_{9.75}Al_{2.25}N_{15.25}O_{0.75}$) (8) is in-situ prepared as phosphor.

Figure 37:
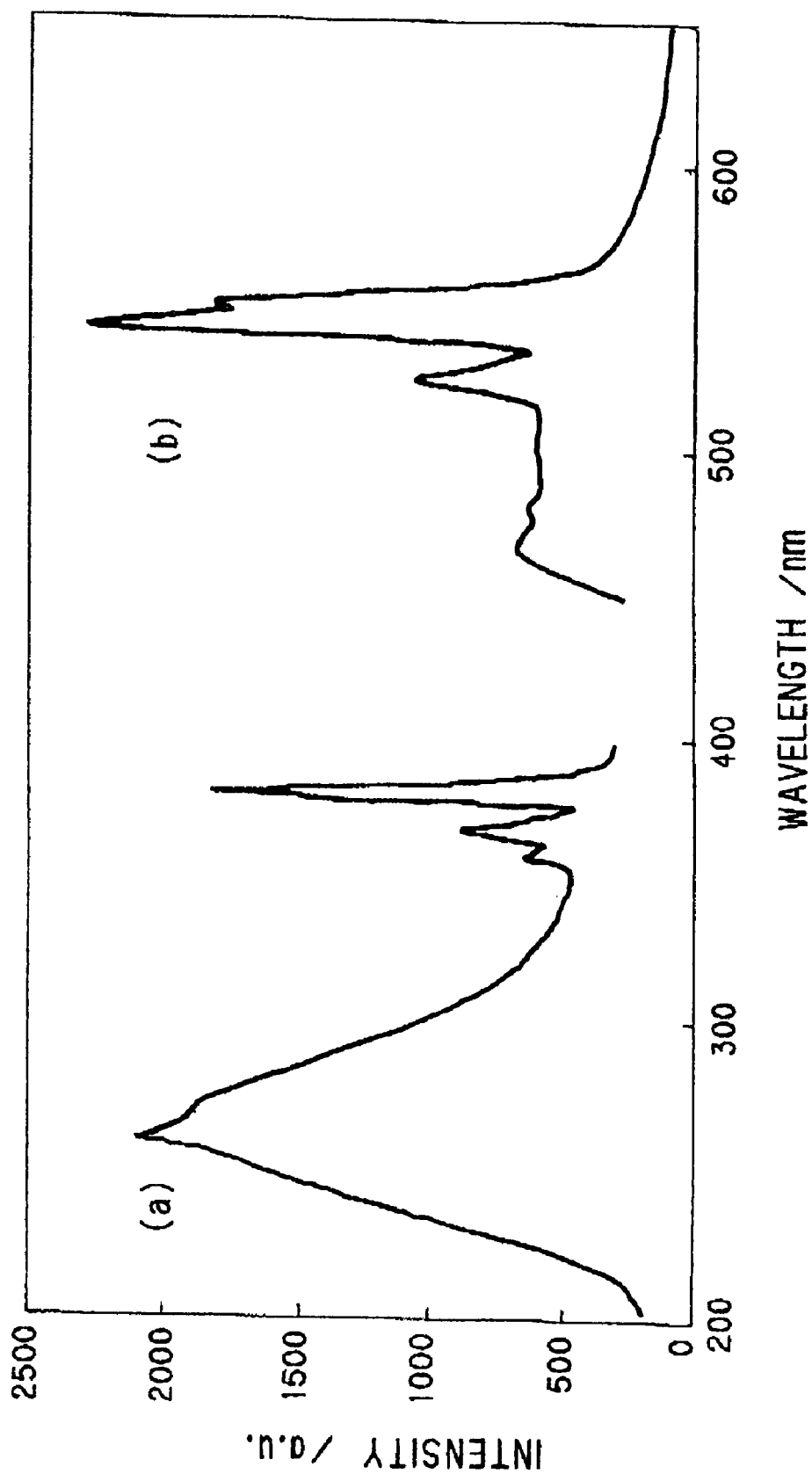
FIG. 37 is a spectrum diagram showing (a) excitation spectrum and (b) emission spectrum, respectively, of $Er^{3+}$-α-sialon phosphor.

FIG. 37 is a spectrum diagram showing (a) excitation spectrum and (b) emission spectrum, respectively, of $Er^{3+}$-α-sialon phosphor.

As shown in FIG. 37, in the excitation spectrum, a broad peak at 263 nm and an emission line peak based on f-f transition of $Er^{3+}$ at around 400 nm are observed and, in the emission spectrum, an emission line peak based on f-f transition of $Er^{3+}$ at 500-600 nm is observed.

Meanwhile, it will be obvious that details of raw material preparation, molar ratio, preparation condition etc. can be modified other than the above ones.

In the rare-earth element doped oxide nitride phosphor, the position of excitation spectrum shifts to longer wavelength side than conventional oxide phosphors and the absorption peak overlaps with the emission wavelength (450 to 550 nm) of blue LED. Therefore, it allows LED 1 including blue light emitting element 10 to have a high brightness.

Further, since the rare-earth element doped oxide nitride phosphor has α-sialon as matrix material, it has excellent mechanical and thermal properties and excellent chemical stability. Therefore, the rare-earth element doped oxide nitride phosphor can be stably operated even in severe environment, i.e., it has excellent weather resistance.

Example (1-2)

Another example of single-phase α-sialon phosphor is prepared as Samples A to G and K to N in Example (2-5) described later, and the fluorescent properties are measured.

Example 2

Preparation of Mixed α-sialon Phosphor

Examples (2-1) to (2-5) relate to preparation of mixed α-sialon phosphor.

Example (2-1)

A mixture of $Si_3N_4$:$Eu_2O_3$:CaO:AlN=79.0:1.5:2.2:15.8 (molar ratio) (where calcium carbonate is added as CaO) is molded in a 10 mm diameter mold at 200 kg/cm². Then, it is hot-press sintered at a pressure of 20 MPa in nitrogen atmosphere (1 atm) of 1700° C. for one hour. After the heating, the sintered body is powdered. As the result of powder X-ray diffraction analysis (Rigaku-sha, RINT2200), a material of 66 weight % α-sialon, 18 weight % β-sialon and 15 weight % unreacted α-silicon nitride is obtained.

The entire powder composition is represented by α-sialon composition formula: $(Ca_{0.11}, Eu_{0.14})(Si, Al)_{12}(O, N)_{16}$.

Figure 38:
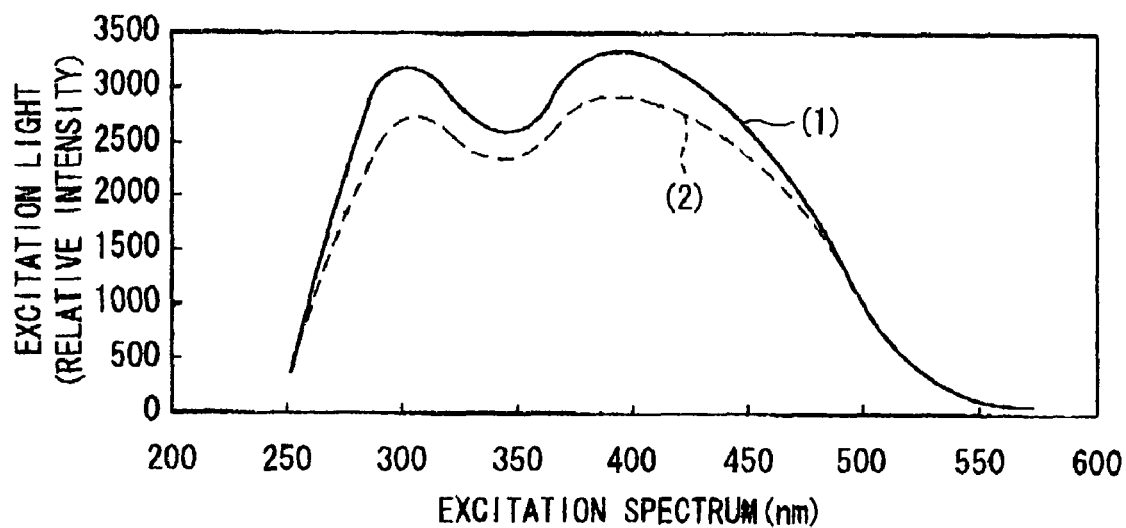
FIG. 38 is a spectrum diagram showing excitation spectra in Example 2-1 (full line (1)) and Example 2-2 (broken line (2)) of mixed α-sialon phosphor.
Figure 39:
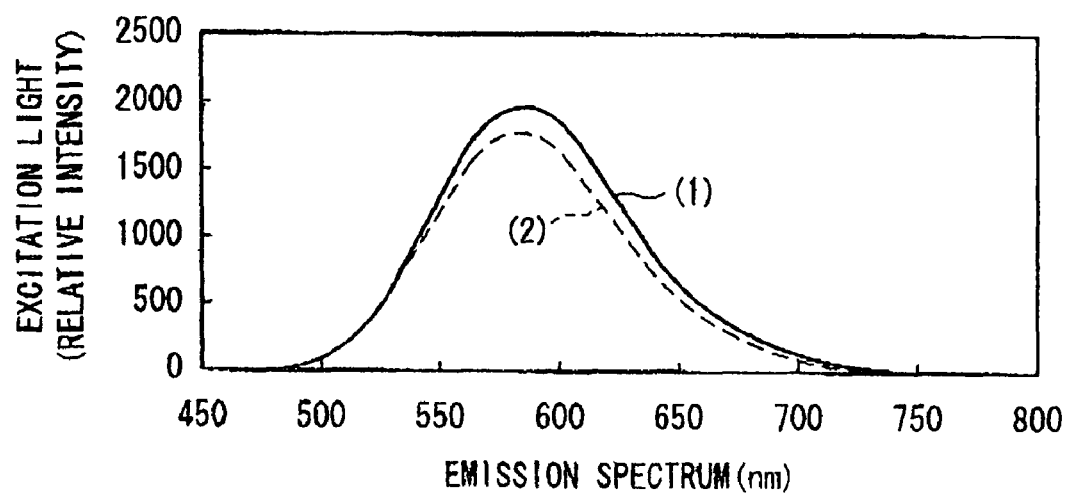
FIG. 39 is a spectrum diagram showing emission spectra in Example 2-1 (full line (1)) and Example 2-2 (broken line (2)) of mixed α-sialon phosphor.

FIG. 38 is a spectrum diagram showing excitation spectra in Example 2-1 (full line (1)) and Example 2-2 (broken line (2)) of mixed α-sialon phosphor. FIG. 39 is a spectrum diagram showing emission spectra in Example 2-1 (full line (1)) and Example 2-2 (broken line (2)) of mixed α-sialon phosphor.

As shown by (1) in FIG. 38, in the excitation spectrum, a peak at around 300 nm belongs to excitation of matrix Ca-α-sialon, and a peak at 300-500 nm belongs to charge transfer absorption band of Eu—(O, N). Therefore, it can use, as excitation light, emission light of InGaN system blue LED (450 to 550 nm). As shown by (1) in FIG. 39, in the emission spectrum, a peak at around 580 nm is observed.

Example (2-2)

A mixture of $Si_3N_4$: $Eu_2O_3$: CaO: AlN: $Al_2O_3$=75.9:1.0:3.2:17.2:1.72 (molar ratio) (where calcium carbonate is added as CaO) is molded in a 10 mm diameter mold at 200 kg/cm². Then, it is heated in argon atmosphere of 1750° C. for two hours. After the heating, the sintered body is powdered. As the result of powder X-ray diffraction analysis (Rigaku-sha, RINT2200), a material of 68 weight % α-sialon, 24 weight % β-sialon and 8 weight % unreacted α-silicon nitride is obtained.

The entire powder composition is represented by α-sialon composition formula: $(Ca_{0.15}, Eu_{0.06})(Si, Al)_{12}(O, N)_{16}$.

As shown by (2) in FIG. 38, in the excitation spectrum, a peak at around 350-500 nm is observed. As shown by (2) in FIG. 39, in the emission spectrum, a peak at around 550-650 nm is observed.

Example (2-3)

A mixture of $Si_3N_4$:$Tb_2O_3$:CaO:AlN=79.0:1.5:2.2:15.8 (molar ratio) (where calcium carbonate is added as CaO) is molded in a 10 mm diameter mold at 200 kg/cm². Then, it is heated in nitrogen atmosphere of 1700° C. for two hours. After the heating, the sintered body is powdered. As the result of powder X-ray diffraction analysis (Rigaku-sha, RINT2200), a material of 68 weight % α-sialon, 16 weight % β-sialon and 16 weight % unreacted α-silicon nitride is obtained.

The entire powder composition is represented by α-sialon composition formula: $(Ca_{0.11}, Tb_{0.14})(Si, Al)_{12}(O, N)_{16}$. The material has main peaks at around 400 nm and 540 nm.

Example (2-4)

A mixture of $Si_3N_4$: $Yb_2O_3$: CaO: AlN: $Al_2O_3$=75.9:1.0:3.2:17.2:1.72 (molar ratio) (where calcium carbonate is added as CaO) is molded in a 10 mm diameter mold at 200 kg/cm². Then, it is heated in nitrogen atmosphere of 1750° C. for two hours. After the heating, the sintered body is powdered. As the result of powder X-ray diffraction analysis (Rigaku-sha, RINT2200), a material of 70 weight % α-sialon, 22 weight % β-sialon and 8 weight % unreacted α-silicon nitride is obtained.

The entire powder composition is represented by α-sialon composition formula: $(Ca_{0.15}, Yb_{0.06})(Si, Al)_{12}(O, N)_{16}$.

The material has a broad peak at 450 to 600 nm.

In the mixed α-sialon phosphor, the position of excitation spectrum shifts to longer wavelength side than conventional oxide phosphors and the absorption peak overlaps with the emission wavelength (450 to 550 nm) of blue LED. Therefore, it allows LED 1 including blue light emitting element 10 to have a high brightness.

Further, since α-sialon is developed as a heat-resistant material, it has excellent mechanical and thermal properties and excellent chemical stability. Therefore, the mixed α-sialon phosphor can be stably operated even in severe environment, i.e., it has excellent weather resistance.

Example (2-5)

Next, various Ca-α-sialon:$Eu^{2+}$ phosphors are prepared and the fluorescent properties are measured. Samples A to G are single-phase α-sialon phosphors and Samples K to N are mixed α-sialon phosphors.

Figure 40:
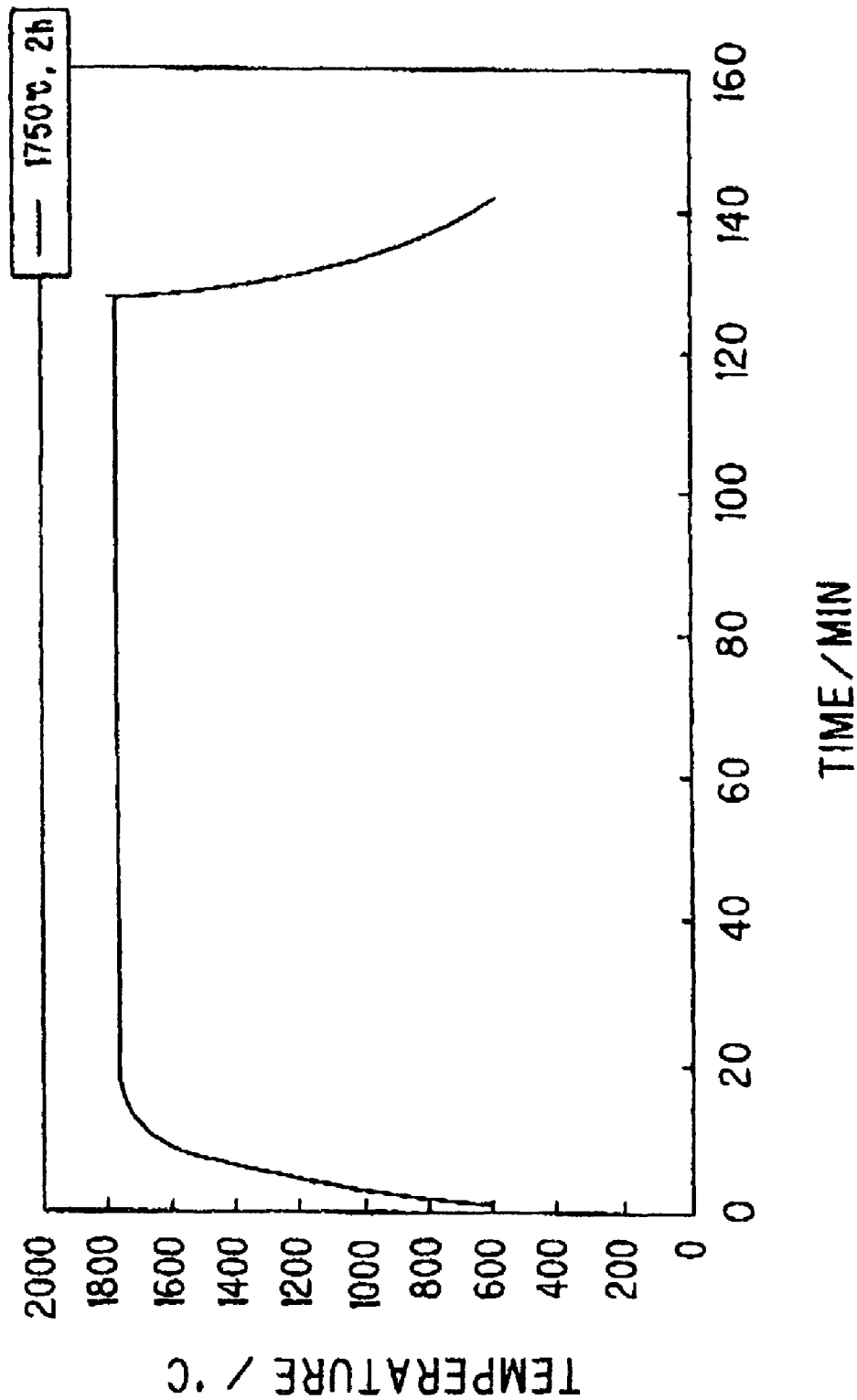
FIG. 40 is a graph showing temperature profile in RF induction heater.

In preparing Ca-α-sialon:$Eu^{2+}$ phosphor, starting materials, CaO, $Si_3N_4$, AlN, $Al_2O_3$ and $Eu_2O_3$ are weighed to have a given ratio, then wet-mixed with acetone. The mixed material powder is filled into Mo container, which is made using 0.1 mm thick Mo (module) plate. Then, it is sintered using RF induction heater in argon atmosphere of 100-1750° C. atmospheric pressure for two hours, as shown by temperature profile in FIG. 40.

FIG. 41 is a table showing the composition (molar ratio) of Samples A to N, Ca-α-sialon:$Eu^{2+}$ phosphors. FIG. 42 is a table showing atom % of Samples A to N, Ca-α-sialon:$Eu^{2+}$ phosphors. In FIGS. 41 and 42, □3015 means m=3.0 and n=1.5 in general formula of Ca-α-sialon: $Ca_{0.5m}Si_{12-(m+n)}Al_{(m+n)}O_nN_{6-n}$. In like manner, 2010 means m=2.0 and n=1.0, 1005 means m=1.0 and n=0.5, 3030 means m=3.0 and n=3.0, 2015 means m=2.0 and n=1.5, 05025 means m=0.5 and n=0.25, 0505 means m=0.5 and n=0.5 and 2613 means m=2.6 and n=1.3. Also, Eu/Ca means element ratio, and Eu % means Eu replacement ratio to all Ca sites. In atom %, each element numerical ratio is indicated assuming the number of all atoms to be 100.

FIGS. 43 to 52 are spectrum diagrams showing excitation/emission spectra, which are classified into five, in Samples A to N. Samples A to N are measured in state of powder at room temperature.

Figure 43:
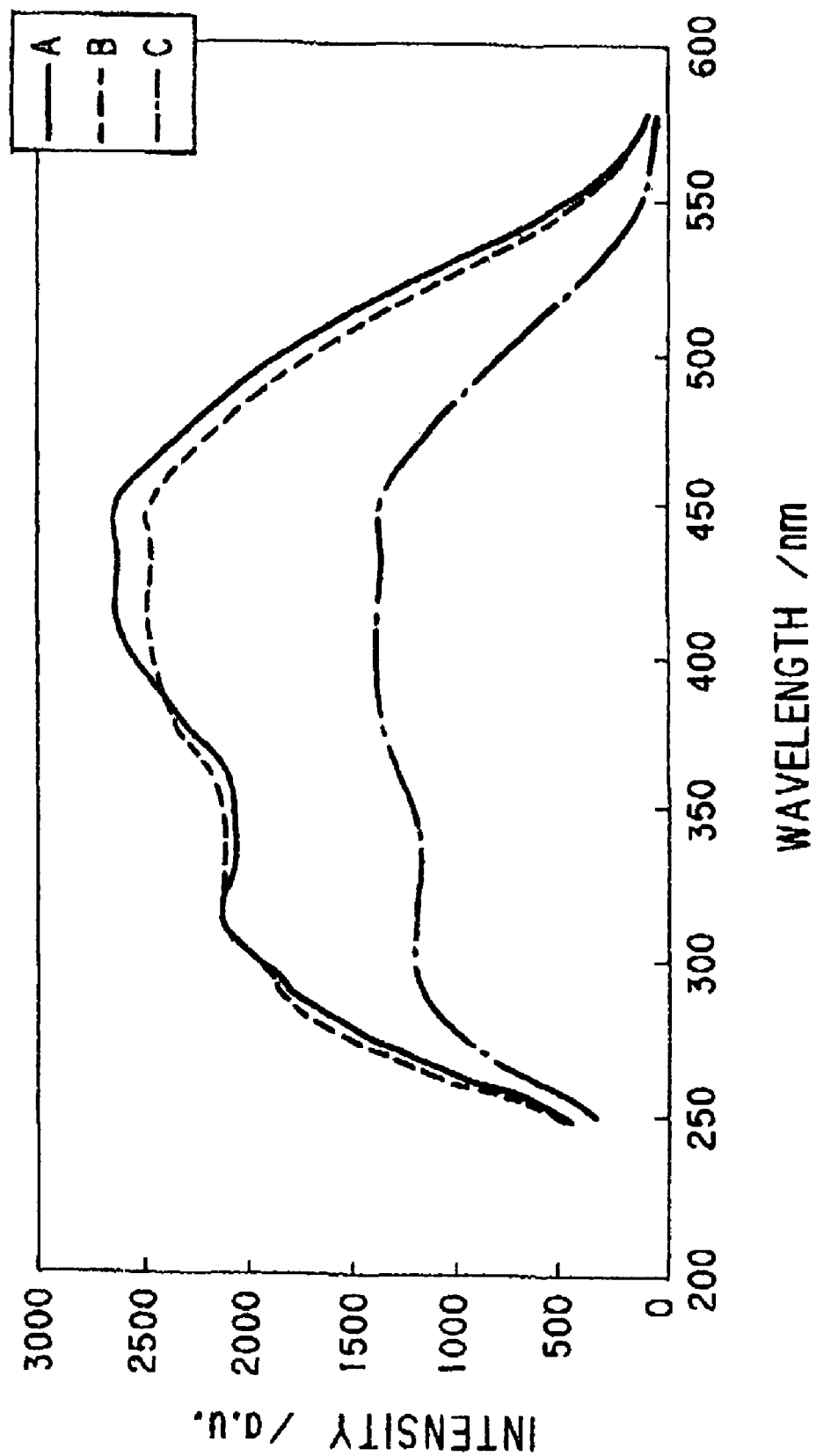
FIGS. 43 to 52 are spectrum diagrams showing excitation/emission spectra, which are classified into five, in Samples A to N, Ca-α-sialon:$Eu^{2+}$ phosphors.
Figure 44:
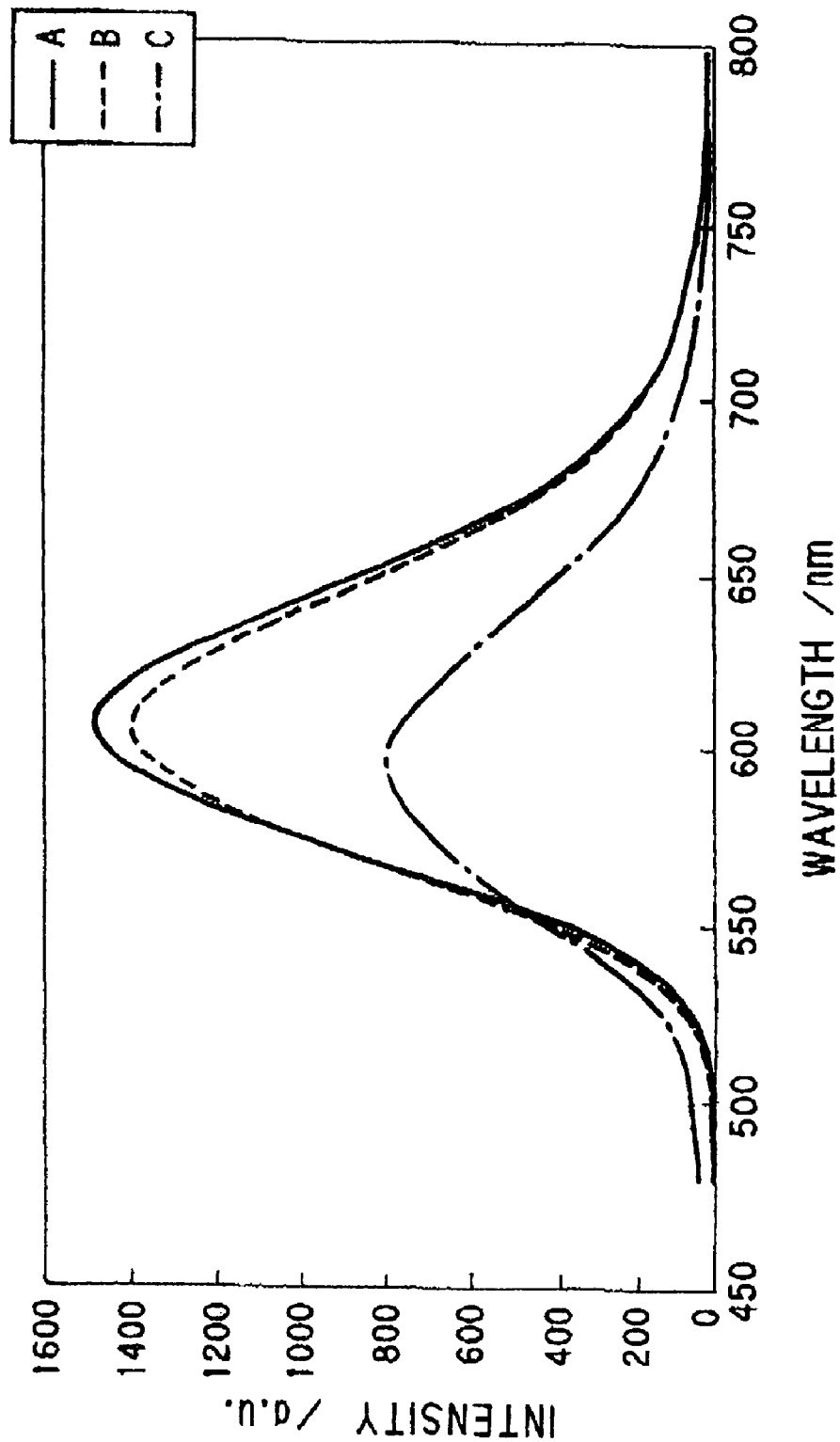

In Samples A, B and C, $Eu_2O_3$ is made 3.0 mol % of the entire composition and m, n are changed. The excitation spectra are shown in FIG. 43 and the emission spectra are shown in FIG. 44.

Figure 45:
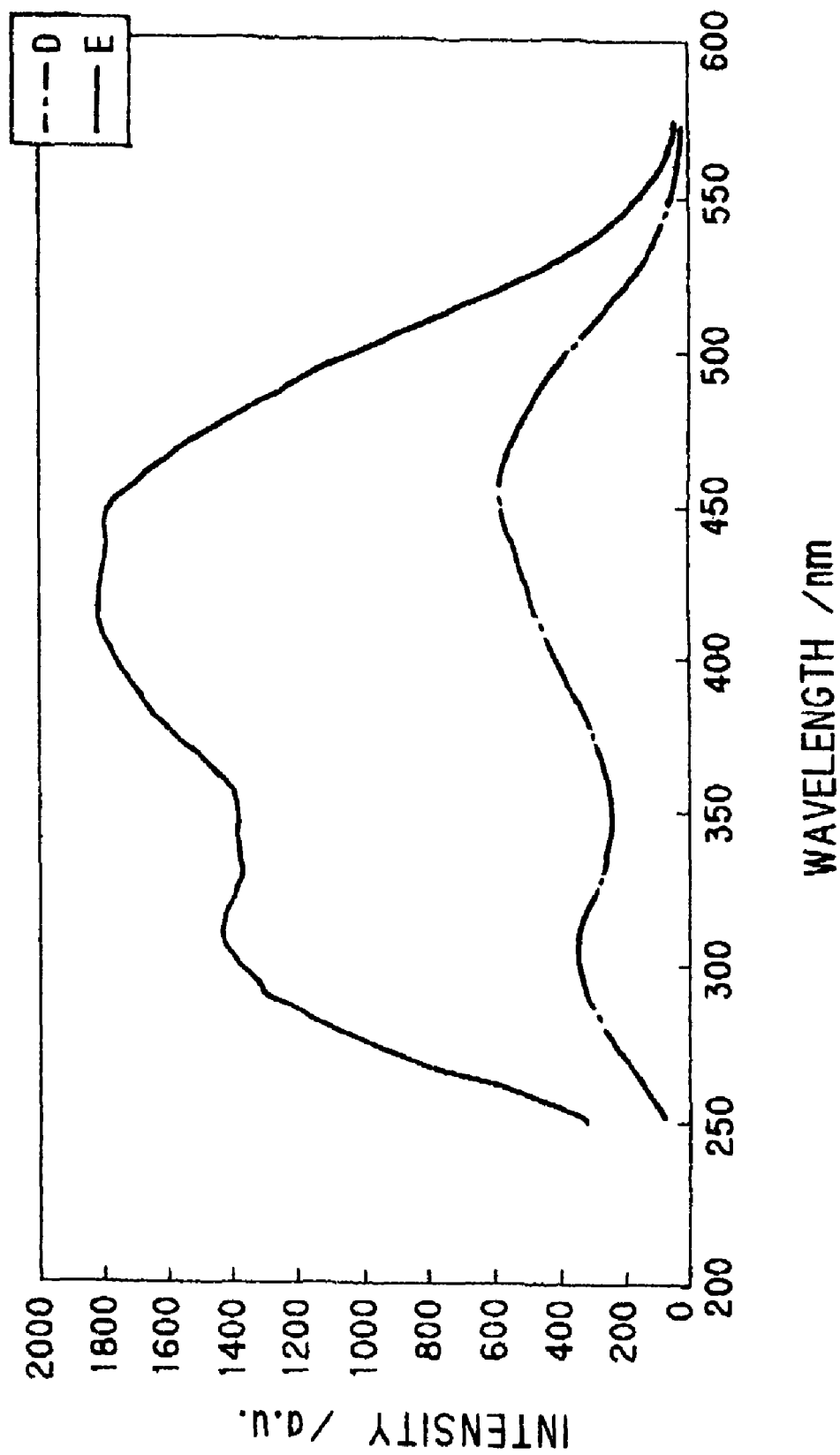
Figure 46:
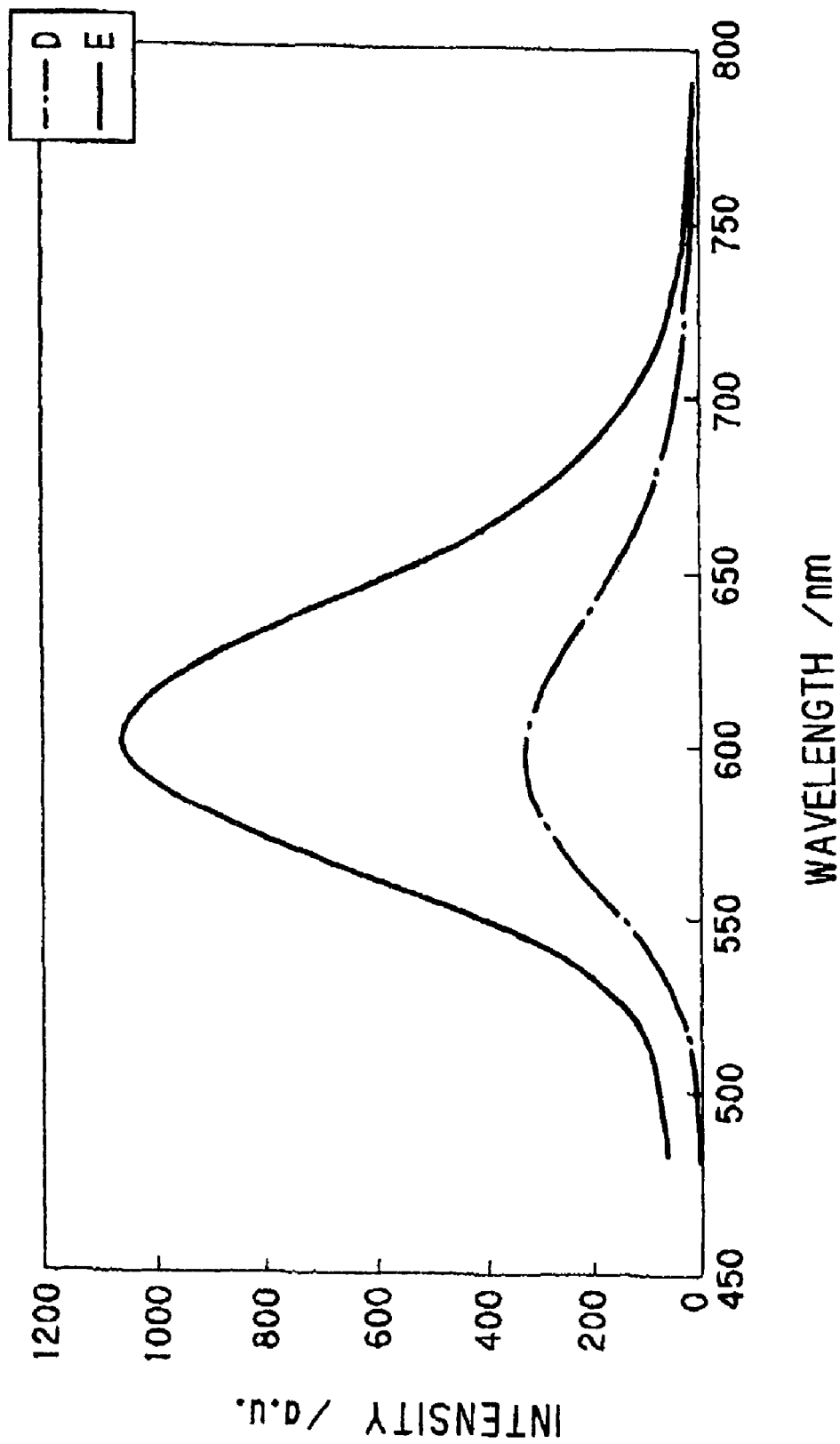

In Samples D and E, $Eu_2O_3$ is made 3.0 mol % of the entire composition and m, n are determined such that its N/O ratio is smaller than that of Samples A, B. The excitation spectra are shown in FIG. 45 and the emission spectra are shown in FIG. 46.

Figure 47:
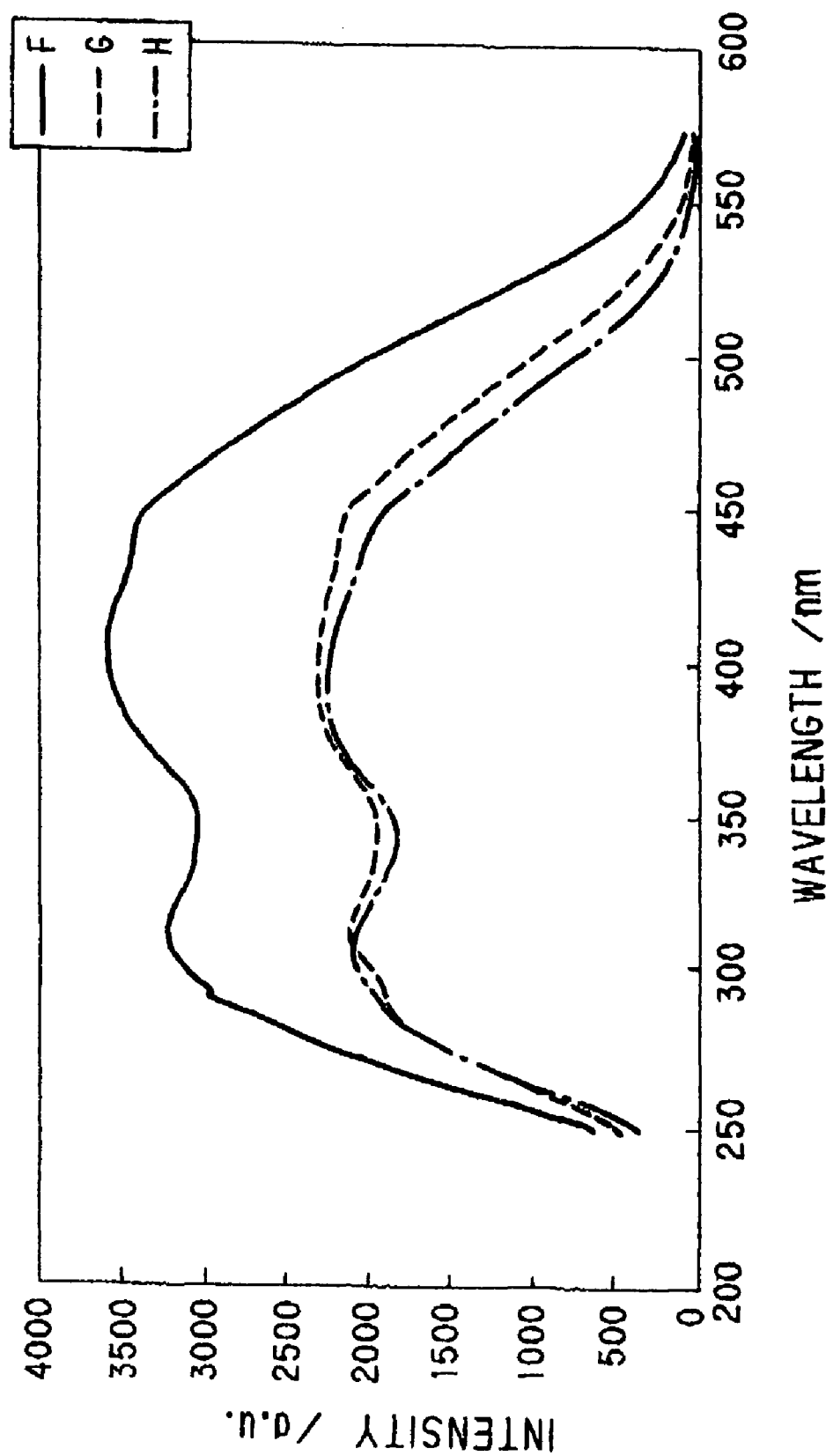
Figure 48:
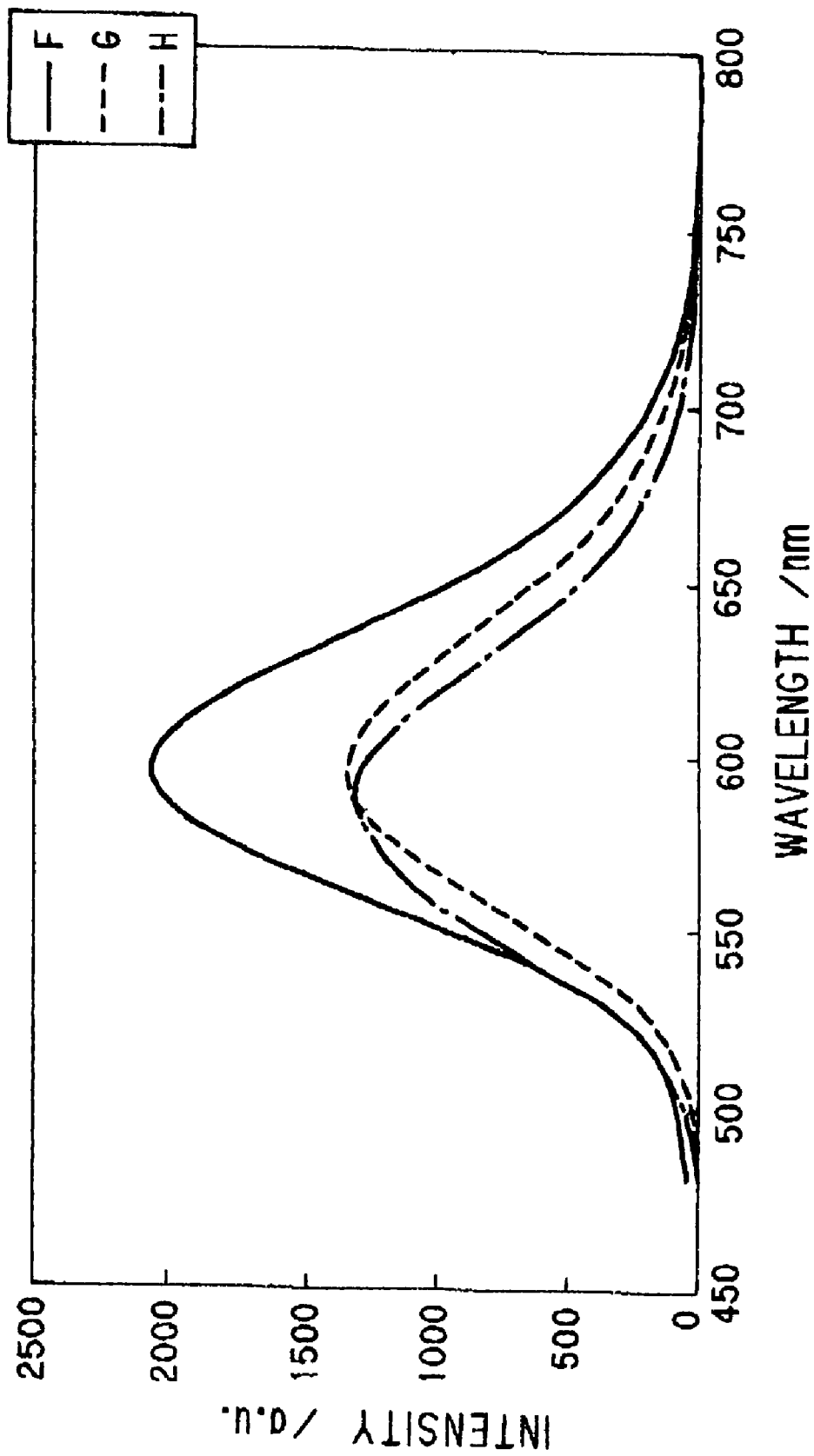

In Samples F, G and H, $Eu_2O_3$ is made 1.5 mol % of the entire composition and m, n are changed. Samples F, G have the same m, n values as Samples A, B and less Eu content than them. The excitation spectra are shown in FIG. 47 and the emission spectra are shown in FIG. 48.

Figure 49:
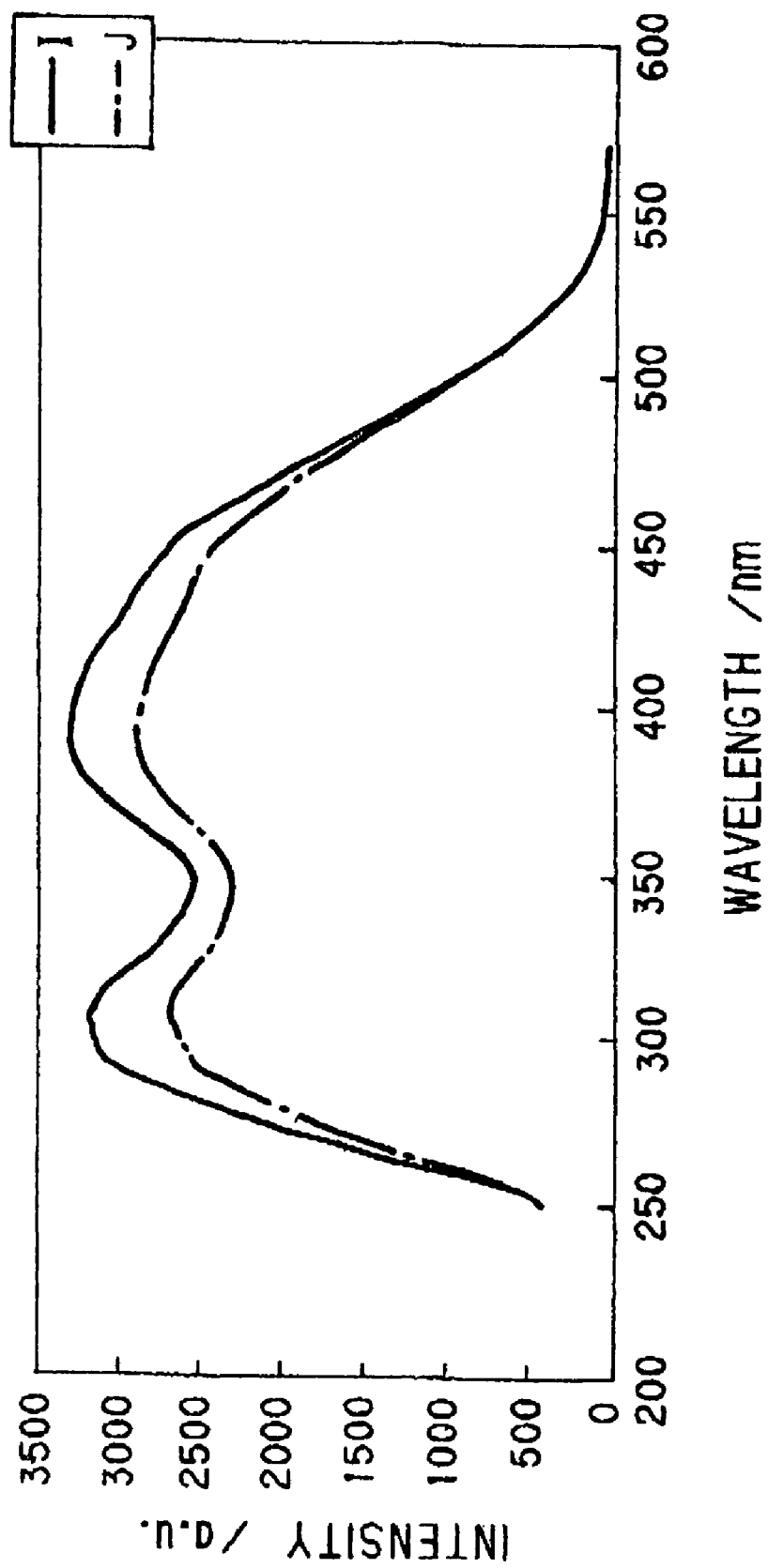
Figure 50:
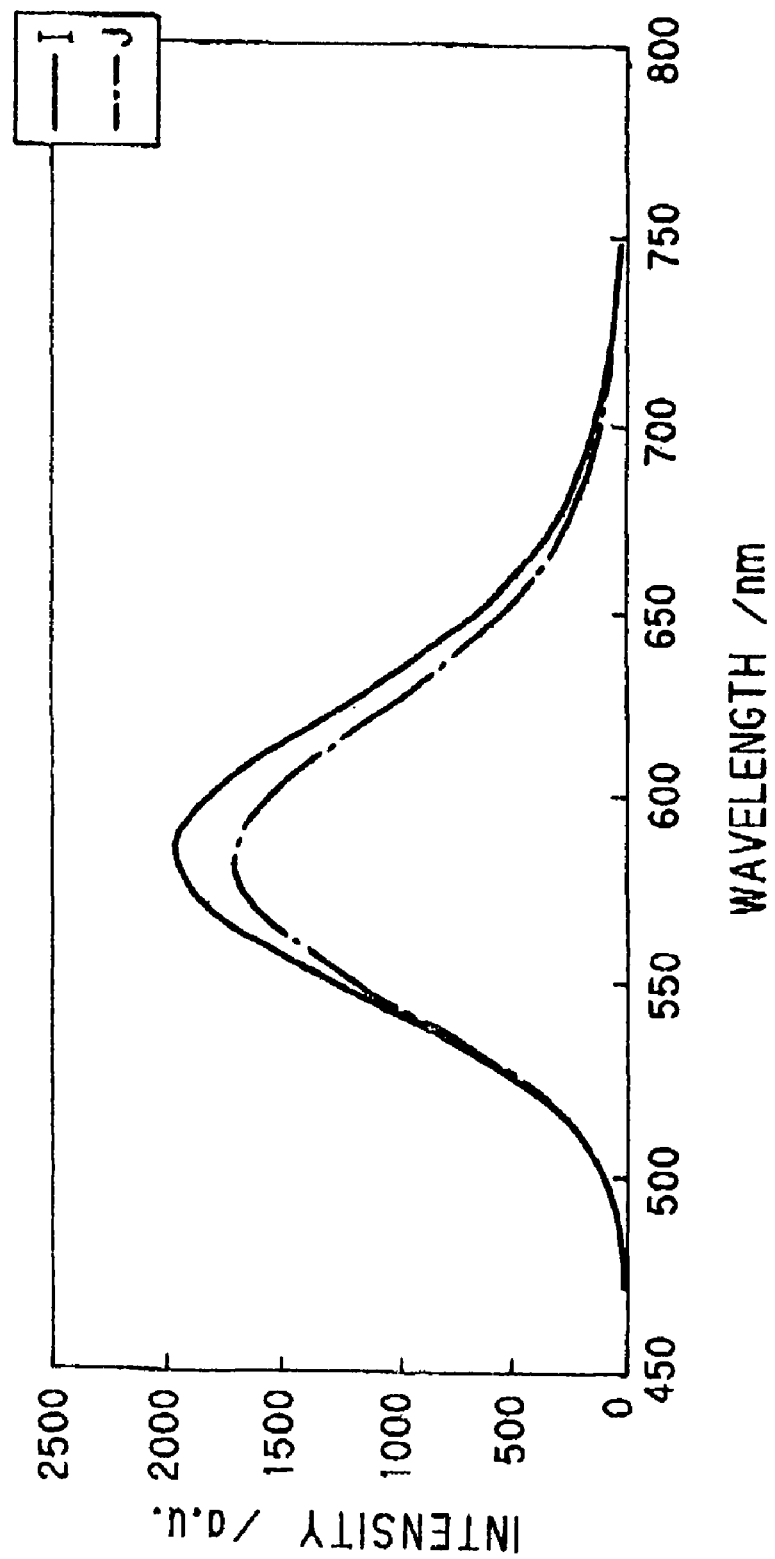

In Samples I and J, $Eu_2O_3$ is made 1.0 mol % of the entire composition and m, n are changed. Sample I has the same m, n values as Sample H and less Eu content than it. Sample J has smaller N/O ratio than Sample I. The excitation spectra are shown in FIG. 49 and the emission spectra are shown in FIG. 50.

Figure 51:
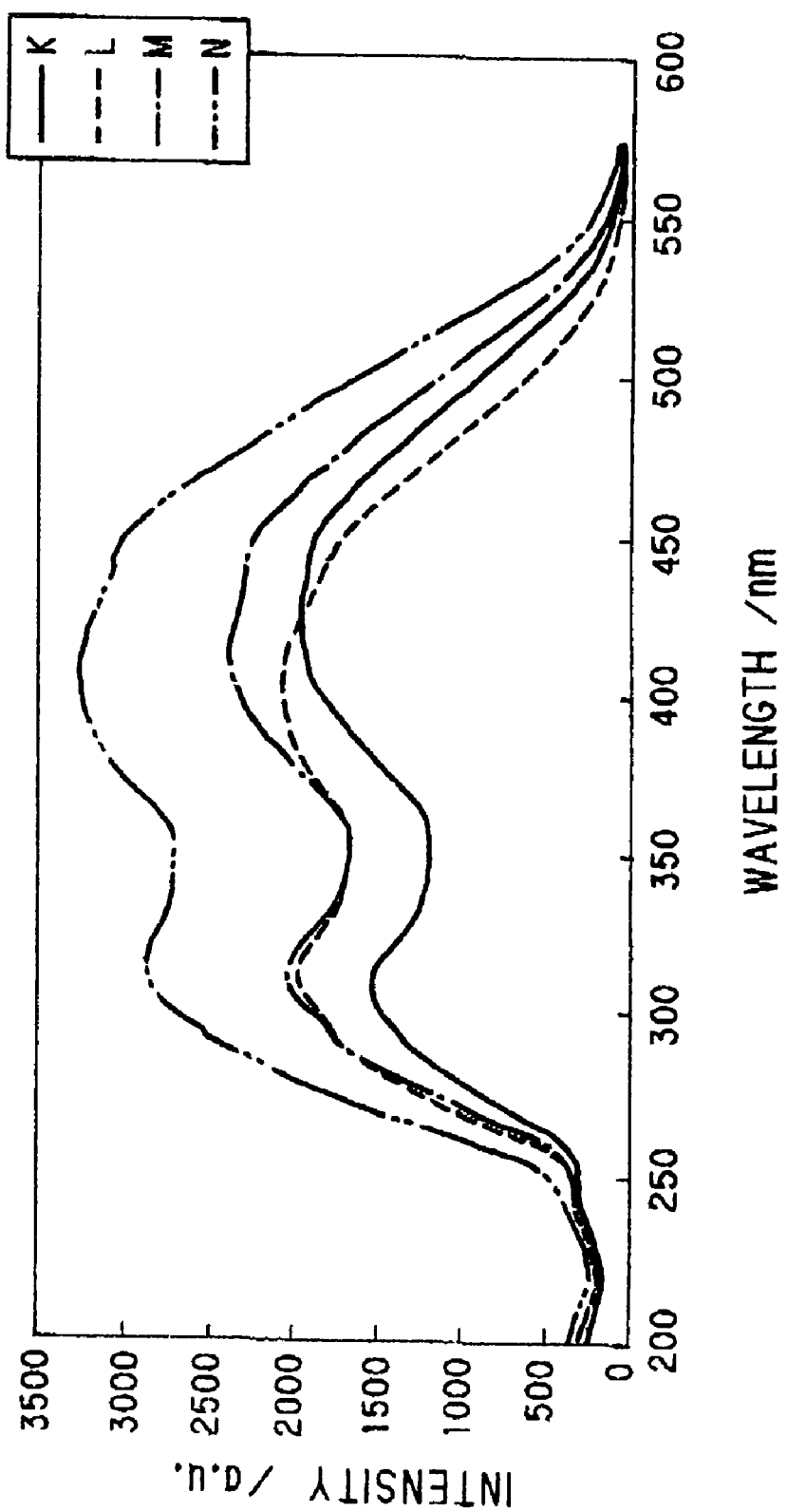
Figure 52:
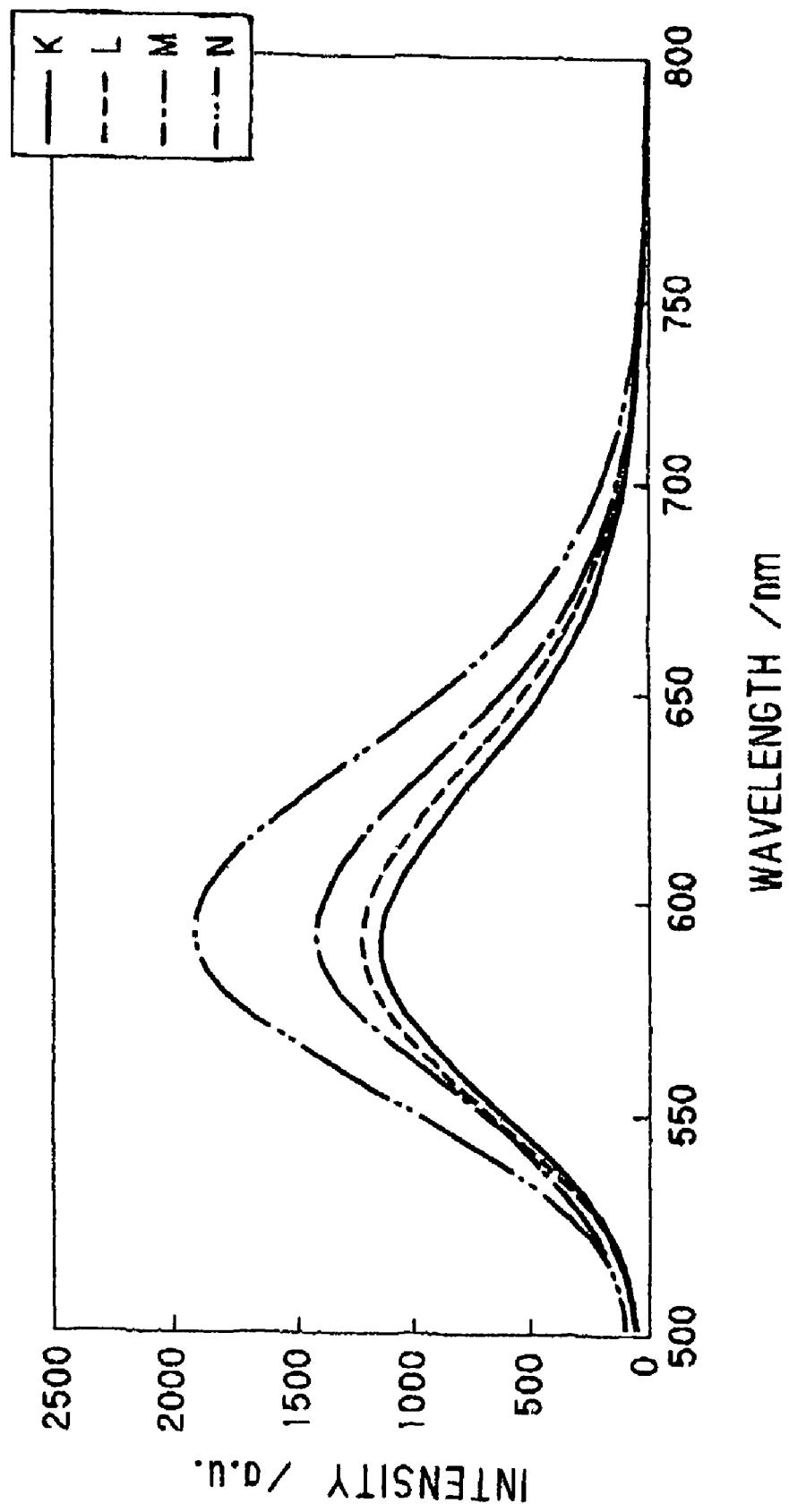

In Samples K, L, M and N, $Eu_2O_3$ is made 1.0 to 1.2 mol % of the entire composition and m, n are changed. Sample K has the same m, n values as Sample A and less Eu content than it. Samples M, N have the same m, n values as Sample B and less Eu content than it. Sample L has m, n values in between those of Samples K and M. The excitation spectra are shown in FIG. 51 and the emission spectra are shown in FIG. 52.

Figure 53:
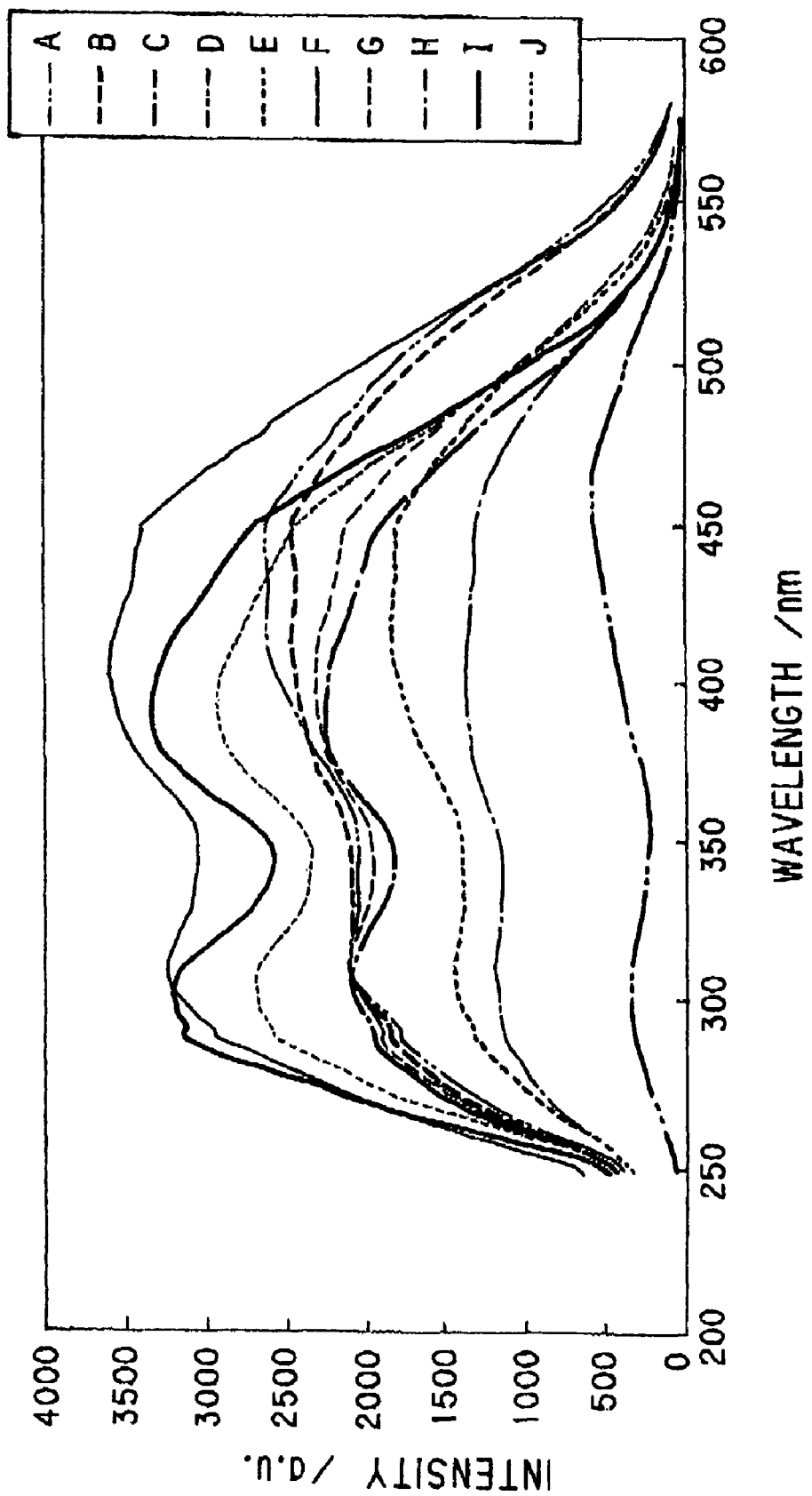
FIG. 53 is a spectrum diagram showing excitation spectra of Samples A to J.
Figure 54:
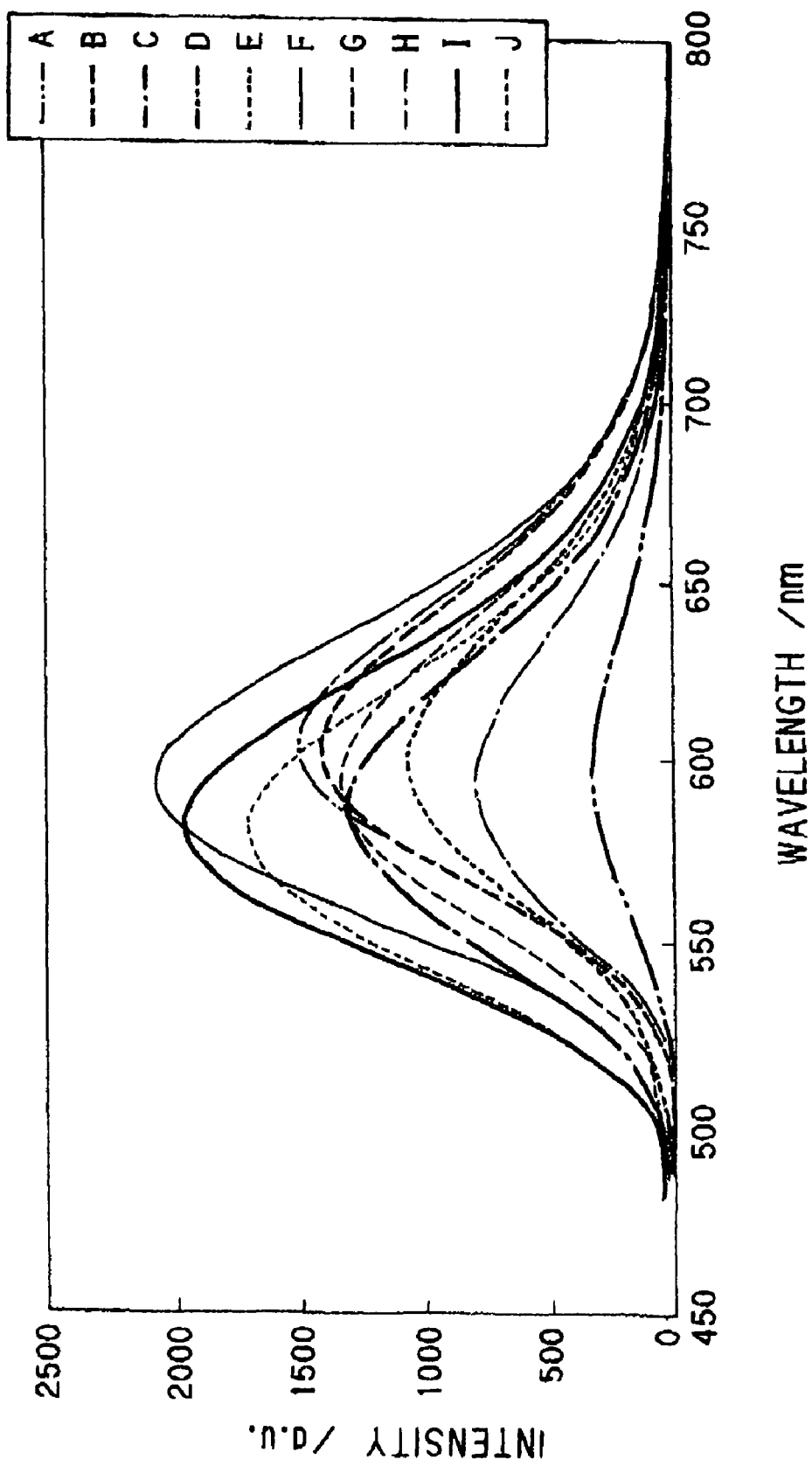
FIG. 54 is a spectrum diagram showing emission spectra of Samples A to J.

FIG. 53 is a spectrum diagram showing excitation spectra of Samples A to J. FIG. 54 is a spectrum diagram showing emission spectra of Samples A to J. FIGS. 53 and 54 are provided to facilitate the comparison in fluorescent property between Samples A to J.

Since Ca-α-sialon is defined by the general formula: $Ca_{0.5m}Si_{12-(m+n)}Al_{(m+n)}O_nN_{6-n}$, to increase m value means that the content of Ca, Al increases and the content of Si decreases. To increase n value means that N/O ratio decreases and the content of Si decreases. Also, since CaO is used as raw material, it is necessary that the relation of m and n satisfies 2m□n. So, if Ca content is fixed, N/O ratio becomes maximum when 2 m=n.

With reference to FIGS. 53 and 54, by comparing the excitation and emission spectra in 14 kinds of Samples A to N, the next knowledge's are obtained.

1. When Eu content to the entire composition is fixed and Ca content is increased, there is a tendency that both excitation and emission spectra shift to longer wavelength side, and the emission intensity increases. However, when the Ca content increases, m increases with it and the Si/Al ratio decreases. This indicates a possibility that configuration environment around Eu is different.

2. When m, n values are fixed and Eu/Ca ratio decreases, there is a tendency that both excitation and emission spectra shift to longer wavelength side, and the emission intensity increases. It is estimated that Eu % in around 15 to 20% is optimum.

3. When m value is fixed, n value increases and N/O ratio decreases, it is found that the excitation and emission spectra shift to shorter wavelength side (AD, BE), or to longer wavelength side (I, J). In all cases, the emission intensity lowers. Thus, according as n value changes, Si/Al ratio changes and therefore its influence is to be considered.

4. With regard to the excitation spectra, it is assumed that there are peaks at around 300, 390 and 450. However, peak at around 300 nm does not change in all samples. On the other hand, there is a tendency that the peak intensity ratio at around 400 and 450 nm depends on Eu content to the entire composition and more the Eu content is, higher the intensity at around 450 nm is.

Example 3

Preparation of Cerium Ion Doped Lanthanum Silicon Nitride Phosphor

LaN, CeN and $Si_3N_4$ are used as raw material powder, weighed to have a molar ratio of LaN:CeN:$Si_3N_4$=0.7:0.3:1.0. These powders are mixed in a mortar inside a glove box of argon atmosphere. Mixture powder obtained is formed into pellet, then sintered in nitrogen atmosphere of 10 atm, 1900° C. for two hours by using a reaction sintering furnace. Thereby, $La_{0.7}Si_3N_5$:0.3Ce is synthesized.

Figure 55A:
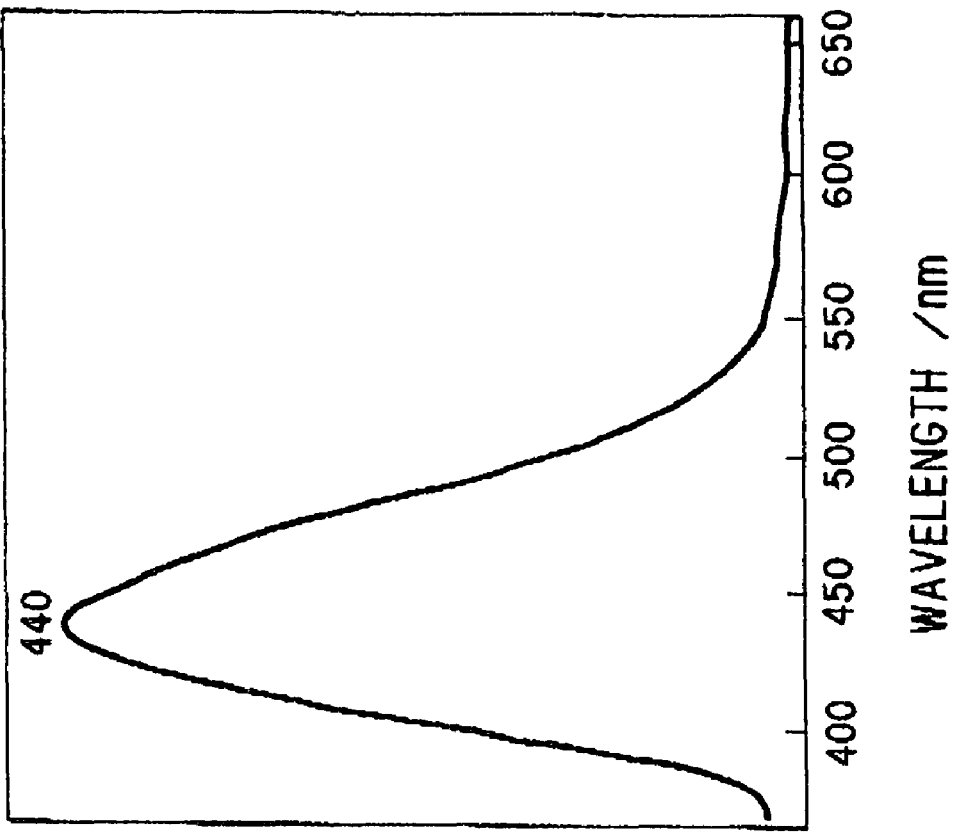
FIG. 55A is a spectrum diagram showing excitation spectrum of $La_{0.7}Si_3N_5$:0.3Ce.
Figure 55B:
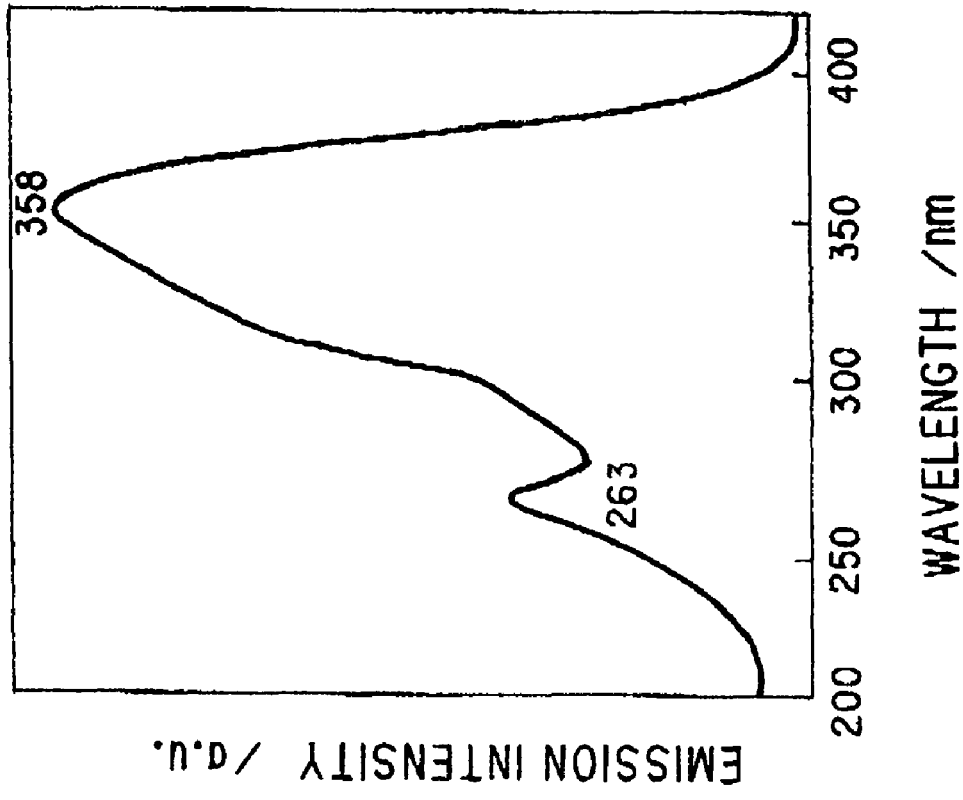
FIG. 55B is a spectrum diagram showing emission spectrum of $La_{0.7}Si_3N_5$:0.3Ce.

FIG. 55A is a spectrum diagram showing excitation spectrum of $La_{0.7}Si_3N_5$:0.3Ce. FIG. 55B is a spectrum diagram showing emission spectrum of $La_{0.7}Si_3N_5$:0.3Ce.

As shown in FIG. 55B, in $La_{0.7}Si_3N_5$:0.3Ce, blue emission is observed at 440 nm, 470 nm under ultraviolet ray radiation of 358 nm. In general, $Ce^{3+}$ ion gives emission based on the f-d transition of (5d) excitation state to (4f) ground state. Therefore, it is assumed that blue emission observed belongs to transition of $^2T_2(5d^1) \rightarrow {}^2F_{5/2}(4f^1)$ in $Ce^{3+}$ ion. Namely, assuming that nine N atoms located at $Ce^{3+}$ ion in $La_{0.7}Si_3N_5$: 0.3Ce form three-dimensional crystal filed to $Ce^{3+}$ ion, 5d orbital energy of $Ce^{3+}$ ion is split into $^2E$ and $^2T_2$. Further, by spin orbit interaction, $^2T_2$ with low energy level is split into $T_7$ and $T_5$. 4f orbital energy is split into $^2F_{5/2}$ and $^2F_{7/2}$ by spin orbit interaction.

As shown in FIG. 55A, in $La_{0.7}Si_3N_5$:0.3Ce, three peaks are observed in the emission spectrum. Peak at 263 nm belongs to exited $LaSi_3N_5$, matrix material. Shoulder peak at 315 nm and peak at 358 nm belong to $^2F_{5/2}\rightarrow{}^2T_2$ and $^2F_{7/2}\rightarrow{}^2T_2$, respectively, in $Ce^{3+}$ ion.

Viewing from these, it is understood that $La_{0.7}Si_3N_5$:0.3Ce is ultraviolet ray excitation phosphor and blue emission phosphor.

Next, LaN, CeN and $Si_3N_4$ are used as raw material powder, weighed to have a molar ratio of:

[1] LaN:CeN:$Si_3N_4$=0.9:0.1:1.0,
[2] LaN:CeN:$Si_3N_4$=0.7:1.3:1.0,
[3] LaN:CeN:$Si_3N_4$=0.5:0.5:1.0, and
[4] LaN:CeN:$Si_3N_4$=0.9:1.0:1.0.

These powders are mixed in a mortar inside a glove box of argon atmosphere. Mixture powder obtained is formed into pellet, then sintered in nitrogen atmosphere of 10 atm, 1900° C. for two hours by using a reaction sintering furnace. Thereby, $La_{1-x}Si_3N_5$:xCe (x=0.1, 0.3, 0.5 and 1.0) is synthesized.

Excitation and emission spectra observed in the respective synthesized samples are, except for the emission spectrum, identical with those of $La_{0.7}Si_3N_5$:0.3Ce described above. The blue emission intensity changes depending on the ratio of $Ce^{3+}$ ion doped in solid solution replacement to $La^{3+}$ site of $LaSi_3N_5$.

Figure 56:
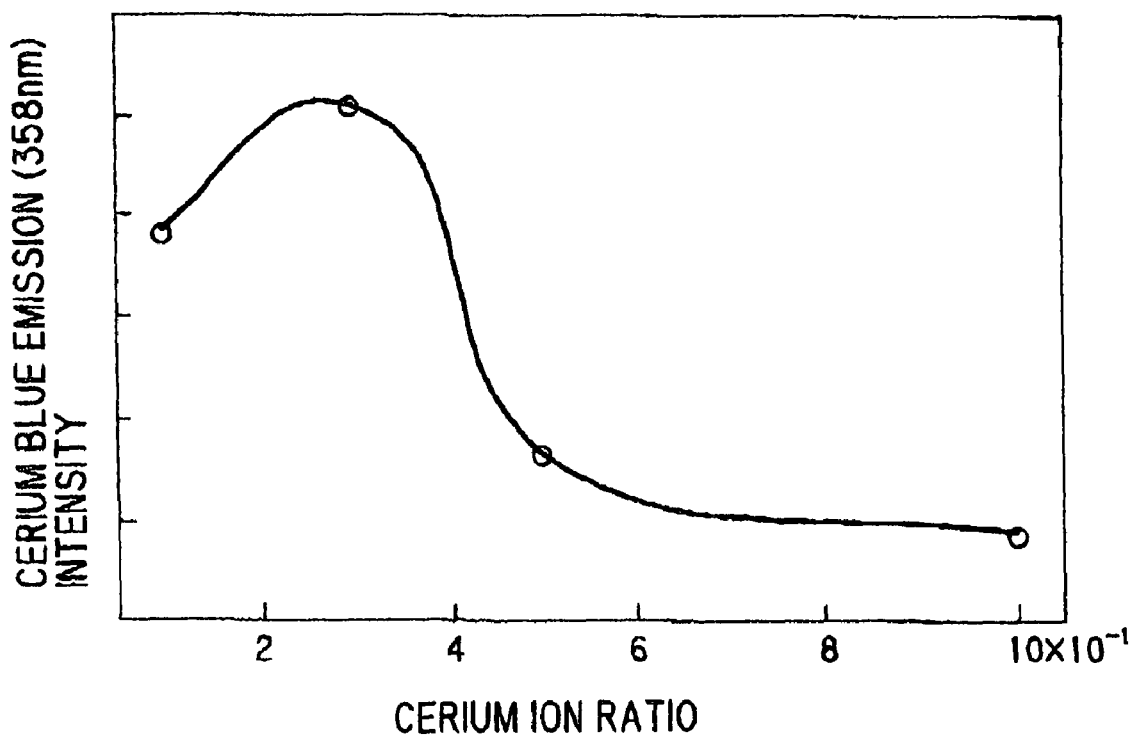
FIG. 56 is a graph showing blue emission intensity, which belongs to transition of $^2T_2(5d^1) \rightarrow {}^2F_{5/2}(4f^1)$ (at 440 nm) in $Ce^{3+}$ ion, depending on the ratio of $Ce^{3+}$ ion doped in solid solution replacement to $La^{3+}$ site of $LaSi_3N_5$.

FIG. 56 is a graph showing blue emission intensity, which belongs to transition of $^2T_2(5d^1)\rightarrow{}^2F_{5/2}(4f^1)$ (at 440 nm) in $Ce^{3+}$ ion, depending on the ratio of $Ce^{3+}$ ion doped in solid solution replacement to $La^{3+}$ site of $LaSi_3N_5$.

As shown in FIG. 56, the blue emission intensity increases until the ratio (x) of $Ce^{3+}$ ion doped reaches 0.3. When exceeding 0.3, the blue emission intensity lowers due to concentration quenching. Viewing from this result, it is understood that, in $La_{1-x}Si_3N_5$:xCe, 0.1<x<0.5 is suitable to offer ultraviolet ray excitation phosphor.

Next, LaN, CeN and $Si_3N_4$ are used as raw material powder, weighed to have a molar ratio of:

[1] LaN:CeN:$Si_3N_4$=0.4:0.6:1.0,
[2] LaN:CeN:$Si_3N_4$=0.5:0.5:1.0,
[3] LaN:CeN:$Si_3N_4$=0.6:0.4:1.0,
[4] LaN:CeN:$Si_3N_4$=0.7:0.3:1.0,
[5] LaN:CeN:$Si_3N_4$=0.8:0.2:1.0, and
[6] LaN:CeN:$Si_3N_4$=0.9:0.1:1.0.

These powders are mixed in a mortar inside a glove box of argon atmosphere. Mixture powder obtained is formed into pellet, then sintered in nitrogen atmosphere of 10 atm, 1900° C. for two hours by using a reaction sintering furnace. Thereby, $La_{1-x}Si_3N_5$:xCe (x=0.6, 0.5, 0.4, 0.3, 0.2 and 0.1) is synthesized.

Figure 57:
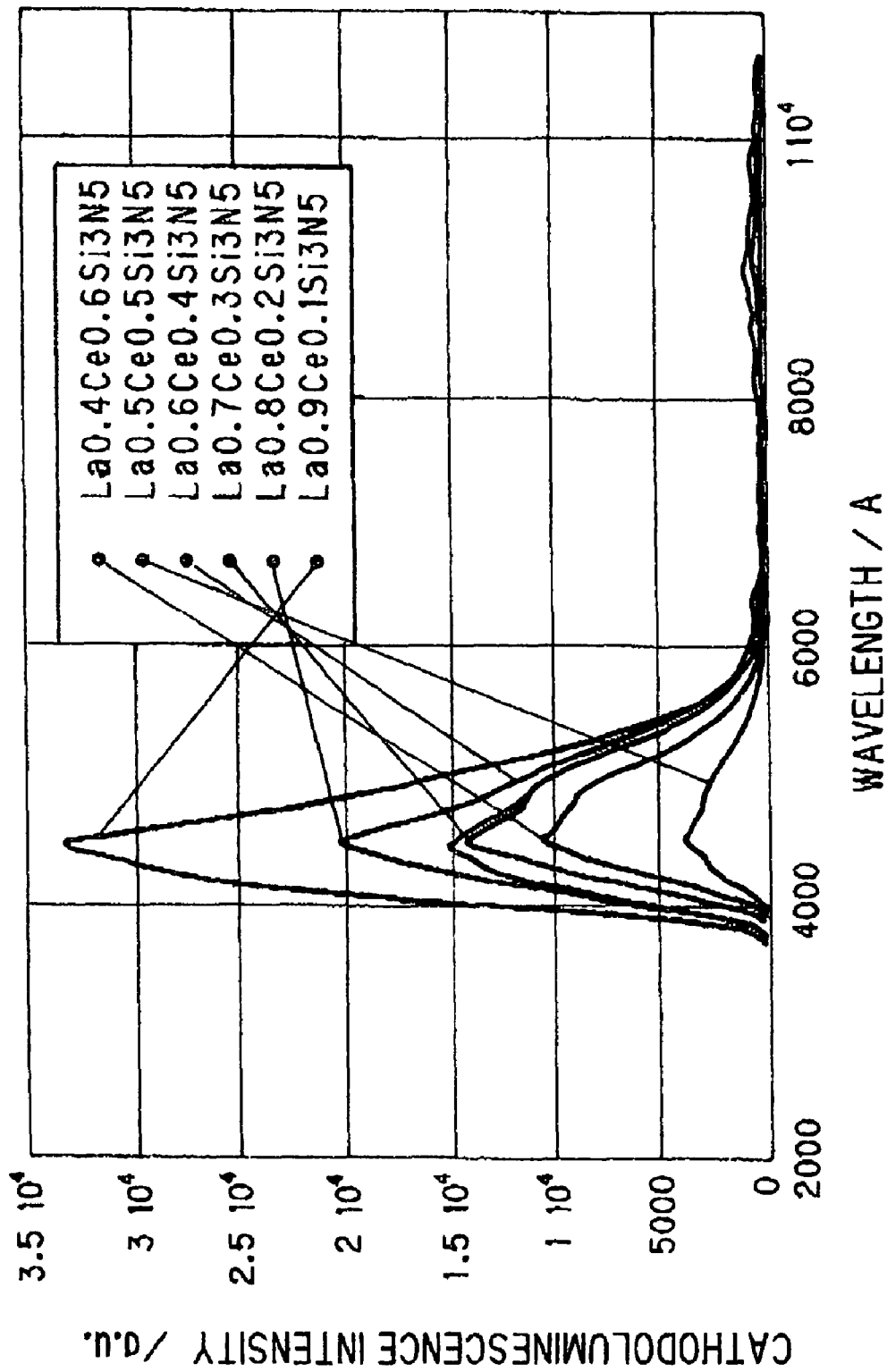
FIG. 57 is a spectrum diagram showing cathode luminescence spectra obtained by excitation with electron beam of 5 keV acceleration voltage in synthesized samples, $La_{1-x}Si_3N_5$:xCe (x=0.6, 0.5, 0.4, 0.3, 0.2 and 0.1).

FIG. 57 is a spectrum diagram showing cathode luminescence spectra obtained by excitation with electron beam of 5 keV acceleration voltage in synthesized samples.

As shown in FIG. 57, even when the ratio (x) of $Ce^{3+}$ ion doped lowers from 0.6 to 0.1, the cathode luminescence intensity increases. Viewing from this result, it is understood that, in $La_{1-x}Si_3N_5$:xCe, 0.0<x<0.2 is suitable to offer electron beam excitation phosphor applicable to VED or FED.

In the cathode luminescence spectra in FIG. 57, which is slightly different from that in FIG. 55B, there is observed an emission that belongs to three transitions of $^2T_2(5d^1)$:$^2T_2$ $(5d^1)\rightarrow{}^2F_{5/2}T_7(4f^1)$, $^2T_2(5d^1)\rightarrow{}^2F_{5/2}(4f^1)$ and $^2T_2(5d^1)\rightarrow{}^2F_{7/2}(4f^1)$. This is assumed because, according as the ratio of $Ce^{3+}$ ion doped changes, configuration environment around $Ce^{3+}$ ion changes, thereby the emission intensity of $Ce^{3+}$ ion, which belongs to transitions of $^2T_2(5d^1)\rightarrow{}^2F_{5/2}T_7$ $(4f^1)$ and $^2T_2(5d^1)\rightarrow{}^2F_{5/2}T_5(4f^1)$ in $Ce^{3+}$ ion, changes.

The details of synthetic method, conditions of $La_{1-x}Si_3N_5$: xCe are not limited to that described above and may be modified variously.

In Brief, the light emitting apparatus in preferred embodiments of the invention is structured as follows (1) to (21).

(1) in claim 3 attached herein, the light emitting element is mounted on a cup portion of lead frame, and a light transmitting material containing the phosphor is filled in the cup portion.

(2) in claim 3 attached herein, the light emitting element is mounted on a cup portion of lead frame, and a phosphor layer composed of a light transmitting material containing the phosphor is formed on the surface of the light emitting element.

(3) in claim 3 attached herein, the light emitting element is mounted on a cup portion of a lead frame, and the light emitting element and part of lead frame are covered with a light transmitting material containing the phosphor.

(4) in claim 3 attached herein, the light emitting element is mounted on a substrate, and a phosphor layer composed of a light transmitting material containing the phosphor is formed on the surface of the light emitting element.

(5) in claim 3 attached herein, the light emitting element is mounted on a substrate, and the light emitting element is sealed with a of a light transmitting material containing the phosphor.

(6) in claim 3 attached herein, the light emitting element is mounted on a cup portion provided on a substrate, and a light transmitting material containing the phosphor is filled in the cup portion.

(7) in claim 3 attached herein, the light emitting element is mounted on a cup portion provided on a substrate, and a phosphor layer composed of a light transmitting material containing the phosphor is formed on the surface of the light emitting element.

(8) in claim 3 attached herein, a phosphor layer composed of a light transmitting material containing the phosphor is formed on the surface of the substrate of the light emitting element.

(9) in the light emitting apparatus (8), a phosphor layer composed of a light transmitting material containing the phosphor is also formed on the side of the light emitting element.

(10) in claim 4 attached herein, a phosphor layer composed of the phosphor is formed on the surface of the substrate of the light emitting element.

(11) in the light emitting apparatus (10), a phosphor layer composed of the phosphor is also formed on the side of the light emitting element.

(12) in claim 3 attached herein, a reflection plate is provided in the emission direction of the light emitting element.

(13) in the light emitting apparatus (12), a phosphor layer composed of a light transmitting material containing the phosphor is formed on the surface of the reflection plate to face the light emitting element.

(14) in claim 4 attached herein, a reflection plate is provided in the emission direction of the light emitting element.

(15) in the light emitting apparatus (14), the reflection plate is of the phosphor, and the reflection plate includes a mirrored surface opposite to its surface facing the light emitting element.

(16) in claim 3 attached herein, a phosphor layer composed of a light transmitting material containing the phosphor is provided in the emission direction of the light emitting element.

(17) in claim 4 attached herein, a phosphor layer composed of the phosphor is provided in the emission direction of the light emitting element.

(18) in the light emitting apparatus (16) or (17), a light guiding member composed of light introducing surface and light emitting surface is further provided, the light emitting element is disposed facing the light introducing surface of the light guiding member, and the phosphor layer is disposed between the light emitting element and the light introducing surface of the light guiding member.

(19) in the light emitting apparatus (16) or (17), a light guiding member composed of light introducing surface and light emitting surface is further provided, the light emitting element is disposed facing the light introducing surface of the light guiding member, and the phosphor layer is disposed on the light emitting surface side of the light guiding member.

(20) in the light emitting apparatus (19), a layer of light transmitting material is further provided between the light guiding member and the phosphor layer.

(21) in any one of the light emitting apparatuses (1) to (20), the light emitting element is III group nitride system compound semiconductor light emitting element.

ADVANTAGES OF THE INVENTION

As described above, in the invention, LED 1 is structured such that the light emitting element 10 is mounted through adhesive 20 on the cup portion 33 provided on the lead frame 30, the wires 40, 41 connected to the lead frames 30, 31 are bonded to the p-electrode and n-electrode of the light emitting element 10, epoxy resin 35 with phosphor 36 dispersed therein is filled in the cup portion 33, and the light emitting element 10, part of lead frames 30, 31 and wires 40, 41 are sealed with sealing resin 50 of epoxy resin. In LED 1, the emission wavelength of the light emitting element 10 is in the range of 360 to 550 nm, phosphor 36 is of rare-earth element doped oxide nitride phosphor or cerium ion doped lanthanum silicon nitride phosphor, and part of light from the light emitting element 10 is wavelength-converted. Thereby, red color (color rendering property of red) can be enhanced as compared to that of conventional white LED. Also, with same system phosphor, green to red can be expressed and therefore it is very advantageous to color mixture.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting apparatus, comprising:
   a light emitting element with an emission wavelength in a range of 360 to 550; and
   a rare-earth element doped oxide nitride phosphor;
   wherein a part of light radiated from the light emitting element is wavelength-converted by the phosphor,
   wherein the phosphor comprises an α-sialon, a β-sialon, and unreacted silicon nitride, and
   wherein said phosphor comprises the α-sialon of 40 weight % or more and 90 weight % or less, the β-sialon of 5 weight % or more and 40 weight % or less, and the unreacted silicon nitride of 5 weight % or more and 30 weight % or less, and the α-sialon comprises a Ca-α-sialon represented by: $(Ca_x, M_y)(Si,Al)_{12}(O,N)_{16}$, where Ca sites of 15 to 20% are replaced by Eu, $0.05 < (x+y) < 0.3$, $0.02 < x < 0.27$, and $0.03 < y < 0.3$.

2. The light emitting apparatus according to claim 1, wherein the emission wavelength is in the range of 450 to 550 nm, and the light emitting apparatus radiates white light generated by a mixture of the wavelength-converted light and the other part of light radiated from the light emitting element.

3. The light emitting apparatus according to claim 1, wherein the oxide nitride phosphor is of oxide nitride that contains α-sialon as a matrix material.

4. The light emitting apparatus according to claim 1, wherein the phosphor is in a form of powder or particles and is contained in a light transmitting material.

5. The light emitting apparatus according to claim 1, wherein the light emitting element comprises a III group nitride system compound semiconductor emitting element.

6. A light emitting method for a light emitting apparatus that comprises a light emitting element with an emission wavelength in the range of 360 to 550 nm and a rare-earth element doped oxide nitride phosphor, wherein part of light radiated from the light emitting element is wavelength-converted by the phosphor, and the light emitting apparatus radiates light generated by a mixture of wavelength-converted light and the other part of light radiated from the light emitting element, comprising:
   turning on intermittently the light emitting element,
   wherein the phosphor comprises α-sialon, β-sialon, and unreacted silicon nitride, and
   wherein said phosphor comprises the α-sialon of 40 weight % or more and 90 weight % or less, the β-sialon of 5 weight % or more and 40 weight % or less, and the unreacted silicon nitride of 5 weight % or more and 30 weight % or less, and the α-sialon comprises a Ca-α-sialon represented by: $(Ca_x, M_y)(Si,Al)_{12}(O,N)_{16}$, where Ca sites of 15 to 20% are replaced by Eu, $0.05 < (x+y) < 0.3$, $0.02 < x < 0.27$, and $0.03 < y < 0.3$.

7. The light emitting method according to claim 6, wherein a color of the light radiated from the light emitting apparatus is adjusted by controlling a turn-on time of the light emitting element.

8. The light emitting method according to claim 6, wherein the emission wavelength is in the range of 450 to 550 nm, and the light emitting apparatus radiates white light.

9. The light emitting method according to claim 6, wherein the light emitting element comprises a III group nitride system compound semiconductor emitting element.

* * * * *